(12) United States Patent
Xu et al.

(10) Patent No.: US 12,022,684 B2
(45) Date of Patent: Jun. 25, 2024

(54) POLARIZER AND DISPLAY INCLUDING SAME

(71) Applicant: 3M INNOVATIVE PROPERTIES COMPANY, St. Paul, MN (US)

(72) Inventors: Fuguo Xu, Shanghai (CN); Timothy J. Nevitt, Red Wing, MN (US); Adam D. Haag, Woodbury, MN (US); Brianna N. Nieson, Bloomington, MN (US); Matthew B. Johnson, Woodbury, MN (US); Martin E. Denker, Vadnais Heights, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 610 days.

(21) Appl. No.: 17/275,330

(22) PCT Filed: Sep. 14, 2018

(86) PCT No.: PCT/CN2018/105712
§ 371 (c)(1),
(2) Date: Mar. 11, 2021

(87) PCT Pub. No.: WO2020/051874
PCT Pub. Date: Mar. 19, 2020

(65) Prior Publication Data
US 2022/0052301 A1    Feb. 17, 2022

(51) Int. Cl.
*H10K 50/86* (2023.01)
*G02B 5/30* (2006.01)
*H10K 59/35* (2023.01)

(52) U.S. Cl.
CPC .......... *H10K 50/86* (2023.02); *G02B 5/3041* (2013.01); *H10K 59/351* (2023.02)

(58) Field of Classification Search
CPC ..... H10K 50/86; H10K 59/351; G02B 5/3041
See application file for complete search history.

(56) References Cited

U.S. PATENT DOCUMENTS

| | | |
|---|---|---|
| 5,221,982 A | 6/1993 | Faris |
| 5,882,774 A | 3/1999 | Jonza |

(Continued)

FOREIGN PATENT DOCUMENTS

| | | |
|---|---|---|
| CN | 1343903 | 4/2002 |
| CN | 1900750 | 1/2007 |

(Continued)

OTHER PUBLICATIONS

Denker, "Advanced Polarizer Film for Improved Performance of Liquid Crystal Displays," Invited Paper 45.1 presented at Society for Information Displays (SID) International Conference in San Francisco, Calif., Jun. 4-9, 2006, pp. 1528-1530.

(Continued)

*Primary Examiner* — Evan P Dzierzynski
*Assistant Examiner* — Nathaniel J Lee
(74) *Attorney, Agent, or Firm* — Clifton F. Richardson

(57) ABSTRACT

A display (1000) including a display panel (130) and a polarizer (110) disposed to receive a light (150) output of the display panel (130) is described. The polarizer (150) may be a reflective polarizer (110) or a circular polarizer (100) incorporating a reflective polarizer (110). The display panel (130) includes a plurality of pixels and each pixel includes a plurality of subpixels. The reflective polarizer (110) has a first reflection band, wherein at normal incidence, the first reflection band has a long wavelength band edge wavelength between peak emission wavelengths of two subpixels in the plurality of subpixels. The reflective polarizer (110) may be disposed between an absorbing polarizer (106) and a retarder (108) in a circular polarizer (100). The reflective (Continued)

polarizer (110) may have substantially non-overlapping first, second, and third reflection bands.

14 Claims, 62 Drawing Sheets

(56) References Cited

U.S. PATENT DOCUMENTS

| | | | |
|---|---|---|---|
| 6,157,490 | A | 12/2000 | Wheatley |
| 6,179,948 | B1 | 1/2001 | Merrill |
| 6,587,399 | B2 | 7/2003 | Basturk |
| 6,783,349 | B2 | 8/2004 | Neavin |
| 6,841,803 | B2 * | 1/2005 | Aizawa ............... H10K 50/86 257/89 |
| 6,936,960 | B2 | 8/2005 | Cok |
| 7,397,485 | B2 | 7/2008 | Miller |
| 8,710,733 | B2 | 4/2014 | Lee |
| 8,969,857 | B2 | 3/2015 | Kim |
| 9,123,668 | B2 | 9/2015 | Park |
| 9,279,921 | B2 | 3/2016 | Kivel |
| 9,543,368 | B2 | 1/2017 | Cheng |
| 9,651,794 | B2 | 5/2017 | Zhang |
| 9,696,558 | B2 | 7/2017 | Richards |
| 9,773,847 | B2 | 9/2017 | Epstein |
| 10,302,991 | B2 | 5/2019 | Pan |
| 2002/0048221 | A1 | 4/2002 | Basturk |
| 2007/0019292 | A1 | 1/2007 | Kim |
| 2007/0097509 | A1 | 5/2007 | Nevitt |
| 2010/0254002 | A1 | 10/2010 | Merrill |
| 2011/0272849 | A1 | 11/2011 | Neavin |
| 2013/0342904 | A1 | 12/2013 | Richards |
| 2014/0049733 | A1 | 2/2014 | Suzuki |
| 2014/0097412 | A1 * | 4/2014 | Kuo ..................... G02B 5/30 257/40 |
| 2015/0338675 | A1 | 11/2015 | Zhang |
| 2016/0118448 | A1 * | 4/2016 | Epstein ............. H10K 50/865 257/40 |
| 2018/0217441 | A1 | 8/2018 | Pan |

FOREIGN PATENT DOCUMENTS

| | | |
|---|---|---|
| CN | 202771132 | 3/2013 |
| CN | 103430555 | 12/2013 |
| CN | 103472515 | 12/2013 |
| CN | 106443858 | 2/2017 |
| WO | WO 2014-197539 | 12/2014 |
| WO | WO 2015-035030 | 3/2015 |

OTHER PUBLICATIONS

International Search Report for PCT International Application No. PCT/CN2018/105712, mailed on Jun. 20, 2019, 4 pages.

* cited by examiner

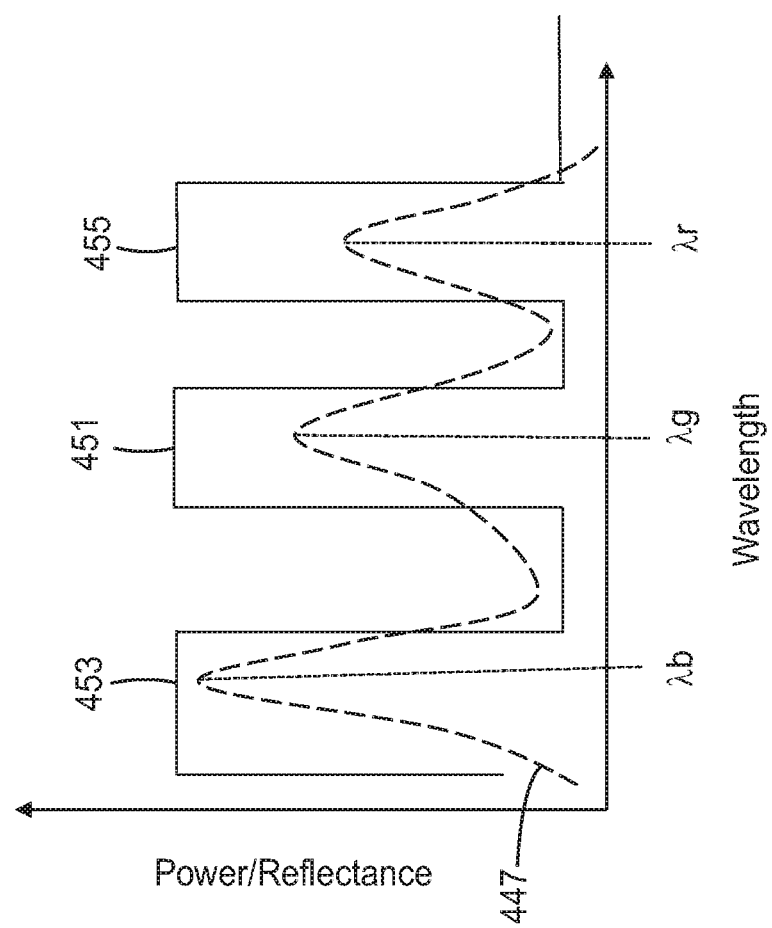

POLARIZER AND DISPLAY INCLUDING SAME

BACKGROUND

Organic light emitting diode displays typically include a circular polarizer to reduce reflection of ambient light from the display panel.

SUMMARY

In some aspects of the present description, a display including a display panel and a reflective polarizer disposed to receive a light output of the display panel is provided. The display panel includes a plurality of pixels where each pixel comprising a plurality of subpixels. The reflective polarizer has a first reflection band. At normal incidence, the first reflection band has a long wavelength band edge wavelength between peak emission wavelengths of two subpixels in the plurality of subpixels.

In some aspects of the present description, a circular polarizer including a retarder, an absorbing polarizer, and a reflective polarizer disposed between the retarder and the absorbing polarizer is provided. The reflective polarizer has a pass axis substantially aligned with a pass axis of the absorbing polarizer. The reflective polarizer includes a plurality of alternating polymeric interference layers and has substantially non-overlapping first, second, and third reflection bands. At normal incidence: the first reflection band has a short wavelength band edge wavelength and a long wavelength band edge wavelength, the second reflection band has a long wavelength band edge wavelength in a range of 440 nm to 500 nm, and the third reflection band has a short wavelength band edge wavelength in a range of 580 nm to 640 nm. The short wavelength band edge wavelength of the first reflection band is at least 10 nm greater than the long wavelength band edge wavelength of the second reflection band. The short wavelength band edge wavelength of the third reflection band is at least 10 nm greater than the long wavelength band edge wavelength of the first reflection band.

In some aspects of the present description, a reflective polarizer including a plurality of alternating polymeric interference layers is provided. Thee plurality of alternating polymeric interference layers have substantially non-overlapping first, second, and third reflection bands. Each of the first, second, and third reflection bands is a first order harmonic reflection band. The plurality of alternating polymeric interference layers includes outermost first and second interference layers and each layer in the reflective polarizer disposed between the outermost first and second interference layers have a thickness less than 1 micrometer. At normal incidence: the first reflection band has a short wavelength band edge wavelength and a long wavelength band edge wavelength, the second reflection band has a long wavelength band edge wavelength in a range of 440 nm to 500 nm, and the third reflection band has a short wavelength band edge wavelength in a range of 580 nm to 640 nm. The short wavelength band edge wavelength of the first reflection band is at least 10 nm greater than the long wavelength band edge wavelength of the second reflection band. The short wavelength band edge wavelength of the third reflection band being at least 10 nm greater than the long wavelength band edge wavelength of the first reflection band.

In some aspects of the present description, a display including a display panel and a reflective polarizer disposed to receive a light output of the display panel is provided. The display panel includes a plurality of pixels where each pixel includes a plurality of subpixels. The reflective polarizer has a first reflection band. At normal incidence, the first reflection band reflects at least 60% of a first light having a block polarization state and a wavelength distribution of an emission spectrum of a first subpixel in the plurality of subpixels. At an angle of incidence of 45 degrees, the first reflection band transmits at least 60% of the first light.

In some aspects of the present description, a circular polarizer including a retarder, and absorbing polarizer, and a reflective polarizer disposed between the retarder and the absorbing polarizer is provided. The absorbing polarizer has an absorption band extending throughout a visible range of 400 nm to 700 nm. The reflective polarizer has a pass axis substantially aligned with a pass axis of the absorbing polarizer. The reflective polarizer includes a plurality of alternating polymeric interference layers and has a reflection band and at least one transmission band in a block polarization state. At normal incidence, the at least one transmission band has a total width in the visible range of at least 150 nm.

In some aspects of the present description, a reflective polarizer having a least one reflection band having a bandwidth less than 150 nm is provided. In some embodiments, a circular polarizer includes the reflective polarizer disposed between an absorbing polarizer and a retarder. In some embodiments, a display includes a display panel and the circular polarizer disposed to receive a light output of the display panel.

BRIEF DESCRIPTION OF THE DRAWINGS

FIG. 4A is a schematic illustration of substantially non-overlapping first, second, and third reflection bands of a reflective polarizer and emission spectra of first, second, and third subpixels at normal incidence;

DETAILED DESCRIPTION

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

According to some embodiments of the present description, a reflective polarizer having a reflection band with a band edge in the visible spectrum is provided. It has been found that such reflective polarizers are useful for improving performance of a display when the reflective polarizer is disposed to receive a light output of the display panel. For example, the reflective polarizer can be used in a circular polarizer disposed on an organic light emitting diode (OLED) display to improve the brightness of the display and/or the color gamut of the display without causing ghosting or other image degradations. Utilizing a broadband reflective polarizer in the circular polarizer of an OLED display for increasing the brightness of the display is described in U.S. Pat. No. 9,773,847 (Epstein et al.). According to some embodiments of the present description, it has been found that utilizing a notch reflective polarizer or a reflective polarizer having a least one band edge in the visible spectrum can increase the brightness and/or the color gamut of the display while producing substantially less or substantially no ghosting compared to using a broadband reflective polarizer and/or producing a reduced reflection of ambient light compared to using a broadband reflective polarizer. For example, in some embodiments, including the reflective polarizer in the circular polarizer increases the on-axis brightness by at least 15% and increases the color gamut by at least 2% of NTSC (a color gamut standard established by the National Television System Committee) compared to not including a reflective polarizer, and reduces ambient reflection by at least 20% (e.g., a reduction from 2.9% to 1.8% which is about a 38% reduction) compared to including a broadband reflective polarizer in the circular polarizer.

The reflective polarizer is typically disposed to receive a light output (e.g., light spatially modulated to provide an image) of the display panel. For example, the display is typically configured to provide an image to a viewer and the reflective polarizer is typically disposed between the display panel and the viewer. The display panel can be an OLED display panel, for example. Other display panels where a reflective polarizer can be advantageously placed between the display panel and the viewer may also be utilized.

Figure 1:
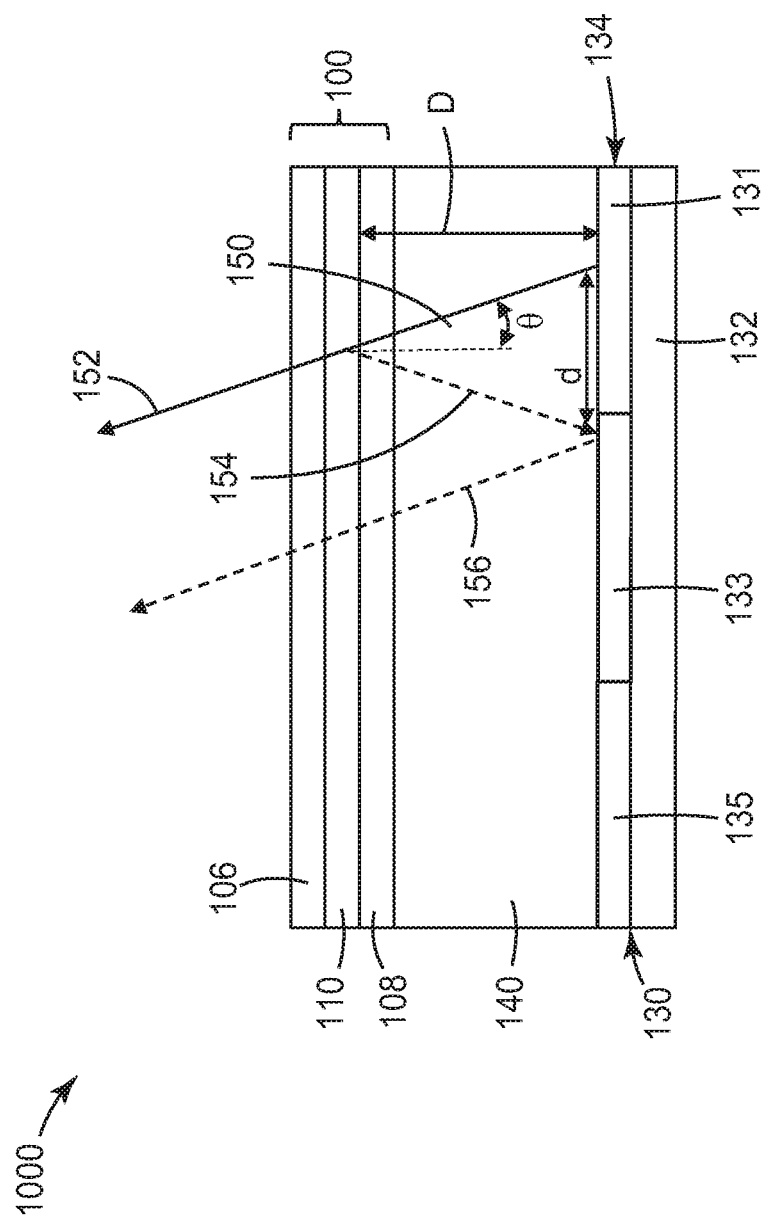
FIG. 1 is a schematic cross-sectional view of a display including a display panel and a reflective polarizer.

FIG. 1 is a schematic cross-sectional view of a display 1000 including a display panel 130 and a reflective polarizer 110. As described further elsewhere herein, the display panel 130 includes a plurality of pixels where each pixel includes a plurality of subpixels. In the illustrated embodiment, the display panel includes an emissive region 131 which may be a pixel or a subpixel, and includes regions 133 and 135 which may be emissive regions or regions between emissive regions such as a black matrix between adjacent pixels or subpixels. In the illustrated embodiments, a layer 134 including the regions 131, 133 and 135 is disposed on a layer 132. The layer 132 may be an organic light emitting diode (OLED) backplane layer, for example. In some embodiment, the layer 132 schematically represents the OLED layers producing a white light output and the layer 134 is a color filter layer defining subpixels having differing colors. In other embodiments, the layer 134 schematically represents the emissive layer of an OLED defining red, green, and blue subpixels, for example. For example, in some embodiments, region 132 includes a green emissive material, region 133 includes a blue emissive material, and region 135 includes a green emissive material. A circular polarizer 100 includes the reflective polarizer 110 disposed between an absorbing polarizer 106 and a retarder 108. A layer 140 separates the circular polarizer from the layer 134. The layer 140 may be a glass layer and/or or an encapsulating layer, for example, depending on the design of the display panel 130. In some embodiments, the layer 140 is a layer of the display panel 130.

Light 150 is emitted by emissive region 131 and is incident on the circular polarizer 100. A portion of the light 150 is incident on the reflective polarizer 110, after passing through retarder 108, in a pass state which, in some embodiments, is also a pass state for the absorbing polarizer 106. This portion then exits the display 1000, typically after passing through a cover glass (not illustrated) and refracting at an interface with the cover glass and air, as light 152. Another portion of the light 150 is incident on the reflective polarizer 110, after passing through the retarder 108, in a block state of the reflective polarizer 110. If this portion has a wavelength in a reflection band of the reflective polarizer 110, it will reflect from the circular polarizer 100 as light 154. Retarder 108 is typically a quarter-wave retarder at one or more wavelengths (e.g., at two wavelengths when some types of achromatic retarders are used) in the visible (400 nm-700 nm) spectrum, though other retardances (e.g., 5/4 of a wavelength) may be used. In some embodiments, retarder 108 incudes a plurality of retarder layers. For example, in some embodiments a half-wave retarder layer may be combined with a quarter-wave retarder layer to provide the retarder 108. Light 154 may be substantially circularly polarized. Light 154 reflects from region 133 as light 156 having a circular polarization state substantially orthogonal to that of light 154. Light 156 is then incident on the reflective polarizer in a pass state and exits the optical system 1000.

Light 156 causes ghosting as it is a displaced duplicate of the light from emissive region 131. Light 156 is displaced by a distance d from the light 152. This distance d may be referred to as a walk-off distance. In some display designs, the region 133 is between emissive regions and light 156 can be reduced by using a black matrix material in the region 133 to reduce reflectivity of the region. However, in some embodiments, the region 133 is an emissive region. For example, in some OLED designs subpixels in a pixel are closely or immediately adjacent one another and region 131 and 133 may be adjacent subpixels within a pixel. In this case, it would not be desired to dispose a black matrix material in region 133. In embodiments where different emissive OLED materials are used to define different subpixels, each emissive region typically has a substantial reflectance of light from each other emissive region. In embodiments, where a color filter is used to define the subpixels, light from different primary colored subpixels typically has a low reflectance from different primary colored subpixels but can have a substantial reflectance from a white subpixel when included.

According to some aspects of the present description, it has been found that light 156 can be reduced or substantially eliminated by choosing the reflection band of the reflective polarizer to reflect block state light at normal incidence but to shift with incidence angle so that little off-normal light that would otherwise cause ghosting is reflected from the reflective polarizer 110. For example, light 150 is incident on reflective polarizer 110 at an angle of incidence θ (angle with normal). If the reflection band(s) of the reflective polarizer 110 do not include the wavelengths of light 150 at an angle of incidence of θ, light 150 will not be substantially reflected by reflective polarizer 110.

In some embodiments, the reflective polarizer 110 has a reflection band with a long wavelength band edge wavelength at normal incidence greater than a peak emission wavelength for the green subpixels, but at off-normal incidence the long wavelength band edge shifts so that it is less than the peak emission wavelength for the green subpixels. For example, if emissive region 131 is a green subpixel having a peak emission wavelength $\lambda g$ and if the reflective polarizer has a long wavelength band edge of $\lambda^\theta > \lambda g$ at normal incidence and a long wavelength band edge of $\lambda^\theta < \lambda g$ at the angle of incidence θ, the reflection of light 154 from the reflective polarizer 110 will be reduced or substantially eliminated if the reflective polarizer 110 is substantially transmissive for the wavelengths emitted by the emissive region 131 at the angle of incidence θ.

In some embodiments, the distance D between the reflective polarizer 110 and the plurality of pixels in layer 134 is selected such that the angle of incidence θ where the long wavelength band edge has sufficiently shifted to reduce the reflection of light 154 corresponds to a walk-off distance between the emissive region 131 and an adjacent emissive region capable of substantially reflecting light emitted by the emissive region 131. The distance D can be understood to be the shortest distance between an interference layer of the reflective polarizer 110 and a subpixel defining layer of the display panel 130. The subpixel defining layer may be an emissive layer in the case of an OLED display panel utilizing red, green and blue emissive materials to define subpixels or the subpixel defining layer may be a color filter layer in the case of an OLED display panel utilizing a color filter to define subpixels, for example. The relation between d, D and θ can be established by standard trigonometry (e.g., $\tan(\theta) = d/(2D)$). In some embodiments, the distance D is chosen so that at the internal angle of incidence θ where $\lambda^\theta < \lambda g$, the walk-off distance d corresponds to a smallest distance between a first subpixel and a second subpixel capable of substantially reflecting light from the first subpixel.

Figure 27:
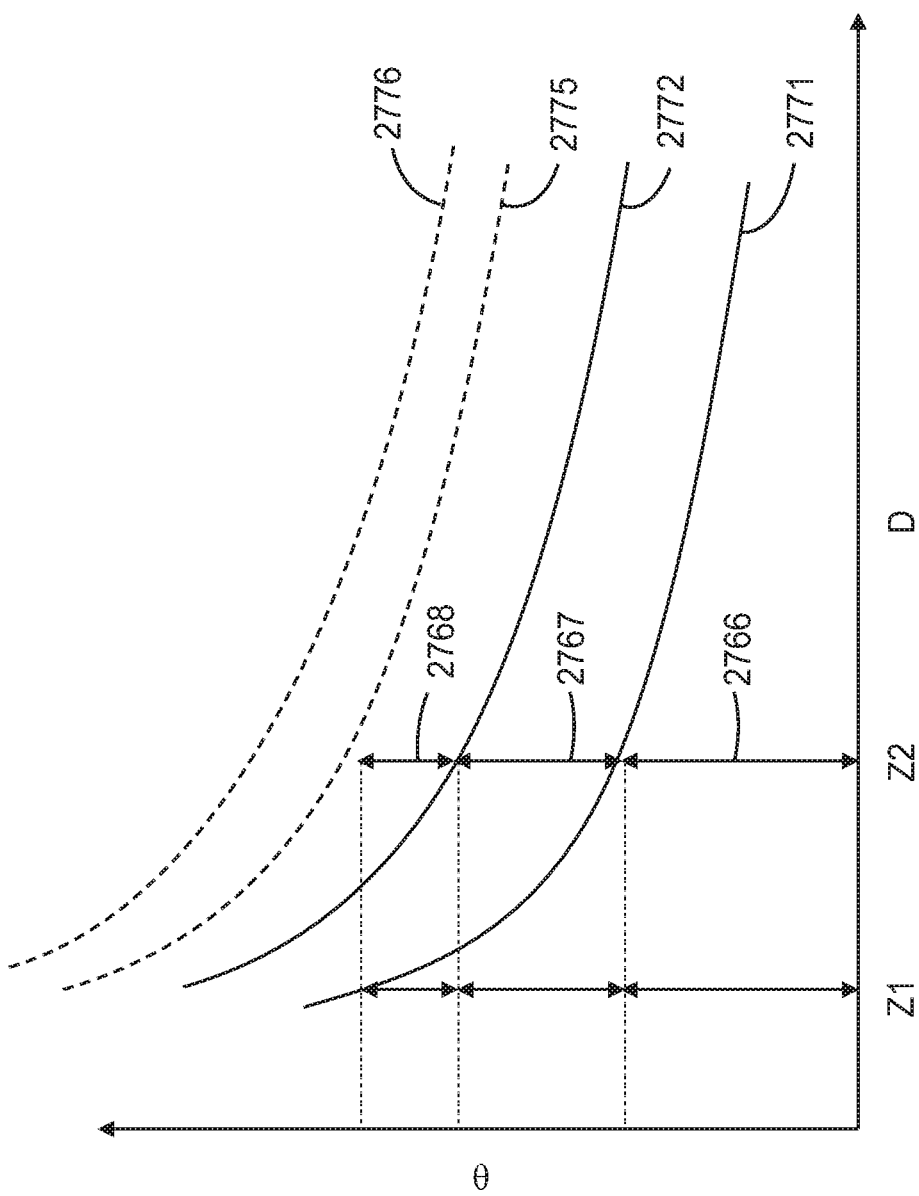
FIG. 27 is a schematic illustration of walk-off distance contours in an angle of incidence versus separation distance plot.

FIG. 27 is a schematic θ-D plot showing walk-off distance contours 2771, 2772, 2775, and 2776. In the region between contours 2771 and 2772, light from a green subpixel reflected from the reflective polarizer can reflect from a nearest neighboring subpixel having a high reflectivity for green light. This nearest neighbor subpixel may be a white subpixel when a color filter is used to define the subpixels or may be the closest subpixel of any color when emissive materials emitting in different wavelength ranges are used to define the subpixel. In the region between contours 2775 and 2776, light from a green subpixel reflected from the reflective polarizer can reflect from a next nearest neighboring subpixel having a high reflectivity for green light. This next nearest neighbor subpixel may be a green subpixel in an adjacent pixel when a color filter is used to define the subpixels or may be the next closest subpixel of any color when emissive stacks emitting in different wavelength ranges are used to define the subpixel. The reflection bands of the reflective polarizer generally shift to lower wavelength as the angle of incidence θ increases. Ranges of θ labeled 2766, 2767, and 2766 are schematically illustrated for embodiments in which the reflective polarizer has both a green and a red reflection band. In range 2766, the green reflection band strongly reflects light from green subpixels. In range 2767, the green reflection band has shifted to lower wavelengths and does not strongly reflect light from green subpixels. In range 2767, the red reflection band has not shifted to sufficiently low wavelengths that it could strongly reflect light from green subpixels. In range 2768, the red reflection band has shifted to sufficiently low wavelengths that it can substantially reflect light from green subpixels. For higher angles of incidence, neither the green nor the red reflection band strongly reflects light from green subpixels.

At a distance D≤Z1, the reflective polarizer does not strongly reflect light from green subpixels at walk-off distances d corresponding to the region between contours 2771 and 2772 or the region between contours 2775 and 2776 since both the green and red reflection bands have shifted to lower wavelengths. Thus, in some embodiments, in order to avoid ghosting from green wavelengths due to a shifted red reflection band, it may be preferred that D is sufficiently small (e.g., less than 0.8 times, or less than 0.6 times, or less than 0.4 times a center to center spacing between specified subpixels) that the red reflection band also shifts far enough to lower wavelengths that it does not substantially reflect green wavelengths at the relevant walk-off distances. At a distance D≈Z2, the reflective polarizer does not strongly reflect light from green subpixels at walk-off distances d corresponding to the region between contours 2771 and 2772 or the region between contours 2775 and 2776 since the green reflection bands has shifted to lower wavelengths and the red reflection band reflects light from green subpixels in regions between contours 2772 and 2775 where reflection from the display panel is not strong. In comparison, a broadband reflective polarizer positioned at D≈Z2 would produce ghosting from reflections in the green wavelength range. Thus, in some embodiments, it may be preferred that D is in a range (e.g., 0.8 to 1.2 times a center to center spacing between specified subpixels) where the green reflection band shifts to sufficiently low wavelengths that it does not substantially reflect green light at the relevant walk-off distances and where the red reflection band has not shifted to sufficiently low wavelengths that it substantially reflects green light at the relevant walk-off distances.

Values of D between Z1 and Z2 can also be used, but when this results in a substantial portion of the range 2768 being in the region between contours 2771 and 2772, this is typically less preferred since the red reflection band can then cause undesired reflections. Values of D substantially larger than Z2 can also be used, but are typically less preferred as this can result in undesired reflection of light from green subpixels in the region between contours 2771 and 2772 and/or in the region between contours 2775 and 2776. Values of D between Z1 and Z2, or values of D substantially larger than Z2, or other values of D can be used in embodiments where the primary goal is to increase gain and/or color gamut without increasing ambient photopic reflection to above 2%, for example, even when the value of D may not be optimum for reducing ghosting. However, it is typically preferred to choose D less than or about equal (e.g., within 10%) to Z1 or to choose D about equal (e.g., within 10%) to Z2 in order to minimize ghosting.

Preferred relations between D and pixel and/or subpixel geometry may depend on the type of display panel used and are described further elsewhere herein.

The angle of incidence θ is an internal angle of light 150 relative to a normal to reflective polarizer 110. The external view angle in air relative to a normal to a display that corresponds to the angle of incidence θ will generally be greater than θ due to refraction. The angle of incidence θ may also be denoted θint, and the external view angle in air may be denoted θext.

In some embodiments, in order to achieve a desired distance D, the circular polarizer 100 is positioned adjacent the display panel 130 under a cover glass of the display 1000. A encapsulant, which may be or include a glass, may be disposed between the circular polarizer 100 and the plurality of pixels.

In some embodiments, the reflective polarizer 110 has a single reflection band with a long wavelength band edge between peak emission wavelengths of two subpixels (e.g., green and red, or blue and green) in the plurality of subpixels. The single reflection band may have a short wavelength band edge wavelength between the peak emission wavelengths of two subpixels (e.g., blue and green) or may have a short wavelength band edge wavelength less than the peak emission wavelengths of each of the subpixels, for example.

OLED displays utilizing 4 subpixels where each subpixel utilizes a common emissive material emitting white light and color filters are overlaid on the common emissive material to define red, green, and blue subpixels are known in the art and described, for example, in U.S. Pat. No. 7,397,485 (Miller et al.) and U.S. Pat. No. 9,123,668 (Park et al.). White subpixels may also be utilized in such displays by leaving a portion of the common emissive material uncovered with a color filter or using a color filter over a portion of the common emissive material to adjust the white point of the white subpixels.

Figure 2:
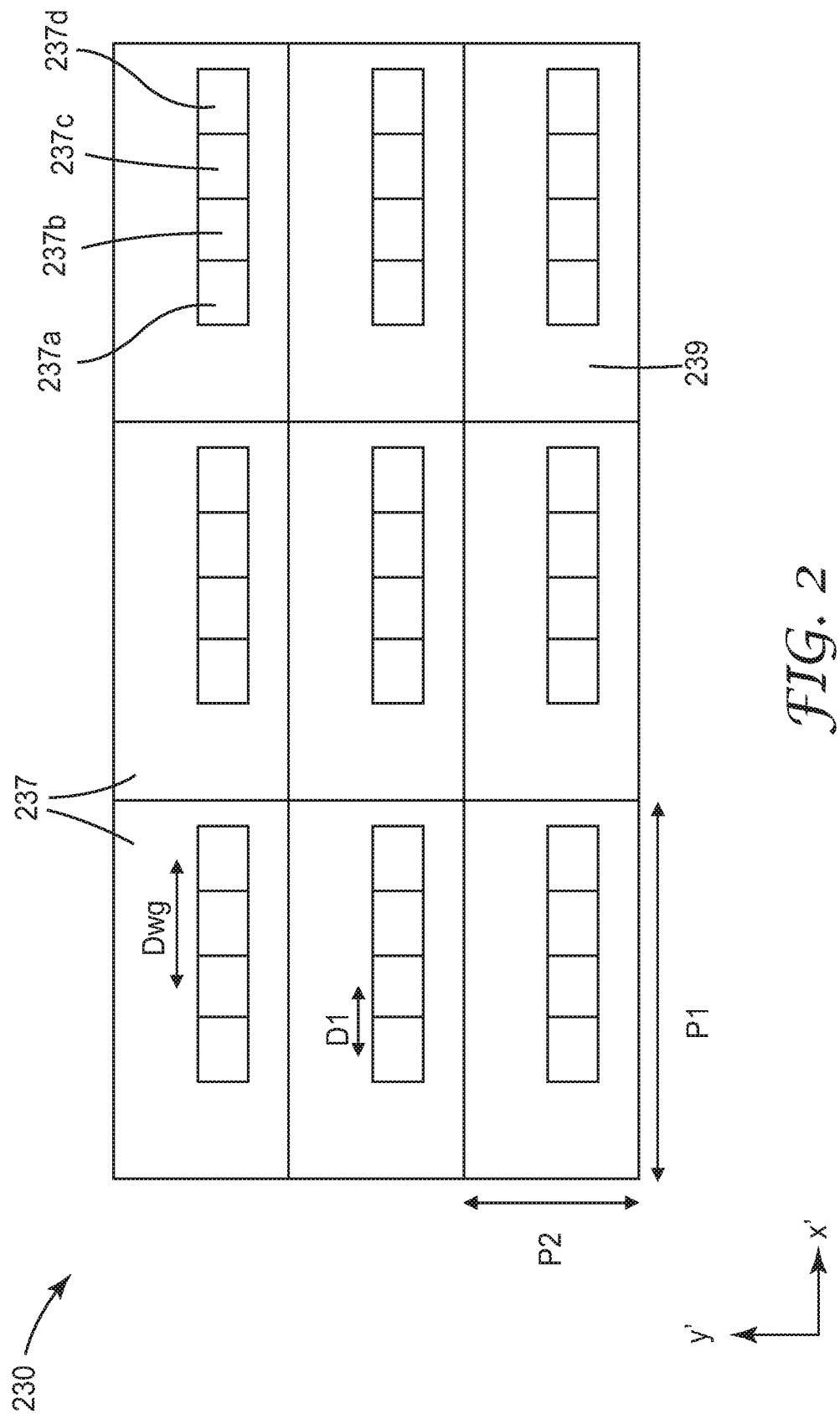
FIG. 2 is a schematic top view of a display panel including a plurality of pixels.

FIG. 2 is a schematic top view of a display panel 230 including a plurality of pixels 237. Each pixel 237 includes a plurality of subpixels. In some embodiments, each pixel 237 includes at least two subpixels. In some embodiments, the at least two subpixels include a green subpixel and a red subpixel. In some embodiments, the at least two subpixels include a blue subpixel and a green subpixel. In some embodiments, the plurality of subpixels includes at least 3 subpixels, or at least 4 subpixels. In some embodiments, the plurality of pixels includes a red subpixel, a green subpixel, and a blue subpixel. In some embodiments, the plurality of pixels includes a red subpixel, a green subpixel, a blue subpixel, and a white subpixel. In the illustrated embodiment, subpixels 237a, 237b, 237c, and 237d are included. Subpixels 237a, 237b, 237c, and 237d may be red, green, blue, and white subpixels, respectively, for example. In other embodiments, fewer subpixels (e.g., three subpixels such as a red, a green, and a blue subpixel) or more subpixels (e.g., five subpixels such as a red subpixel, two green subpixels, a blue subpixel, and a white subpixel) are included. In some embodiments, each pixel 237 includes a black matrix 239 adjacent the plurality of subpixels. OLED displays incorporating black matrix layers are known in the art and are described in U.S. Pat. No. 9,543,368 (Cheng et al.), U.S. Pat. No. 8,710,733 (Lee et al.), and U.S. Pat. No. 6,936,960 (Cok), for example.

The plurality of pixels 237 have an average pitch of P1 in a first direction (x'-direction) and an average pitch of P2 in a second direction (y'-direction). The average refers to an unweighted mean unless specified differently. The spacing between pixels may vary due to manufacturing variations, for example. In some cases, any difference between the local spacing between pixels and the corresponding average pitch is negligible. In some embodiments, a distance D (see FIG. 1) between the reflective polarizer and the plurality of pixels is in a range of 0.1 to 1, or 0.2 to 0.8, or 0.2 to 0.7 times an average pitch (e.g., either P1 or P2; or the smaller of P1 and P2) of the plurality of pixels 237.

The preferred value of the distance D may depend on the type of display panel 230 that is used. For example, in some embodiments, display panel 230 utilizes a color filter to define at least white and green subpixels. In such embodiments, the preferred distance D may be related to the average center to center distance Dwg between a white subpixel in a pixel and a green subpixel in the pixel. This is because when a color filter is used to define the subpixels, the green subpixels typically substantially reflect from the white subpixels but not red and blue subpixels which typically absorb light emitted by the green subpixels. The white subpixels also reflect light emitted by the blue and red subpixels, but since the human eye is most sensitive to green, the distance D is selected, in some embodiments, based on the distance between the green and white subpixels. In some embodiments, D is no more than 1.2, or no more than 1, or no more than 0.8, or no more than 0.6, or no more than 0.4 times Dwg (e.g., corresponding to D≤Z1 in FIG. 27). In some such embodiments, or in other embodiments, D is at least 10 micrometers or at least 0.05 times Dwg. In some embodiments, D is in a range of 0.8 to 1.2 times Dwg (e.g., corresponding to D≈Z2 in FIG. 27). In some embodiments, D is either in a range of 0.8 to 1.2 times Dwg, or D is less than 0.6 times Dwg.

In some embodiments, a color filter is not used to define the subpixels. For example, in some embodiments, each pixel includes a red subpixel including a red emissive material, a green subpixel including a green emissive material, and a blue subpixel including a blue emissive material. In some such embodiments, or in other embodiments, the preferred distance D may be related to the average center to center distance D1 between adjacent subpixels. This is because in this case, each subpixel substantially reflects light from adjacent subpixels. In some embodiments, D is no more than 1.2, or no more than 1, or no more than 0.8, or no more than 0.6, or no more than 0.4 times D1 (e.g., corresponding to D≤Z1 in FIG. 27). In some such embodiments, or in other embodiments, D is at least 10 micrometers or at least 0.05 times D1. In some embodiments, D is in a range of 0.8 to 1.2 times D1 (e.g., corresponding to D≈Z2 in FIG. 27). In some embodiments, D is either in a range of 0.8 to 1.2 times D1, or D is less than 0.6 times D1.

In some embodiments, it is desired for D to be sufficiently small that the thickness of the reflective polarizer is not negligible compared to D. In some such embodiments, or in other embodiments, it may be desired to arrange the layers of the reflective polarizer so that the layers reflecting green wavelengths is disposed closest to an outermost major surface of the reflective polarizer which is disposed facing the display panel. This can provide an optimum separation distance for the green reflecting layers and less optimum (greater) separation distances for the red and blue reflecting layers. Since green wavelengths are more heavily weighted in photopic averaging, this may be preferred according to some embodiments.

Figure 3:
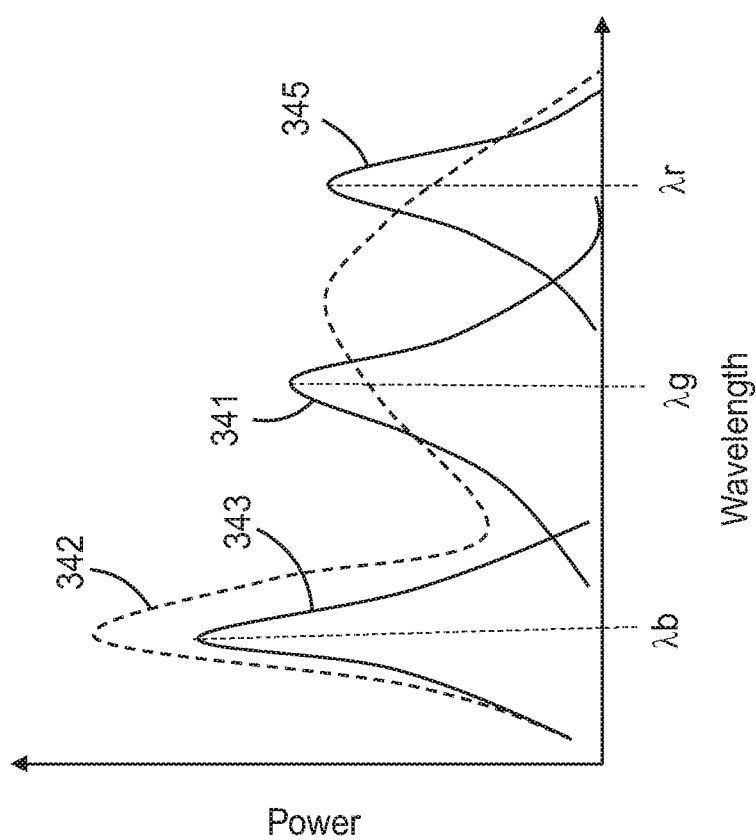
FIG. 3 is a schematic illustration of emission spectra of subpixels.

FIG. 3 is a schematic illustration of emission spectra of various subpixels. The emission spectrum 341 of a first subpixel (e.g., a green subpixel), the emission spectrum 343 of a second subpixel (e.g., a blue subpixel), the emission spectrum 345 of a third subpixel (e.g., a red subpixel), and the emission spectrum 342 of a fourth subpixel (e.g., a white subpixel) are illustrated. The peak emission wavelengths λg, λb, and λr, of the first, second, and third subpixels having the emission spectra 341, 343, and 345, respectively, are shown. The peak emission wavelength of the fourth subpixel having the emission spectrum 342 is about equal to the peak emission wavelengths λb of the second subpixel having the emission spectra 343.

Figure 4B:
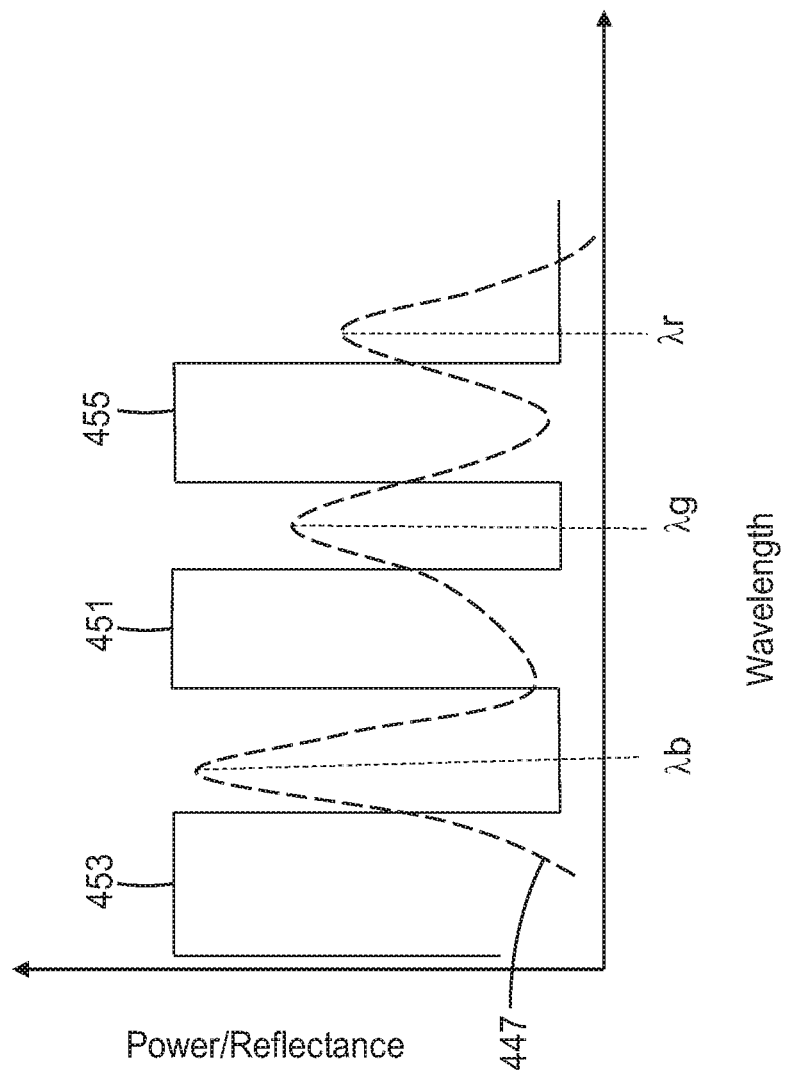
FIG. 4B is a schematic illustration of substantially non-overlapping first, second, and third reflection bands of a reflective polarizer and emission spectra of first, second, and third subpixels at off-normal incidence.

FIGS. 4A-4B are schematic illustrations of substantially non-overlapping first, second, and third reflection bands 451, 453, and 455 of a reflective polarizer and emission spectra 447 of a display panel having at least first, second, and third subpixels where the first subpixel has a first peak emission wavelength λg, the second subpixel has a second peak emission wavelength λb less than the first peak emission wavelength λg, and the third subpixel has a third peak emission wavelength λr greater than the first peak emission wavelength λg. FIG. 4A shows the reflectance of the reflective polarizer at normal incidence and FIG. 4B shows the reflectance of the reflective polarizer at an off normal angle of incidence θ which may be 45 degrees, for example. At normal incidence, the first reflection band 451 includes the first peak emission wavelength λg, the second reflection band 453 includes the second peak emission wavelength λb, and the third reflection band includes the third peak emission wavelength λr. At normal incidence, the first reflection band 451 has a long wavelength band edge wavelength greater than a peak emission wavelength λg of the first subpixel; the second reflection band 453 has a long wavelength band edge wavelength greater than a peak emission wavelength λb of the second subpixel and less than a peak emission wavelength λg of the first subpixel; and the third reflection band 455 has a long wavelength band edge wavelength greater than a peak emission wavelength λr of the third subpixel and has a short wavelength band edge wavelength greater than the long wavelength band edge wavelength of the first reflection band 451. As shown in FIG. 4B, at the angle of incidence θ (e.g., 45 degrees), the first peak emission wavelength λg is between the first and third reflection bands 451 and 455, the second peak emission wavelength λb is between the first and second reflection bands 451 and 453, and the third peak emission wavelength λr is greater than a long wavelength band edge wavelength of the third reflection band 455. At the angle of incidence θ (e.g., 45 degrees), the long wavelength band edge wavelength of the first reflection band 451 is less than the peak emission wavelengths λg and λr of each of the first and third subpixels; the long wavelength band edge wavelength of the second reflection band 453 is less than the peak emission wavelengths λg, λb and λr of each of the first, second and third subpixels; and the long wavelength band edge wavelength of the third reflection band 455 is less than the peak emission wavelength λr of the third subpixel.

In some embodiments, at normal incidence, the first reflection band 451 reflects at least 60% of a first light having a block polarization state and a wavelength distribution of an emission spectrum (e.g., emission spectrum 441) of a first subpixel in the plurality of subpixels, and at an angle of incidence of 45 degrees, the first reflection band 451 transmits at least 60% of the first light. In some embodiments, at normal incidence, the second reflection band 453 reflects at least 60% of a second light having the block polarization state and a wavelength distribution of an emission spectrum (e.g., emission spectrum 443) of a second subpixel in the plurality of subpixels, and at an angle of incidence of 45 degrees, the second reflection band 453 transmits at least 60% of the second light. In some embodiments, at normal incidence, the third reflection band 455 reflects at least 60% of a third light having the block polarization state and a wavelength distribution of an emission spectrum (e.g., emission spectrum 345) of a third subpixel in the plurality of subpixels, and at an angle of incidence of 45 degrees, the third reflection band transmits at least 60% of the third light.

The wavelength distribution $N(\lambda)$ of an emission spectrum is defined such that $N(\lambda)d\lambda$ is the fraction of emitted photons having wavelengths between $\lambda$ and $\lambda+d\lambda$. This can be related to the power output of the emission spectrum as follows. An emission spectrum has a power output P as a function of wavelength $\lambda$ such that $P(\lambda)d\lambda$ is the power output of wavelengths between $\lambda$ and $\lambda+d\lambda$. The wavelength distribution is given by $N(\lambda)=(N_0/\lambda) P(\lambda)$, where $N_0$ is a normalization constant chosen so that the integral of $N(\lambda)$ over wavelengths is unity. The first reflection band may have a transmittance as a function of wavelength $T_\theta(\lambda)$ and a reflectance as a function of wavelength $R_\theta(\lambda)$ at a specified angle of incidence $\theta$ in the block polarization state. A reflection band reflects at least 60% of a light having a block polarization state and a wavelength distribution of an emission spectrum at a specified angle of incidence $\theta$ if the integral over wavelengths of $N(\lambda)$ times $R_\theta(\lambda)$ is at least 60%. Similarly, a reflection band transmits at least 60% of a light having a block polarization state and a wavelength distribution of an emission spectrum at a specified angle of incidence $\theta$ if the integral over wavelengths of $N(\lambda)$ times $T_\theta(\lambda)$ is at least 60%.

The peak emission wavelengths $\lambda g$, $\lambda b$ and $\lambda r$ may be green (e.g., 500 nm to 600 nm), blue (e.g., 400 nm to 500 nm), and red (e.g., 600 nm to 700 nm) wavelengths, respectively, but other wavelength ranges may alternatively be used.

In other embodiments, the reflective polarizer has fewer reflection bands (e.g., one or two reflection bands). For example, a single reflection band having a long wavelength band edge wavelength at normal incidence between $\lambda g$ and $\lambda r$ may be used. The short wavelength band edge wavelength may be less than $\lambda b$ in this case. As another example, the reflective polarizer may include the first and second reflection bands 451 and 453 and omit the third reflection band 455. As yet another example, the first and second reflection bands 451 and 453 may be combined into a single wide band and the third reflection band 455 may be included so that the reflective polarizer has two reflection bands.

In some embodiments, the reflective polarizer has at least a first reflection band. In some embodiments, at normal incidence, the first reflection band has a long wavelength band edge wavelength between peak emission wavelengths of two subpixels in the plurality of subpixels. In some embodiments, at an angle of incidence of 45 degrees, the first reflection band has a long wavelength band edge wavelength less than the peak emission wavelengths of each of the two subpixels.

Figure 5:
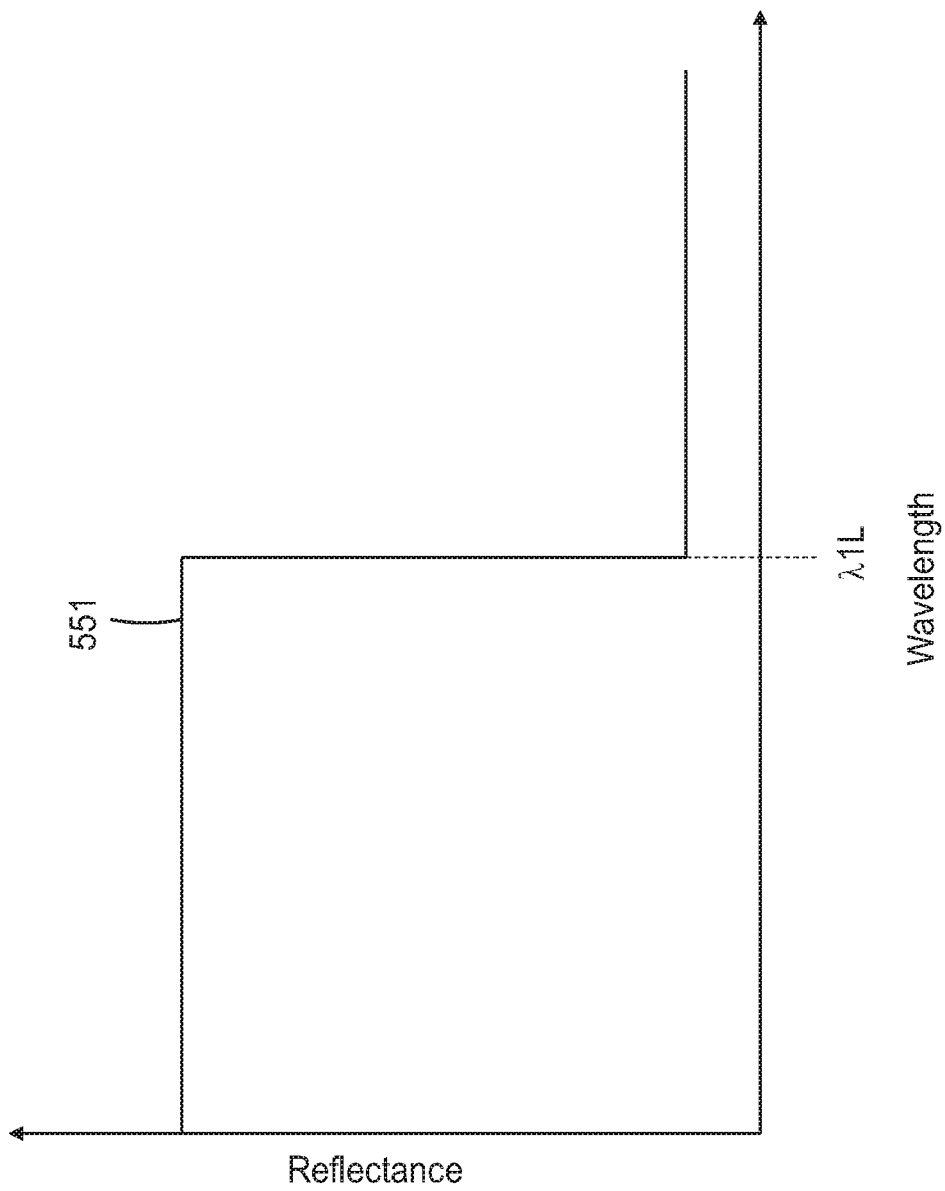
FIGS. 5-6 are schematic plots of the reflectance of reflective polarizers for light having a block polarization state as a function of wavelength for a fixed angle of incidence.
Figure 6:
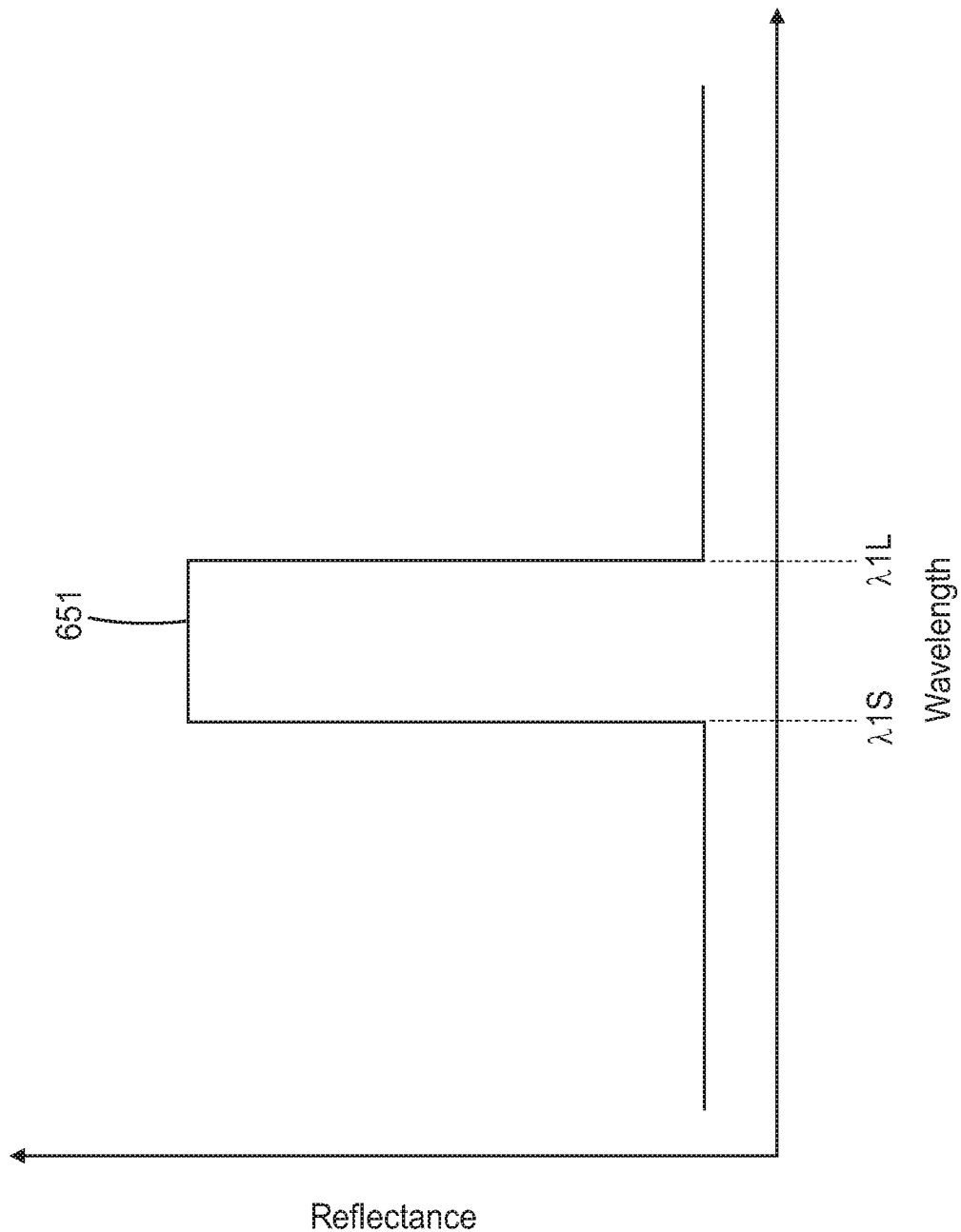

FIG. 5 is a schematic plot of the reflectance of a reflective polarizer for light having a block polarization state as a function of wavelength for some fixed angle of incidence (e.g., 0 degrees or 45 degrees). In this case, the reflective polarizer has only one reflection band 551 in the visible spectrum. The reflection band 551 has a long wavelength band edge wavelength $\lambda 1L$. The reflection band 551 may have a short wavelength band edge wavelength less than the peak emission wavelength of blue subpixels or less than 400 nm, for example. In other embodiments, the reflection band may have a shorter bandwidth (e.g., less than 150 nm, or less than 100 nm, or less than 80 nm). FIG. 6 is a schematic plot of the reflectance of a reflective polarizer for light having a block polarization state as a function of wavelength for some fixed angle of incidence (e.g., 0 degrees or 45 degrees). In this case, the reflective polarizer has only one reflection band 651 in the visible spectrum. The reflection band 651 has a long wavelength band edge wavelength $\lambda 1L$ and a short wavelength band edge wavelength $\lambda 1S$.

Figure 7:
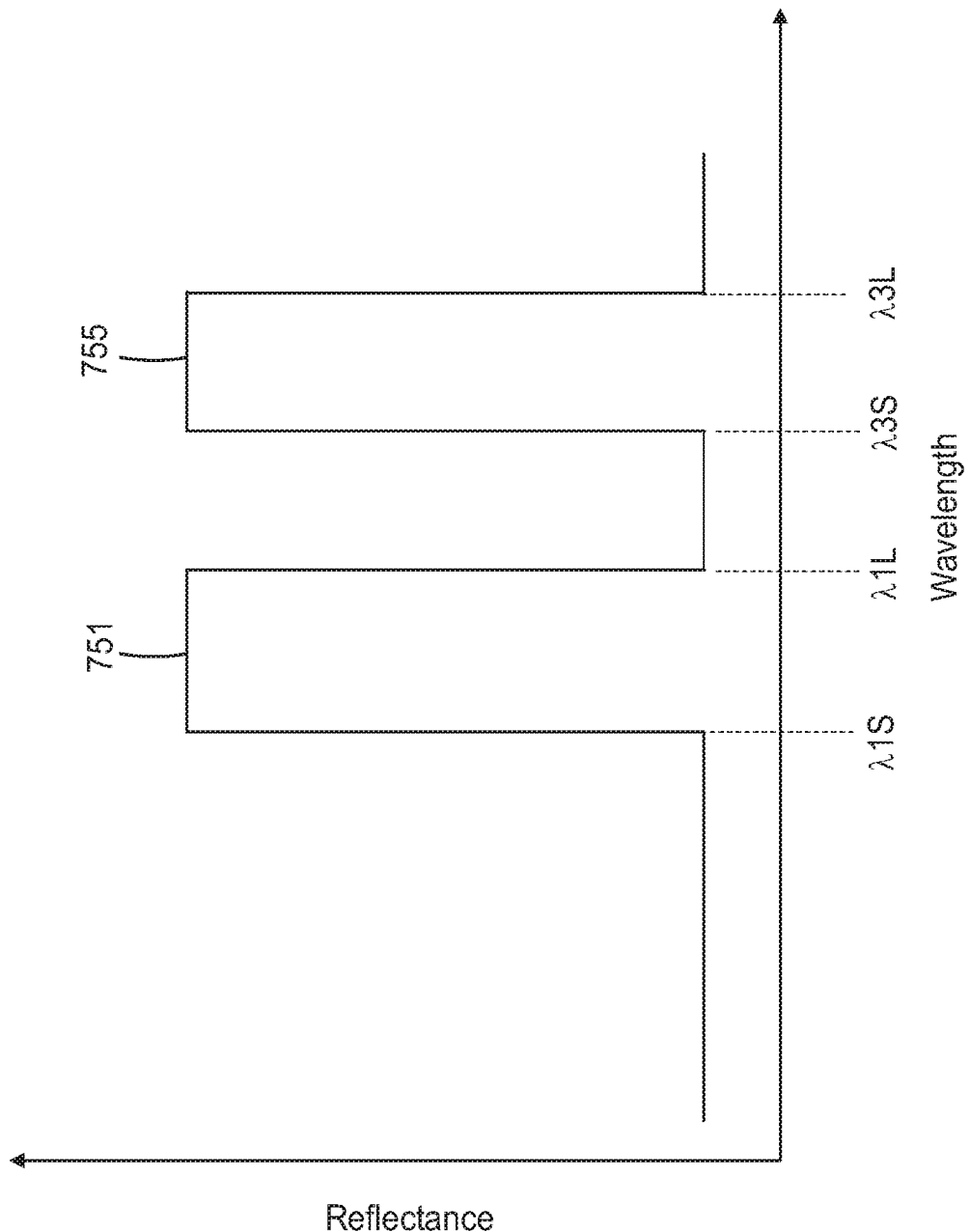
FIGS. 7-8 are schematic plots of the reflectance of reflective polarizers having two reflection bands in the illustrated wavelength ranges for light having a block polarization state as a function of wavelength for a fixed angle of incidence.

FIG. 7 is a schematic plot of the reflectance of a reflective polarizer having two reflection bands in the illustrated wavelength range (e.g., 400 nm to 700 nm) for light having a block polarization state as a function of wavelength for some fixed angle of incidence (e.g., 0 degrees or 45 degrees). The first reflection band 751 has a long wavelength band edge wavelength $\lambda 1L$ and a short wavelength band edge wavelength $\lambda 1S$. The second reflection band 755, which may also be referred to as a third reflection band since an optional additional reflection band having wavelengths lower than $\lambda 1S$ may also be included (see, e.g., FIG. 9), has a long wavelength band edge wavelength $\lambda 3L$ and a short wavelength band edge wavelength $\lambda 3S$.

Figure 8:
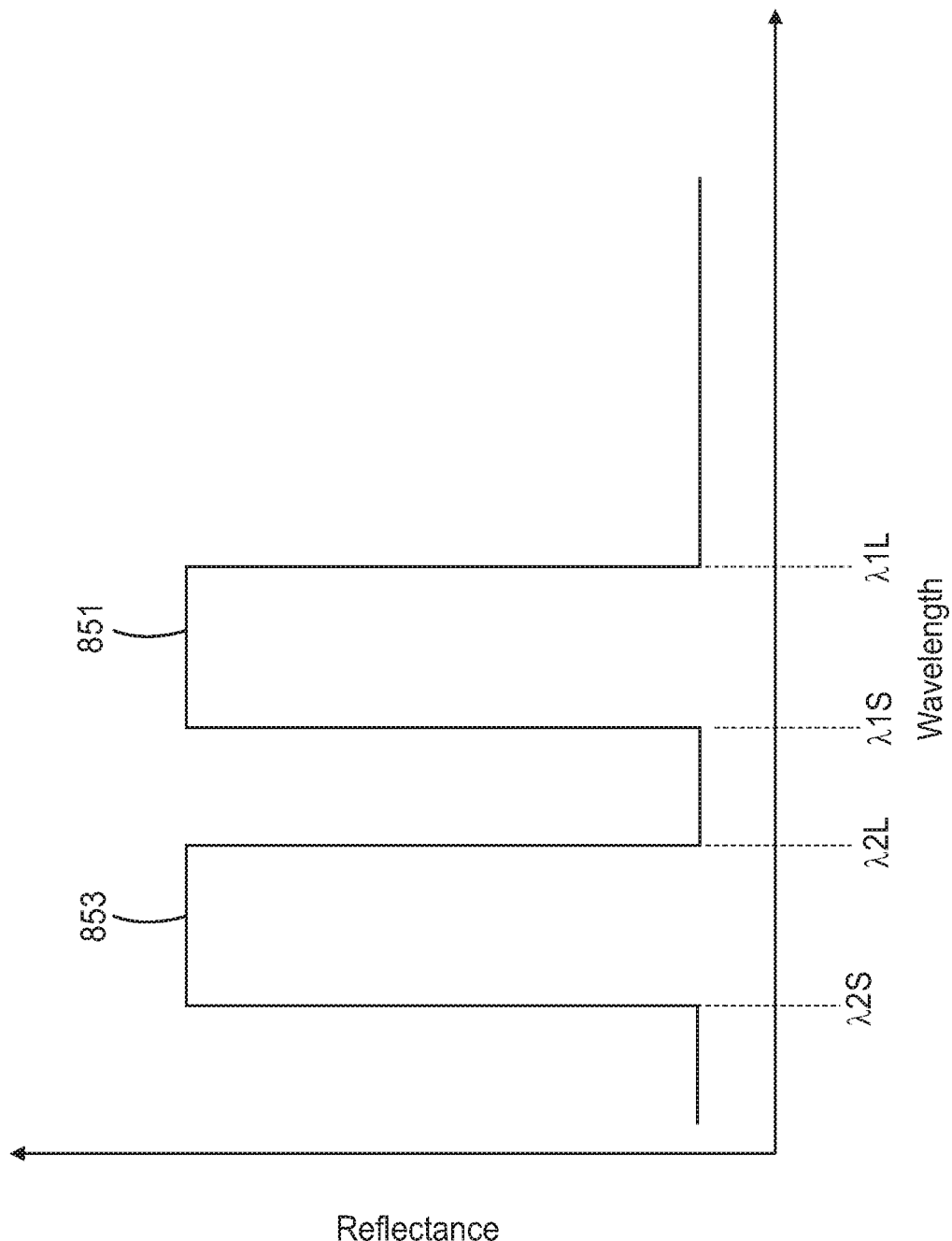

FIG. 8 is a schematic plot of the reflectance of a reflective polarizer having two reflection bands in the illustrated wavelength range (e.g., 400 nm to 700 nm) for light having a block polarization state as a function of wavelength for some fixed angle of incidence (e.g., 0 degrees or 45 degrees). The first reflection band 851 has a long wavelength band edge wavelength $\lambda 1L$ and a short wavelength band edge wavelength $\lambda 1S$. The second reflection band 853 has a long wavelength band edge wavelength $\lambda 2L$ and a short wavelength band edge wavelength $\lambda 2S$.

Figure 9:
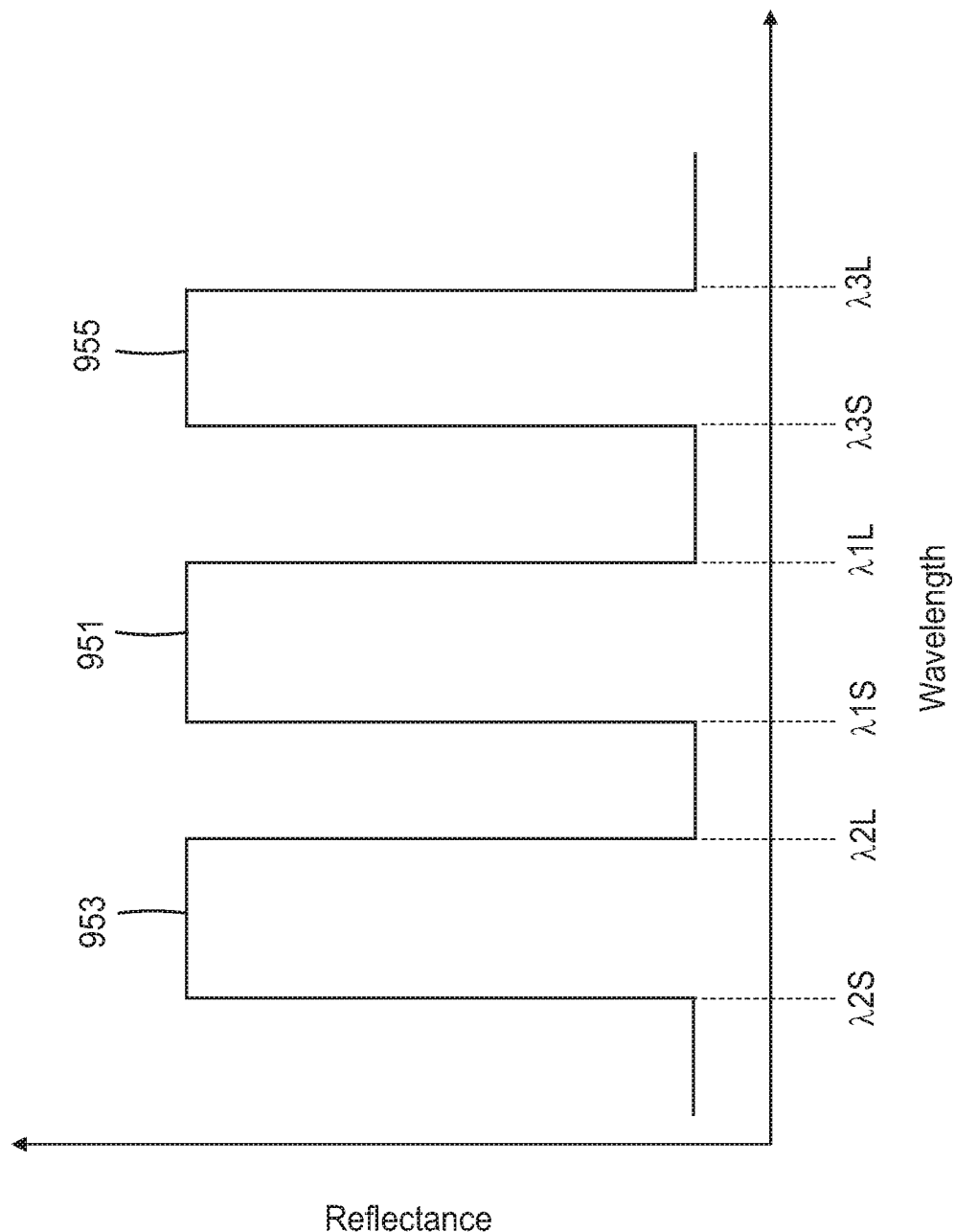
FIGS. 9-10 are schematic plots of the reflectance of reflective polarizers having three reflection bands in the illustrated wavelength ranges for light having a block polarization state as a function of wavelength for a fixed angle of incidence.
Figure 10:
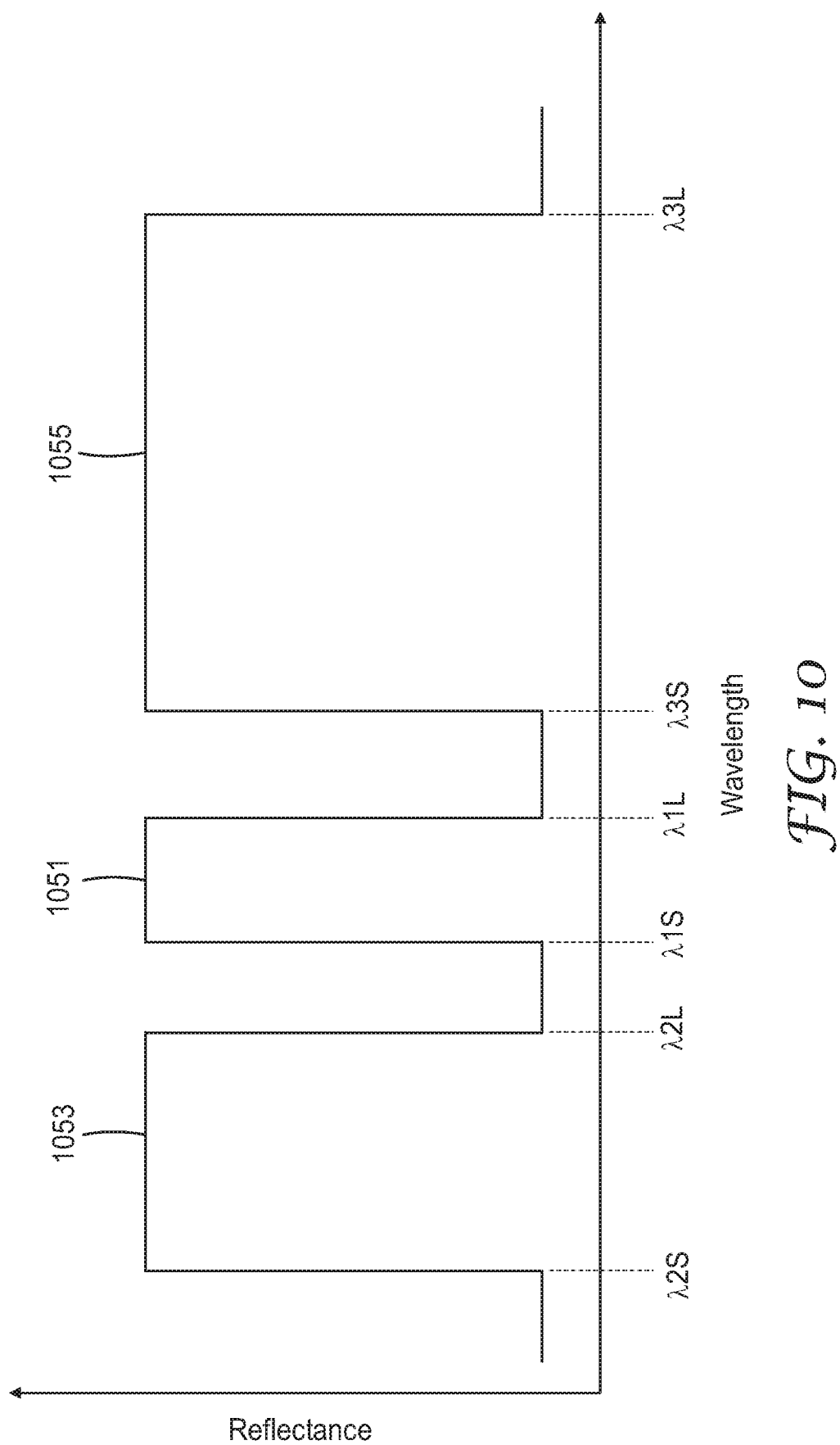

FIG. 9 is a schematic plot of the reflectance of a reflective polarizer having three reflection bands in the illustrated wavelength range (e.g., 400 nm to 700 nm) for light having a block polarization state as a function of wavelength for some fixed angle of incidence (e.g., 0 degrees or 45 degrees). The first reflection band 951 has a long wavelength band edge wavelength $\lambda 1L$ and a short wavelength band edge wavelength $\lambda 1S$. The second reflection band 953 has a long wavelength band edge wavelength $\lambda 2L$ and a short wavelength band edge wavelength $\lambda 2S$. The third reflection band 955 has a long wavelength band edge wavelength $\lambda 3L$ and a short wavelength band edge wavelength $\lambda 3S$. Each of the first, second and third reflection bands 951, 953, and 955 may have relatively narrow bandwidths (e.g., each less than 80 nm or each in a range of 10 nm to 80 nm). In other embodiments, some of the reflection bands may have broader bandwidths. FIG. 10 is a schematic plot of the reflectance of a reflective polarizer having three reflection bands in the illustrated wavelength range for light having a block polarization state as a function of wavelength for some fixed angle of incidence (e.g., 0 degrees or 45 degrees). The first reflection band 1051 has a long wavelength band edge wavelength $\lambda 1L$ and a short wavelength band edge wavelength $\lambda 1S$. The second reflection band 1053 has a long wavelength band edge wavelength $\lambda 2L$ and a short wavelength band edge wavelength $\lambda 2S$. The third reflection band 1055 has a long wavelength band edge wavelength $\lambda 3L$ and a short wavelength band edge wavelength $\lambda 3S$. The short wavelength band edge wavelength $\lambda 2S$ of the second reflection band 1053 may be no more than 420 nm, or no more than 400 nm, or no more than 390 nm, for example, at normal incidence. The long wavelength band edge wavelength $\lambda 3L$ of the third reflection band 1055 may be at least 700 nm, or at least 750 nm, for example, at normal incidence.

In some embodiments, at normal incidence, the first reflection band (e.g., reflection band 451, 651, 751, 851, 951, or 1051) has a bandwidth ($\lambda 1L-\lambda 1S$) of no more than 80 nm (e.g., in a range of 10 nm to 80 nm). In some embodiments, at normal incidence, the second reflection band (e.g., reflection band 453, 755, 853, 953, or 1053) has a bandwidth ($\lambda 2L-\lambda 2S$) of no more than 80 nm (e.g., in a range of 10 nm to 80 nm). In other embodiments, at normal incidence, the second reflection band (e.g., reflection band 453, 755, 853, 953, or 1053) has a bandwidth (λ2L−λ2S) of greater than 80 nm (e.g., 100 nm or greater). In some embodiments, at normal incidence, the third reflection band (e.g., 455, 755, 955 or 1055) has a bandwidth (λ3L−λ3S) of no more than 80 nm (e.g., in a range of 10 nm to 80 nm). In other embodiments, at normal incidence, the third reflection band (e.g., reflection band 455, 755, 955 or 1055) has a bandwidth (λ3L−λ3S) of greater than 80 nm (e.g., 100 nm or greater). In some embodiments, at normal incidence, a reflection band (e.g., reflection band 455, 755, 955 or 1055) has a long wavelength band edge wavelength λ3L in a range of 700 nm to 2500 nm, or in a range of 750 nm to 900 nm, for example.

In some embodiments, the display panel includes a plurality of pixels, where each pixel includes a plurality of subpixels, and where the plurality of subpixels includes a red subpixel, a green subpixel, and a blue subpixel. The plurality of subpixels may also optionally include a white subpixel. In some embodiments, at normal incidence, the long wavelength band edge wavelength λ1L of the first reflection band (e.g., reflection band 451, 551, 651, 751, 851, 951, or 1051) is between peak emission wavelengths of green and the red subpixels, or between peak emission wavelengths of blue and green subpixels. In some embodiments, the reflective polarizer has a second reflection band (e.g., reflection band 453, 853, 953, or 1053), and at normal incidence, the second reflection band has a long wavelength band edge wavelength λ2L between peak emission wavelengths of the blue and the green subpixels. In some embodiments, the reflective polarizer has a third reflection band (e.g., reflection band 455, 755, 955, or 1055), and at normal incidence, the third reflection band has a short wavelength band edge wavelength λ3S greater than the long wavelength band edge wavelength of the first reflection band and less than a peak emission wavelength of the red subpixel.

In some embodiments, at normal incidence, the second reflection band has a long wavelength band edge wavelength λ2L in a range of 440 nm to 500 nm; the short wavelength band edge wavelength λ1S of the first reflection band is at least 10 nm greater than the long wavelength band edge wavelength λ2L of the second reflection band (λ1S−λ2L≥10 nm); the third reflection band has a short wavelength band edge wavelength λ3S in a range of 580 nm to 640 nm; and the short wavelength band edge wavelength λ3S of the third reflection band is at least 10 nm greater than the long wavelength band edge wavelength λ1L of the first reflection band (λ3S−λ1L≥10 nm). In some embodiments, at normal incidence, the first reflection band has a short wavelength band edge wavelength λ1S in a range of 480 nm to 510 nm and has a long wavelength band edge wavelength λ1L in a range of 550 to 570 nm. In some embodiments, at normal incidence, the first reflection band has a bandwidth λ1L−λ1S of no more than 80 nm.

Figure 11:
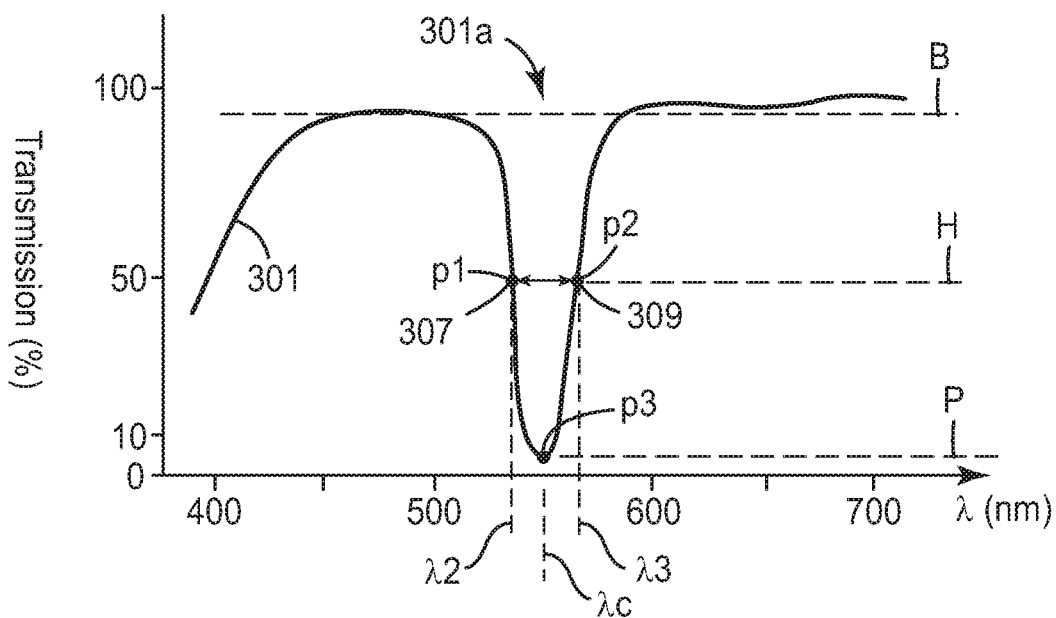
FIG. 11 is a schematic graph of the transmission spectrum of a reflective polarizer.

FIG. 11 is a schematic graph of the transmission spectrum of a reflective polarizer. In this figure, transmittance is plotted against wavelength in nanometers, the wavelength axis extending over the range from 400 nm to 700 nm. The curve 301 may represent the measured transmittance for light at normal incidence polarized along a block axis. The illustrated reflective polarizer selectively reflects light within a narrow band in a portion of the green region of the spectrum, evidenced by the relatively low transmittance indicated by the curve 301 in the reflection band 301a.

In order to quantify relevant features of the curve 301, a baseline value B of the curve 301, a peak value P of the curve 301 (in this case the peak value P corresponds to a transmittance minimum for the reflection band 301a, shown at point p3), and an intermediate value H of the curve 301, halfway between P and B are identified in FIG. 11. The curve 301 intersects with the value H at the points p1 and p2. These points lie on the short wavelength band edge 307 and the long wavelength band edge 309, respectively, of the reflection band 301a and define the short wavelength band edge wavelength λ2 and the long wavelength band edge wavelength λ3. The short and long wavelength band edge wavelengths can be used to calculate two other parameters of interest: the width (full width at half-maximum, or "FWHM") of the reflection band 301a, which equals λ3−λ2; and the center wavelength λc of the reflection band 301a, which equals (λ2+λ3)/2. Note that the center wavelength λc may be the same as or different from the peak wavelength (see point p3) of the reflection band 301a, depending on how symmetrical or asymmetrical the reflection band 301a is. In many cases, the absorbance of the reflective polarizer is negligible and so the reflectance is approximately 100% minus the transmission. The band edge wavelengths can be defined similarly from a plot of the reflectance versus wavelength.

Two reflection bands can be described as substantially non-overlapping if one of the reflection bands reflects shorter wavelengths and has a long wavelength band edge wavelength as defined above, the other of the reflection bands reflects longer wavelengths and has a short wavelength band edge wavelength as defined above, and the short wavelength band edge wavelength of the reflection band reflecting longer wavelengths is greater than the long wavelength band edge wavelength of the reflection band reflecting shorter wavelengths. It will be understood that tails of the wavelength distributions of the reflection bands can overlap where the tails have a low reflectance (e.g., less than 40%, or less than 30%, or less than 20%, or less than 10% of a peak reflectance throughout the tail) in the block state and the reflection bands can still be described as substantially non-overlapping if the short wavelength band edge wavelength of the reflection band reflecting longer wavelengths is greater than the long wavelength band edge wavelength of the reflection band reflecting shorter wavelengths.

The transmittance of an optical element refers generally to the transmitted light intensity divided by the incident light intensity (for light of a given wavelength, incident direction, etc.), but may be expressed in terms of "external transmittance" or "internal transmittance". The external transmittance of an optical element is the transmittance of the optical element when immersed in air, and without making any corrections for Fresnel reflections at the air/element interface at the front of the element or for Fresnel reflections at the element/air interface at the back of the element. The internal transmittance of an optical element is the transmittance of the element when the Fresnel reflections at its front and back surfaces have been removed. The removal of the front and back Fresnel reflections may be done either computationally (e.g. by subtracting an appropriate function from the external transmission spectrum), or experimentally. For many types of polymer and glass materials, the Fresnel reflections are about 4 to 6% (for normal or near-normal angles of incidence) at each of the two outer surfaces, which results in a downward shift of about 10% for the external transmittance relative to the internal transmittance. FIG. 11 does not specify which of these transmittances is used, hence, it may generally apply to either internal or external transmittance. If transmittance is referred to herein without being specified as internal or external, it may be assumed that the transmittance refers to external transmittance, unless otherwise indicated by the context.

Figure 12:
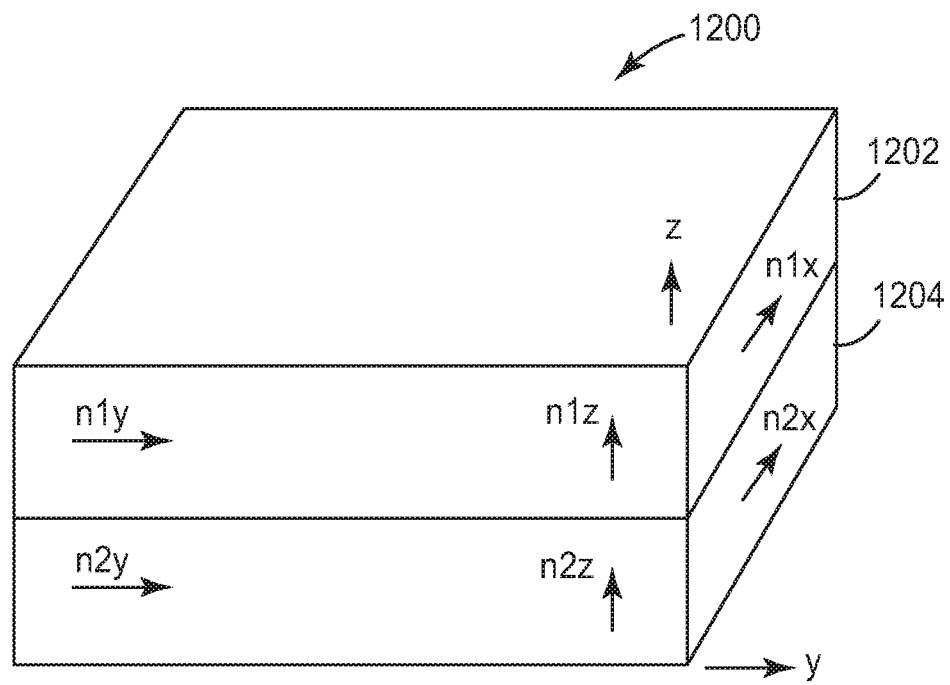
FIG. 12 is a schematic perspective view of an exemplary optical repeat unit (ORU) of a multilayer optical film.

A reflective polarizer of the present description is may be a multilayer optical film that includes an optical stack including a plurality of optical repeat units where each optical repeat unit includes first and second polymer layers. FIG. 12 is a schematic perspective view of an exemplary optical repeat unit (ORU) of a multilayer optical film 1200. FIG. 12 depicts only two layers of the multilayer optical film 1200, which can include tens or hundreds of such layers arranged in one or more contiguous packets or stacks. The film 1200 includes individual microlayers 1202, 1204, where "microlayers" or "interference layers" refer to layers that are sufficiently thin so that light reflected at a plurality of interfaces between such layers undergoes constructive or destructive interference to give the multilayer optical film the desired reflective or transmissive properties. The microlayers 1202, 1204 can together represent one optical repeat unit (ORU) of the multilayer stack, an ORU being the smallest set of layers that recur in a repeating pattern throughout the thickness of the stack. The microlayers have different refractive index characteristics so that some light is reflected at interfaces between adjacent microlayers. For optical films designed to reflect light at ultraviolet, visible, or near-infrared wavelengths, each microlayer typically has an optical thickness (i.e., a physical thickness multiplied by the relevant refractive index) of less than about 1 micrometer. Thicker layers can, however, also be included, such as skin layers at the outer surfaces of the film, or protective boundary layers (PBL) disposed within the film that separate packets of microlayers, as desired. In some embodiments, only a single packet or stack of interference layers is included in the optical films of the present description.

Refractive indices of one of the microlayers (e.g. microlayer 1202 of FIG. 1, or the "A" layers of FIG. 13) for light polarized along principal x-, y-, and z-axes are $n1x$, $n1y$, and $n1z$, respectively. The mutually orthogonal x-, y-, and z-axes can, for example, correspond to the principal directions of the dielectric tensor of the material. The x- and y-axes of FIGS. 12 and 13 may or may not correspond to the x'- and y'-axes of FIG. 2. In many embodiments, the principle directions of the different materials are coincident, but this need not be the case in general. The refractive indices of the adjacent microlayer (e.g. microlayer 1204 in FIG. 12, or the "B" layers in FIG. 13) along the same axes are $n2x$, $n2y$, $n2z$, respectively. The differences in refractive index between these layers are $\Delta nx$ ($=n1x-n2x$) along the x-direction, $\Delta ny$ ($=n1y-n2y$) along the y-direction, and $\Delta nz$ ($=n1z-n2z$) along the z-direction. The nature of these refractive index differences, in combination with the number of microlayers in the film (or in a given stack of the film) and their thickness distribution, control the reflective and transmissive characteristics of the film (or of the given stack of the film). For example, if adjacent microlayers have a large refractive index mismatch along one in-plane direction ($\Delta nx$ large) and a small refractive index mismatch along the orthogonal in-plane direction ($\Delta ny \approx 0$), the film or packet may behave as a reflective polarizer for normally incident light.

If desired, the refractive index difference ($\Delta nz$) between adjacent microlayers for light polarized along the z-axis can also be tailored to achieve desirable reflectivity properties for the p-polarization component of obliquely incident light. To maintain near on-axis reflectivity of p-polarized light at oblique angles of incidence, the z-index mismatch $\Delta nz$ between microlayers can be controlled to be substantially less than the maximum in-plane refractive index difference $\Delta nx$, such that $|\Delta nz| \leq 0.5*|\Delta nx|$. Alternatively, $|\Delta nz| \leq 0.25*|\Delta nx|$. A zero or near zero magnitude z-index mismatch yields interfaces between microlayers whose reflectivity for p-polarized light is constant or near constant as a function of incidence angle. Furthermore, the z-index mismatch $\Delta nz$ can be controlled to have the opposite polarity compared to the in-plane index difference $\Delta nx$, e.g., $\Delta nz < 0$ when $\Delta nx > 0$. This condition yields interfaces whose reflectivity for p-polarized light increases with increasing angles of incidence, as is the case for s-polarized light. If $\Delta nz > 0$, then the reflectivity for p-polarized light decreases with angle of incidence. The foregoing relationships also of course apply to relationships involving $\Delta nz$ and $\Delta ny$, e.g., in cases where significant reflectivity and transmission are desired along two principal in-plane axes (such as a partial polarizing film whose pass axis has significant reflectivity at normal incidence).

Figure 13:
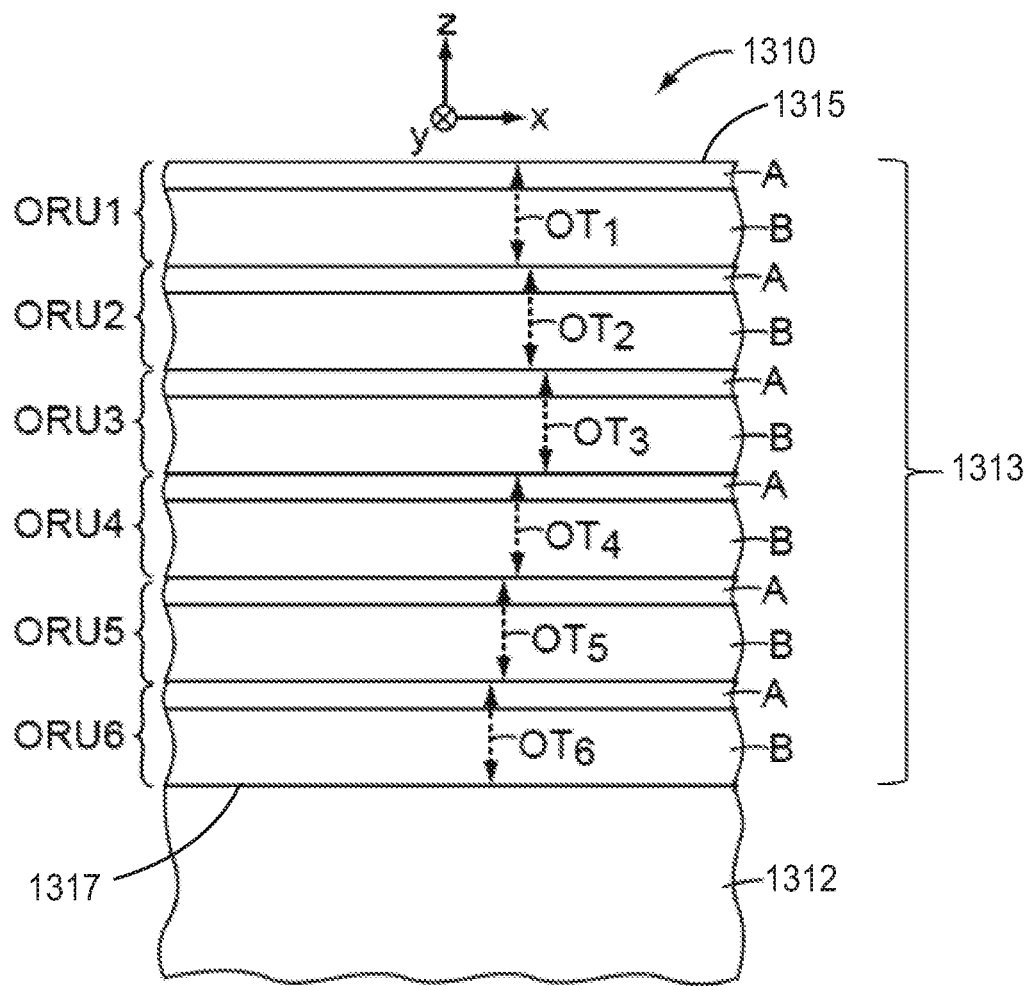
FIG. 13 is a schematic side view of a multilayer optical film.

In the schematic side view of FIG. 13, more interior layers of a multilayer optical film 1310 are shown so that multiple ORUs can be seen. The film is shown in relation to a local x-y-z Cartesian coordinate system, where the film extends parallel to the x- and y-axes, and the z-axis is perpendicular to the film and its constituent layers and parallel to a thickness axis of the film.

In FIG. 13, the microlayers, which may be referred to as alternating interference layers, are labeled "A" or "B," the "A" layers being composed of one material and the "B" layers being composed of a different material, these layers being stacked in an alternating arrangement to form optical repeat units or unit cells ORU 1, ORU 2, . . . ORU 6 as shown. In many embodiments, a multilayer optical film composed entirely of polymeric materials would include many more than 6 optical repeat units if high reflectivities are desired. In some embodiments, the "A" layers are composed of a first polymer and the "B" layers are composed of a different second polymer. The "A" and "B" layers may then be referred to as alternating polymeric interference layers. The multilayer optical film 1310 is shown as having a substantially thicker layer 1312, which may represent an outer skin layer, or a protective boundary layer ("PBL," see U.S. Pat. No. 6,783,349 (Neavin et al.)) that may separate the stack of microlayers shown in the figure from another stack or packet of microlayers (if present). Multilayer optical film 1310 includes a single stack 1313 having opposing first and second sides 1315 and 1317.

Interference layers or microlayers can be described as reflecting and transmitting light primarily by optical interference when the reflectance and transmittance of the interference layers can be reasonably described by optical interference or reasonably accurately modeled as resulting from optical interference.

In some embodiments, the thicker layer 1312 is optically thick in that it is too thick to significantly contribute to the constructive and destructive interference provided by the optical stack. In some embodiments, an optically thick layer has at least one of a physical thickness and an optical thickness that is greater than 1 micrometer, or at least 2 micrometers, or at least 3 micrometers, or at least 5 micrometers. If thickness is referred to without specifying whether the thickness is an optical thickness or a physical thickness, the thickness can be assumed to be a physical thickness.

In some cases, the microlayers or interference layers of a given stack or packet can have thicknesses and refractive index values corresponding to a ¼-wave stack, i.e., arranged in ORUs each having two adjacent microlayers of equal optical thickness, such ORU being effective to reflect by constructive interference light whose wavelength λ is twice the overall optical thickness (physical thickness multiplied by refractive index) of the optical repeat unit (primary reflection or first order harmonic). In the case of a reflective polarizer, the refractive index used in determining the optical thickness is the refractive index along the block axis of the reflective polarizer. A ¼-wave stack, in which the two adjacent microlayers in each ORU have equal optical thickness, is said to have an "f-ratio" of 0.5 or 50%. "F-ratio" in this regard refers to the ratio of the optical thickness of a constituent layer "A" to the optical thickness of the complete optical repeat unit, where the constituent layer "A" is assumed to have a higher refractive index than the constituent layer "B"; if the layer "B" has the higher refractive index, then the f-ratio is the ratio of the optical thickness of the constituent layer "B" to the optical thickness of the complete optical repeat unit. The use of a 50% f-ratio is often considered desirable because it maximizes the reflective power of the $1^{st}$ order (primary) reflection band of a stack of microlayers. However, a 50% f-ratio suppresses or eliminates the $2^{nd}$ order (second harmonic) reflection band (and higher even orders). This too is often considered desirable in many applications; however, as described further elsewhere herein, it may not be desirable to suppress the $2^{nd}$ order reflection band in some applications since a second harmonic of a primary reflection band can be utilized to provide additional flexibility in achieving a desired color output. For example, in some embodiments, a first order harmonic or primary reflection band is used to provide reflection in the red and near infrared and a second harmonic of this reflection band is used to provide reflection in the blue wavelength range. The relative reflective powers of a primary reflection band and of harmonics of the primary reflection band as a function of f-ratio is described in U.S. Pat. No. 9,279,921 (Kivel et al.), for example.

In some embodiments, the f-ratio is in a range of 0.05 to 0.4 or in a range of 0.6 to 0.95, for example. In other embodiments, the f-ratio is in a range of 0.4 to 0.6, for example. In the embodiment of FIG. 13, the "A" layers are depicted for generality as being thinner than the "B" layers. Each depicted optical repeat unit (ORU 1, ORU 2, etc.) has an optical thickness (OT1, OT2, etc.) equal to the sum of the optical thicknesses of its constituent "A" and "B" layer, and each optical repeat unit provides $1^{st}$ order reflection of light whose wavelength $\lambda$ is twice the overall optical thickness of the ORU.

To achieve a desired reflectivity with a reasonable number of layers, adjacent microlayers may exhibit a difference in refractive index ($|\Delta nx|$) for light polarized along he x-axis of at least 0.05, or at least 0.1, or at least 0.15, for example. Adjacent microlayers may exhibit a smaller difference in refractive index ($|\Delta ny|$) for light polarized along the y-axis. For example, in some embodiments, $|\Delta ny|$ is no more than 0.04, or no more than 0.02, or no more than 0.01. In some embodiments, the adjacent microlayers may exhibit a refractive index match or mismatch along the z-axis ($\Delta nz=0$ or $|\Delta nz|$ large), and the mismatch may be of the same or opposite polarity or sign as the in-plane refractive index mismatch(es). Whether the reflectivity of the p-polarized component of obliquely incident light increases, decreases, or remains the same with increasing incidence angle can be controlled by such tailoring of $\Delta nz$. The refractive indices and refractive index differences may be specified at a fixed reference wavelength (e.g., 532 nm or 633 nm) or may be specified for each optical repeat unit at the wavelength where the optical repeat unit is configured to reflect.

In some embodiments, the total number of optical repeat units in the optical stack is at least 25, or at least 30, or at least 35, or at least 40. In some embodiments, the total number of optical repeat units is no more than 300, or no more than 200, or no more than 180, or no more than 160, or no more than 150. A larger number of optical repeat units may be used in embodiments with a smaller (or closer to unity) f-ratio, and a smaller number of optical repeat units may be used in embodiments with an f-ratio near 0.5.

At least some of the microlayers in at least one packet of the multilayer optical films may be birefringent, e.g., uniaxially birefringent. In some cases, each ORU may include one birefringent microlayer, and a second microlayer that is either isotropic or that has a small amount of birefringence relative to the other microlayer. In alternative cases, each ORU may include two birefringent microlayers.

The multilayer optical films can be made using any suitable light-transmissive materials, but in many cases it is beneficial to use low absorption polymer materials. With such materials, absorption of a microlayer stack over visible and infrared wavelengths can be made small or negligible, such that the sum of reflection and transmission for the stack (or an optical film of which it is a part), at any given wavelength and for any specified angle of incidence and polarization state, is approximately 100%, i.e., R+T≈100%, or R≈100%−T.

Suitable materials for the alternating interference layers include, for example, polyethylene naphthalate (PEN), copolymers containing PEN and polyesters (e.g., polyethylene terephthalate (PET) or dibenzoic acid), glycol modified polyethylene terephthalate, polycarbonate (PC), or blends of these classes of materials.

Exemplary multilayer optical films are composed of polymer materials and may be fabricated using coextruding, casting, and orienting processes. Reference is made to U.S. Pat. No. 5,882,774 (Jonza et al.) "Optical Film", U.S. Pat. No. 6,179,948 (Merrill et al.) "Optical Film and Process for Manufacture Thereof", U.S. Pat. No. 6,783,349 (Neavin et al.) "Apparatus for Making Multilayer Optical Films", and patent application publication US 2011/0272849 (Neavin et al.) "Feedblock for Manufacturing Multilayer Polymeric Films". The multilayer optical film may be formed by coextrusion of the polymers as described in any of the aforementioned references. The polymers of the various layers may be chosen to have similar rheological properties, e.g., melt viscosities, so that they can be co-extruded without significant flow disturbances. Extrusion conditions are chosen to adequately feed, melt, mix, and pump the respective polymers as feed streams or melt streams in a continuous and stable manner Temperatures used to form and maintain each of the melt streams may be chosen to be within a range that avoids freezing, crystallization, or unduly high pressure drops at the low end of the temperature range, and that avoids material degradation at the high end of the range.

In brief summary, the fabrication method can include: (a) providing at least a first and a second stream of resin corresponding to the first and second polymers to be used in the finished film; (b) dividing the first and the second streams into a plurality of layers using a suitable feedblock, such as one that includes: (i) a gradient plate comprising first and second flow channels, where the first channel has a cross-sectional area that changes from a first position to a second position along the flow channel, (ii) a feeder tube plate having a first plurality of conduits in fluid communication with the first flow channel and a second plurality of conduits in fluid communication with the second flow channel, each conduit feeding its own respective slot die, each conduit having a first end and a second end, the first end of the conduits being in fluid communication with the flow channels, and the second end of the conduits being in fluid communication with the slot die, and (iii) optionally, an axial rod heater located proximal to said conduits; (c) passing the composite stream through an extrusion die to form a multilayer web in which each layer is generally parallel to the major surface of adjacent layers; and (d) casting the multilayer web onto a chill roll, sometimes referred to as a casting wheel or casting drum, to form a cast multilayer film. This cast film may have the same number of layers as the finished film, but the layers of the cast film are typically much thicker than those of the finished film. Furthermore, the layers of the cast film are typically all isotropic. A multilayer optical film with controlled low frequency variations in reflectivity and transmission over a wide wavelength range can be achieved by the thermal zone control of the axial rod heater, see e.g., U.S. Pat. No. 6,783,349 (Neavin et al.).

After the multilayer web is cooled on the chill roll, it can be drawn or stretched to produce a finished or near-finished multilayer optical film. The drawing or stretching accomplishes two goals: it thins the layers to their desired final thicknesses, and it may orient the layers such that at least some of the layers become birefringent. The orientation or stretching can be accomplished along the cross-web direction (e.g., via a tenter), along the down-web direction (e.g., via a length orienter), or any combination thereof, whether simultaneously or sequentially. If stretched along only one direction, the stretch can be "unconstrained" (wherein the film is allowed to dimensionally relax in the in-plane direction perpendicular to the stretch direction) or "constrained" (wherein the film is constrained and thus not allowed to dimensionally relax in the in-plane direction perpendicular to the stretch direction). The stretch can be asymmetric between orthogonal in-plane directions so that the resulting film will have a polarization dependent reflectivity. In some embodiments, the film may be stretched in a batch process. In any case, subsequent or concurrent draw reduction, stress or strain equilibration, heat setting, and other processing operations can also be applied to the film.

The film may be formed by coextruding one or more sets of films composed of large numbers of microlayers to constitute what is commonly called a packet of typically alternating isotropic and birefringent layers. The packets are typically formed in roll processes wherein the cross-web dimension is commonly labelled transverse direction (TD) and the dimension along the length of the roll is called machine direction (MD). Furthermore, the packets may be carefully stretched in the forming process in machine direction and transverse direction in carefully controlled temperature zones to affect the birefringent layers in what is commonly referred to as a tentering process. Furthermore, the tentering processes may provide either linear transverse stretch or parabolic stretch of the packets as they are formed. A controlled inward linear retraction commonly referred to as "toe-in" may be used to allow for controlled shrinkage during the cool down zone. The process can be used to provide 30 to 600 layers, for example, or more for desired optical effects and may also include external "skin" layers as needed.

In some embodiments, the plurality of alternating polymeric interference layers includes alternating first and second polymeric layers, where the first polymeric layers are substantially uniaxially oriented which can be understood to mean that the refractive index in a first in-plane direction and the thickness direction are within 0.02 of each other and an absolute difference of the refractive index in an orthogonal second in-plane direction and the first in-plane direction is at least 0.05. In some embodiments, the second polymeric layers are substantially isotopic. Substantially isotropic can be understood to mean that the refractive index in each of 3 mutually orthogonal directions are within 0.02 of each other. In some embodiments, the reflective polarizer has at least one layer having indices of refraction in a length direction and a thickness direction that are substantially the same (e.g., within 0.02 or within 0.01), but substantially different from an index of refraction in a width direction (e.g., difference of at least 0.05, or at least 0.1 or at least 0.15). In some embodiments, the reflective polarizer is a substantially uniaxially drawn film and has a degree of uniaxial character U of at least 0.7, or at least 0.8, or at least 0.85, where $U=(1/MDDR-1)/(TDDR^{1/2}-1)$ with MDDR defined as the machine direction draw ratio and TDDR defined as the transverse direction draw ratio. Such substantially uniaxially oriented multilayer optical films are described in U.S. Pat. Appl. No. 2010/0254002 (Merrill et al.) and can be obtained by using a parabolic tenter to orient the multilayer film.

In some embodiments, the optical repeat units have an optical thickness that varies substantially continuously over each optical thickness range providing a reflection band. The thickness variation may be chosen to provide sharpened band edges as described in U.S. Pat. No. 6,157,490 (Wheatley et al.), for example, or may be chosen to provide a more gradual transition from high to low reflectivity.

FIGS. 14-17 are schematic plots of layer thickness profiles in reflective polarizers. The thickness of the optical repeat units (ORU) is plotted versus the ORU number. In some embodiments, the reflective polarizer includes mutually disjoint first, second, and third pluralities of alternating interference layers, where the first plurality of alternating interference layers provides the first reflection band, the second plurality of alternating interference layers provides the second reflection band, the third plurality of alternating interference layers provides the third reflection band. In some embodiments, the reflective polarizer includes a plurality of alternating polymeric interference layers including outermost first and second interference layers, where the plurality of alternating polymeric interference layers includes the mutually disjoint first, second, and third pluralities of alternating interference layers. First, second, and third pluralities of alternating interference layers are disjoint or mutually disjoint when no layer of one of the first, second, and third pluralities of alternating interference layers is also a layer on another one of the first, second, and third pluralities of alternating interference layers.

Figure 14:
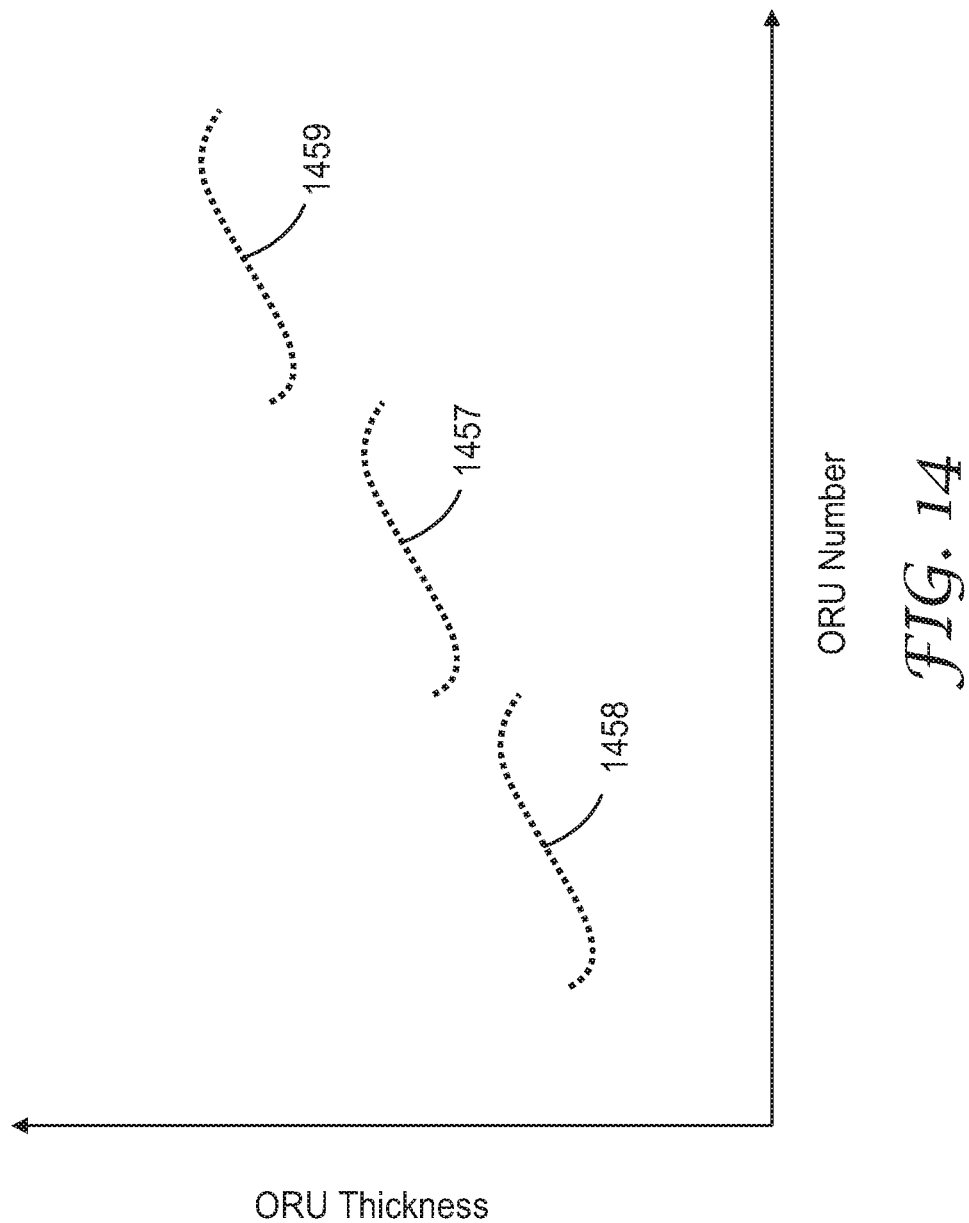
FIGS. 14-17 are schematic plots of layer thickness profiles in reflective polarizers.

In FIG. 14, first, second, and third pluralities of alternating interference layers 1457, 1458, and 1459, respectively, are illustrated. The first plurality of alternating interference layers 1457 is disposed between the second and third pluralities of alternating interference layers 1458 and 1459. In FIG. 14, the thinner layers (e.g., reflecting blue) are disposed at one side of the reflective polarizer, the thicker layers (e.g., reflecting red) are disposed on an opposite side of the reflective polarizer, and the intermediate thickness layers (e.g., reflecting green) are disposed near the center of the reflective polarizer. This may be preferred in some embodiments for ease of manufacture, for example. In other embodiments, it may be preferred to have the intermediate thickness layers closest to one side of the reflective polarizer as this allows the layers reflecting the most photopicically important wavelengths to be closest to the display panel.

Figure 15:
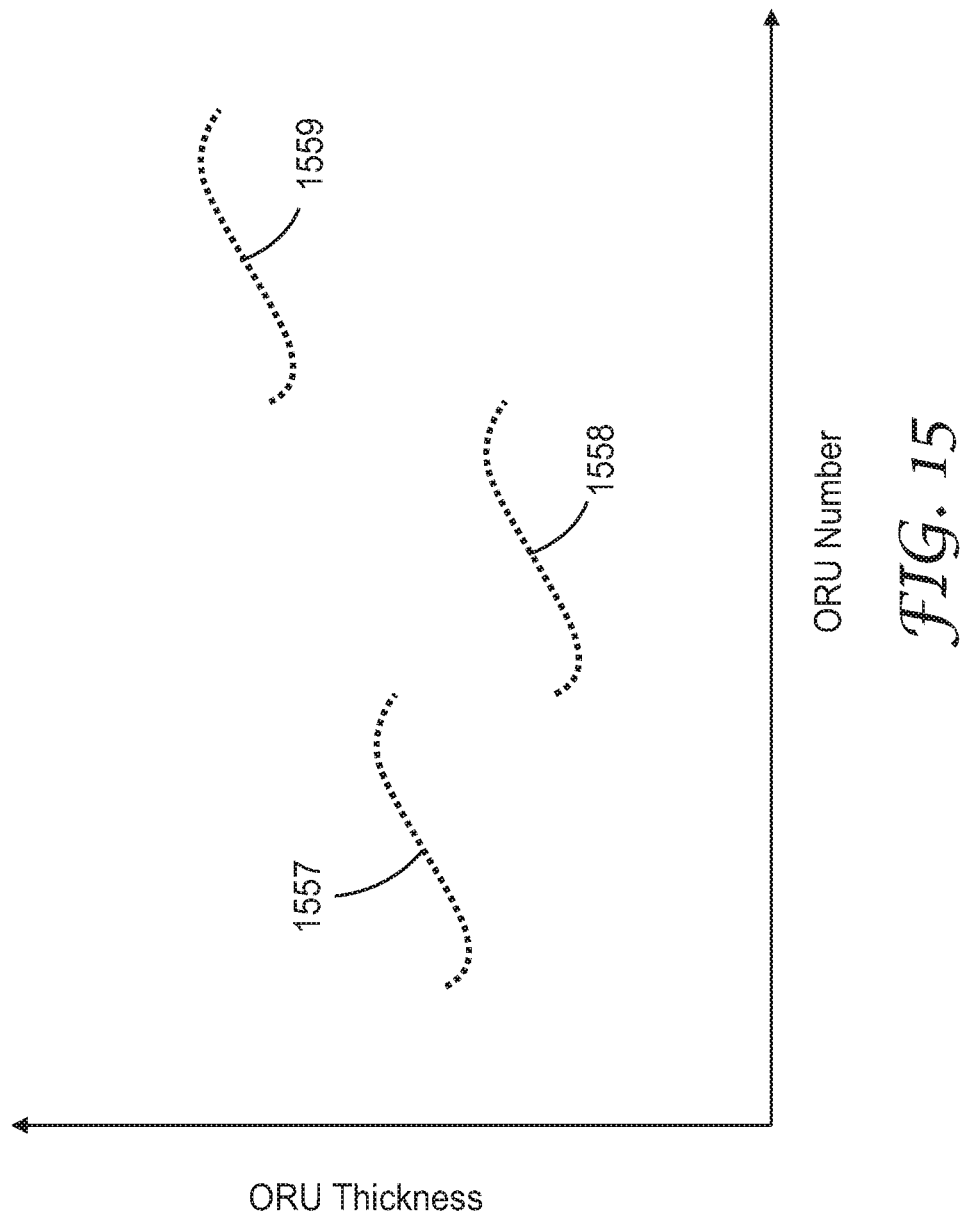
Figure 16:
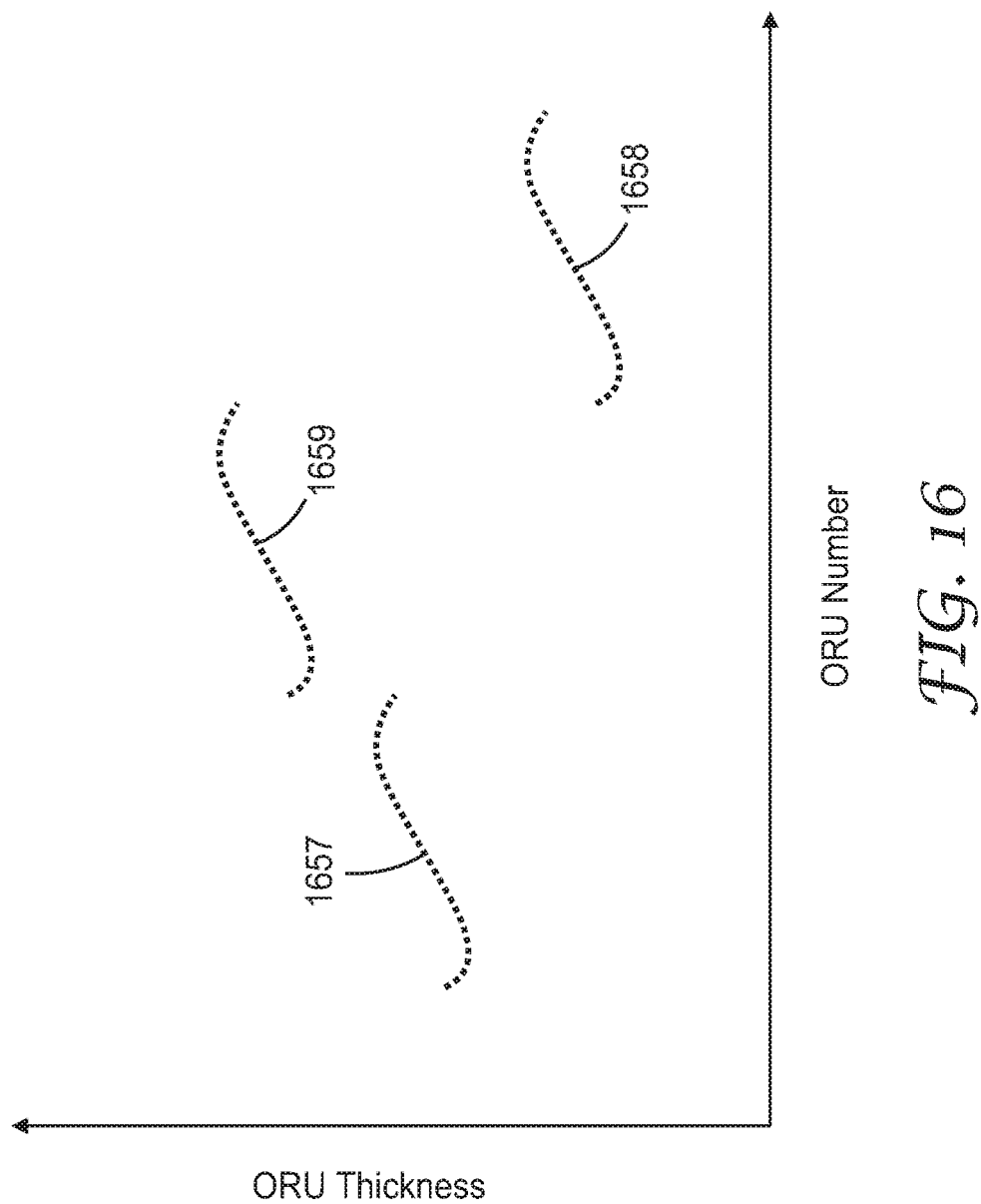

In FIG. 15, first, second, and third pluralities of alternating interference layers 1557, 1558, and 1559, respectively, are shown. The second plurality of alternating interference layers 1558 is disposed between the first and third pluralities of alternating interference layers 1557 and 1559. The first plurality of alternating interference layers 1557 includes an outermost interference layer (e.g., an outermost first interference layer) of the reflective polarizer and the third plurality of alternating interference layers 1559 includes an outermost interference layer (e.g., an outermost second interference layer) of the reflective polarizer. In FIG. 16, first, second, and third pluralities of alternating interference layers 1657, 1658, and 1659, respectively, are shown. The third plurality of alternating interference layers 1658 is disposed between the first and third pluralities of alternating interference layers 1657 and 1659. The first plurality of alternating interference layers 1657 includes an outermost interference layer (e.g., the outermost first interference layer) of the reflective polarizer and the second plurality of alternating interference layers 1658 includes an outermost interference layer (e.g., the outermost second interference layer) of the reflective polarizer.

In some embodiments, a circular polarizer includes a retarder, an absorbing polarizer and the reflective polarizer disposed between the retarder and the absorbing polarizer. In some embodiments, the first plurality of alternating interference layers (e.g., 1557 or 1657) includes the outermost first interference layer, where the outermost first interference layer faces the retarder. In some embodiments, the first plurality of alternating interference layers (e.g., 1557 or 1657) is disposed closer to the display panel than the second plurality of alternating interference layers (e.g., 1558 or 1658), and/or the first plurality of alternating interference layers (e.g., 1557 or 1657) is disposed closer to the display panel than the third plurality of alternating interference layers (e.g., 1559 or 1659).

In some embodiments, each of the first, second, and third reflection bands is a primary reflection band which may also be referred to as a first order harmonic reflection band. For example, the first, second, and third pluralities of alternating interference layers of each of FIGS. 14-16 may produce substantially non-overlapping first, second, and third reflection bands, where each of the first, second, and third reflection bands is a first order harmonic reflection band. For example, the reflection bands depicted in FIGS. 4A-4B and 5-11 may, in some embodiments, be first order harmonic reflection bands or primary reflection bands.

Figure 17:
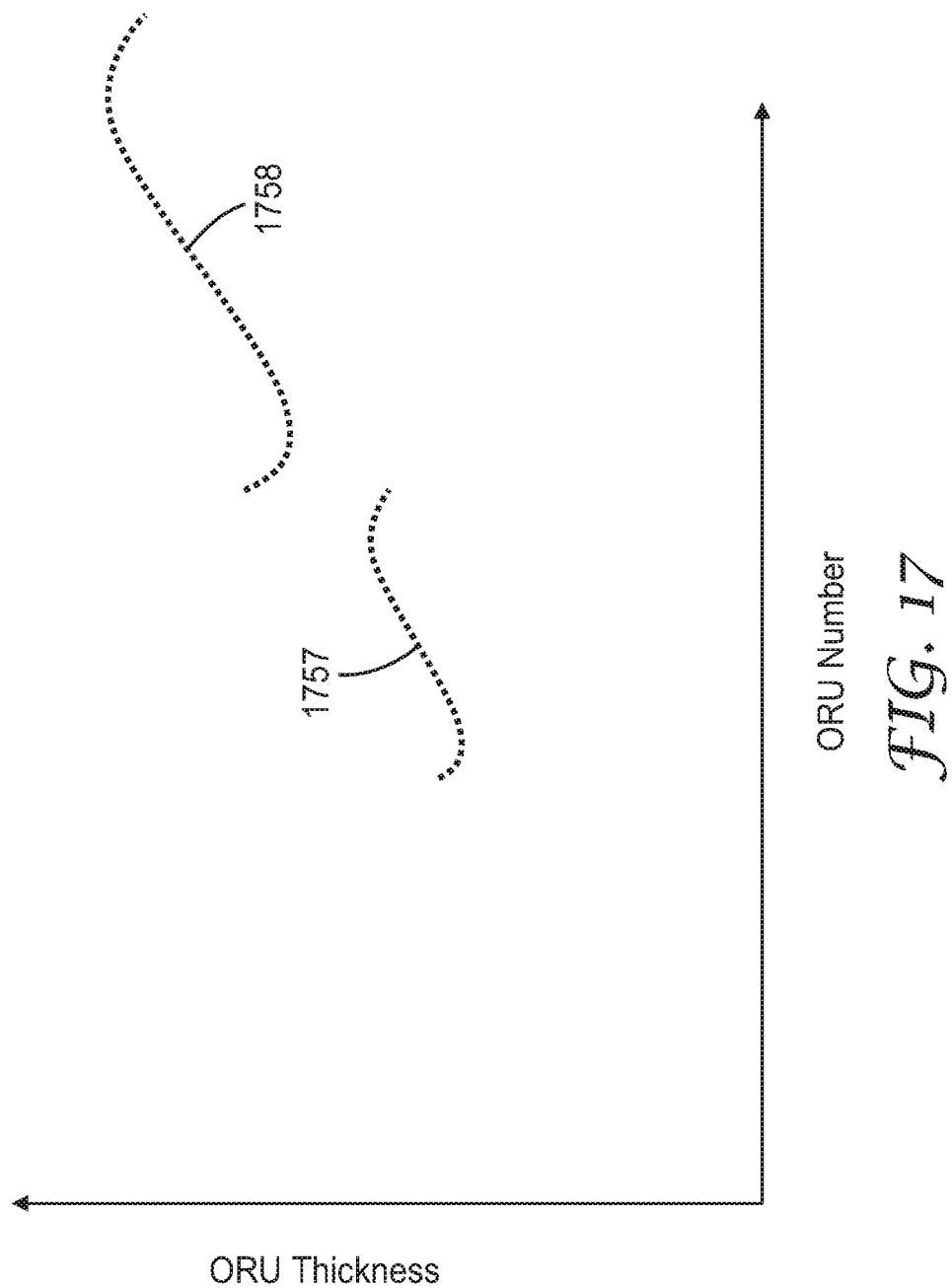

In other embodiments, a first order harmonic reflection band may be used for each of the first and third reflection bands, and the second reflection band may be a second order harmonic of the third reflection band. FIG. 17 is a schematic plot of a layer thickness profile of a reflective polarizer having substantially non-overlapping first, second, and third reflection bands. The reflective polarizer includes disjoint first and second pluralities of alternating interference layers 1757 and 1758, where the first plurality of alternating interference layers 1757 provides the first reflection band, the second plurality of alternating interference layers 1758 provides the second and third reflection bands. The first and third reflection bands are primary reflection bands, and the second reflection band is a second order harmonic of the third reflection band. For example, the reflectance schematically illustrated in FIG. 10 can be produced by a reflective polarizer having the layer thickness profile schematically illustrated in FIG. 17. The first and third reflection bands 1051 and 1055 may be primary or first order harmonic reflection bands, and the second reflection band 1053 may be a second order harmonic of the third reflection band 1055.

Figure 18:
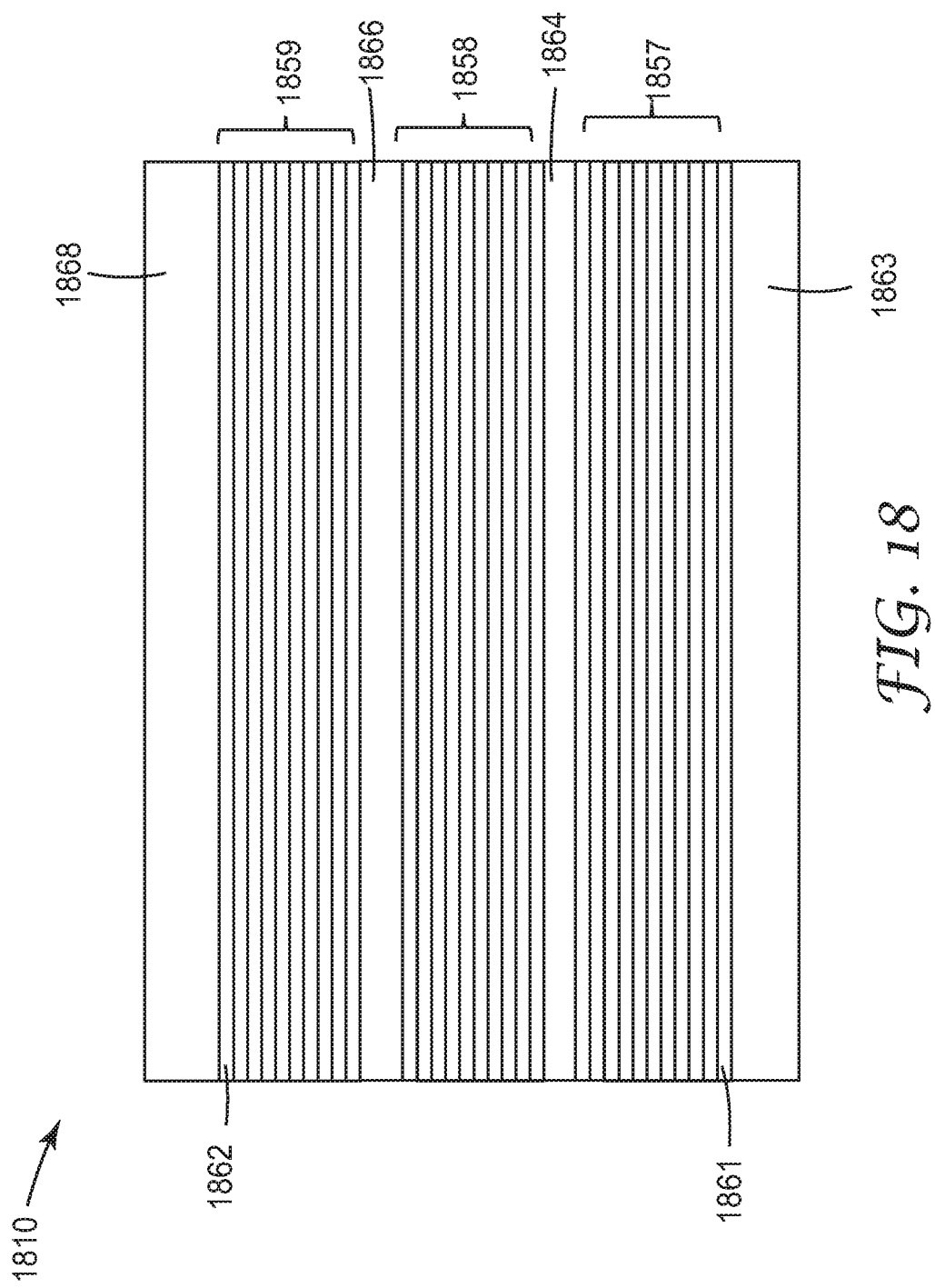
FIG. 18 is a schematic cross-sectional view of a reflective polarizer.

FIG. 18 is a schematic cross-sectional view of a reflective polarizer 1810 including a plurality of alternating polymeric interference layers including outermost first and second interference layers 1861 and 1862 which are outermost (closest to an outermost major surface) interference layers of the reflective polarizer 1810. Optional outermost protective boundary layers 1863 and 1868 are included in the illustrated embodiment. The optional outermost protective boundary layers 1863 and 1868 are not interference layers since the layers are too thick to significantly contribute to constructive and destructive interference in the visible wavelength range. Typically, such non-interference layers have an optical thickness greater than 1 micrometer and/or a thickness greater than 2 micrometers. In some embodiments, each layer in the reflective polarizer 1810 disposed between the outermost first and second interference layers 1861 and 1862 have a thickness less than 1 micrometer, or less than 500 nm, or less than 300 nm, or less than 200 nm. The outermost first and second interference layers 1861 and 1862 may also each have a thickness in these ranges (e.g., less than 300 nm or less than 200 nm).

The plurality of alternating polymeric interference layers includes mutually disjoint first, second, and third pluralities of alternating interference layers 1857, 1858, and 1859. In some embodiments, the plurality of alternating polymeric interference layers has substantially non-overlapping first, second, and third reflection bands, where each of the first, second, and third reflection bands are first order harmonic reflection bands. In some embodiments, the first plurality of alternating interference layers 1857 provide the first reflection band, the second plurality of alternating interference layers 1858 provide the second reflection band, and the third plurality of alternating interference layers 1859 provide the third reflection band. The first, second, and third pluralities of alternating interference layers 1857, 1858, and 1859 may be arranged in other orders. For example, the first plurality of alternating interference layers 1857 may be disposed between the second and third pluralities of alternating interference layers 1858 and 1859. In some embodiments, a circular polarizer includes the reflective polarizer 1810 disposed between an absorbing polarizer and a retarder. In some embodiments, the first plurality of alternating interference layers 1857, which may reflect green wavelengths, for example, include the outermost first interference layer 1861, where the outermost first interference layer 1861 faces the retarder. In some embodiments, a display includes the reflective polarizer 1810 disposed to receive a light output of a display panel, (e.g., the imaged or spatially modulated light produced by a display panel for viewing by a viewer) and the outermost first interference layer 1861 faces the display panel.

In the illustrated embodiment, optional additional layers 1864 and 1866 are included between the first and second pluralities of alternating interference layers 1857 and 1858 and between the second and third pluralities of alternating interference layers 1858 and 1859. Such layers may arise from protective boundary layers included in packets of the first, second, and third pluralities of alternating interference layers 1857, 1858, and 1859. In some embodiments, each of the optional additional layers 1864 and 1866 have a thickness less than 1 micrometer, or less than 500 nm. In comparison, protective boundary layers traditionally have a thickness of 2-3 micrometers. Thinner additional layers 1864 and 1866 may be used to reduce the thickness of the reflective polarizer. In some embodiments, the optional additional layers 1864 and 1866 are omitted. For example, the first, second, and third pluralities of alternating interference layers 1857, 1858, and 1859 may be formed as a single packet of contiguous interference layers. In some such embodiments, or in other embodiments, each layer in the reflective polarizer 1810 disposed between the outermost first and second interference layers 1861 and 1862 may have a thickness less than 300 nm, or less than 200 nm. In some cases, it is preferred to use a single packet omitting the optional additional layers 1864 and 1866 in order to reduce the thickness of the reflective polarizer 1800 (e.g., to less than 80 micrometers, or less than 60 micrometers, or less than 50 micrometers) so that each of the first, second, and third pluralities of alternating interference layers 1857, 1858, and 1859 can be placed at close to a same distance from the display panel. In other cases, including the optional additional layers 1864 and 1866 may be preferred for manufacturing flexibility, for example. In such cases, the additional layers 1864 and 1866 are preferably thin (e.g., thickness less than 1 micrometer, or less than 500 nm, or in a range of 300 nm to 500 nm or to 1 micrometer).

In some embodiments, a circular polarizer includes the reflective polarizer disposed between an absorbing polarizer and a retarder. The circular polarizer may be an integral optical stack. An integral optical stack is a stack of optical layers where each layer in the optical stack is bonded to another layer in the optical stack. In some embodiments, the retarder is coated directly on a major surface of the reflective polarizer, which may be an integrally formed reflective polarizer, and the absorbing polarizer is bonded to the reflective polarizer on an opposite major surface of the reflective polarizer through an optically clear adhesive (e.g., an adhesive having a haze as determined by the ASTM D1003-13 standard, for example, of less than 5%, or less than 2%, and a luminous transmittance as determined by the ASTM D1003-13 standard, for example, of at least 80% or at least 90%).

In some embodiments, the reflective polarizer is integrally formed. As used herein, a first element "integrally formed" with a second element means that the first and second elements are manufactured together rather than manufactured separately and then subsequently joined. Integrally formed includes manufacturing a first element followed by manufacturing the second element on the first element. An optical film (e.g., reflective polarizer) including a plurality of layers is integrally formed if the layers are manufactured together (e.g., combined as melt streams and then cast onto a chill roll to form a cast film having each of the layers, and then orienting the cast film) rather than manufactured separately and then subsequently joined. An additional layer not integral with the integrally formed multilayer optical film means that the additional layer is not integrally formed with the multilayer optical film. For example, the additional layer may be formed separately and then subsequently adhered (e.g., laminated using an optically clear adhesive) to the multilayer optical film.

In some embodiments, the reflective polarizer or circular polarizer is substantially planar. In other embodiments, the reflective polarizer or circular polarizer is curved to conform to a shape of an output surface of a curved display panel. In some embodiments, the reflective polarizer or circular polarizer substantially conforms to an output surface of a display panel whether substantially planar or curved.

Figure 19:
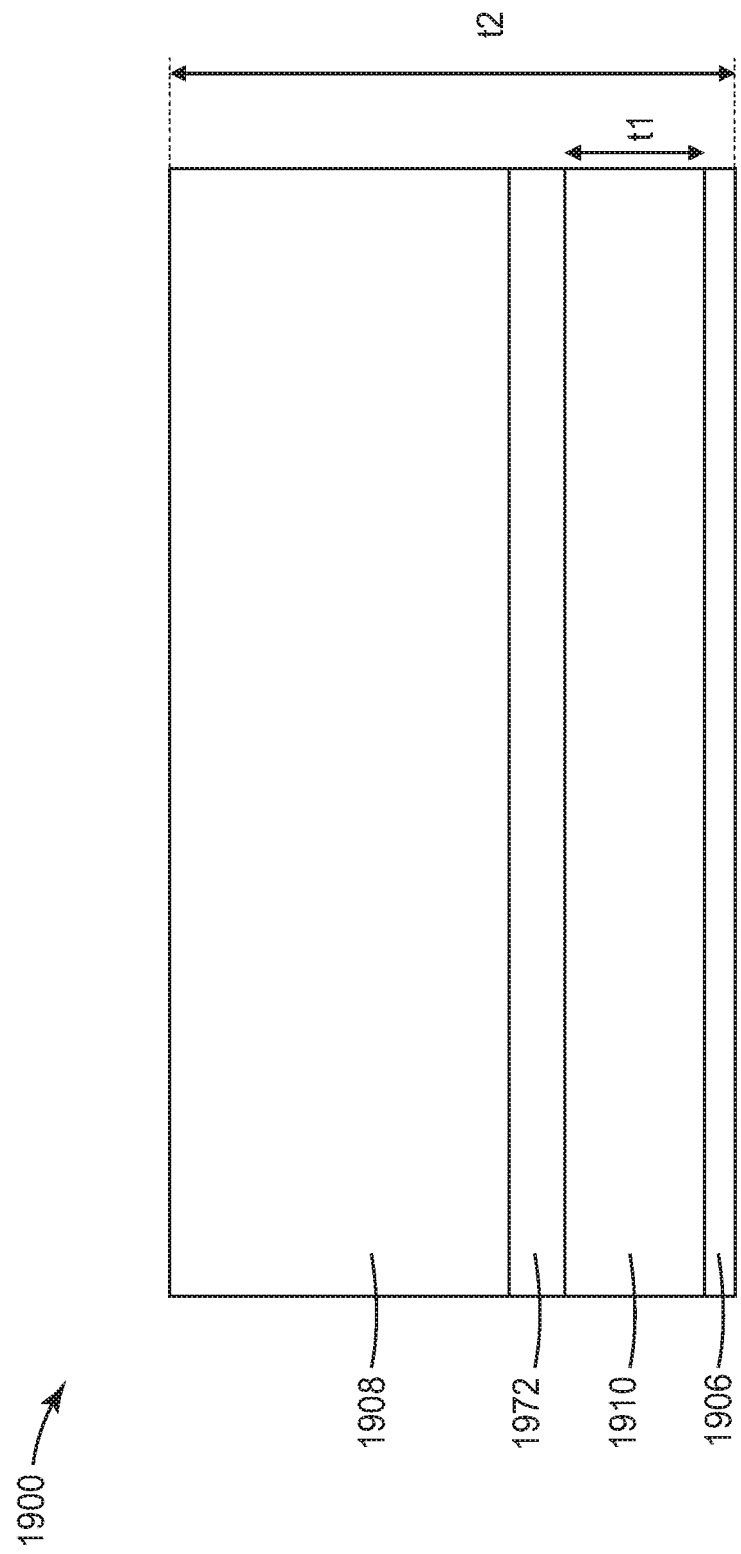
FIGS. 19-20 are schematic cross-sectional views of circular polarizers.

FIG. 19 is a schematic cross-sectional view of a circular polarizer 1900 including a retarder 1906, an absorbing polarizer 1908, and a reflective polarizer 1910 disposed between the retarder 1906 and the absorbing polarizer 1908. The reflective polarizer 1910 may be any of the reflective polarizers of the present description. In some embodiments, the reflective polarizer 1910 has a pass axis substantially aligned with a pass axis of the absorbing polarizer 1908 as described further elsewhere herein. In some embodiments, the retarder 1906 is a quarter-wave retarder at one or more wavelengths in the visible range (400 nm to 700 nm) and has a fast axis substantially aligned at 45 degrees to the pass axis of the reflective polarizer 1910. In this context, substantially aligned can be understood to mean aligned to within 20 degrees. In the illustrated embodiment, an optically clear adhesive layer 1972 bonds the absorbing polarizer 1908 and the reflective polarizer 1910 together. In other embodiments, an absorbing polarizer layer may be coated onto the reflective polarizer prior to orienting the reflective polarizer and then the absorbing polarizer and the reflective polarizer are oriented in a same process step. In this case, the adhesive layer 1972 may be omitted and the reflective polarizer 1910 and the absorbing polarizer 1908 may be directly bonded to each other. In the illustrated embodiment, the retarder 1906 is disposed directly on the reflective polarizer 1910. For example, the retarder 1906 can be formed from a coating applied to the reflective polarizer 1910. In other embodiments, the retarder 1906 is formed separately and then adhered to the reflective polarizer through an optically clear adhesive layer. In other embodiments, additional layers, such as a diffuser layer, are included.

In some cases, the luminance exhibits variation with view angle that results from the walk-off distance varying from regions with relatively low and relatively high reflectivity as the view angle varies. This "luminance ripple" can be reduced or substantially eliminated by incorporating a diffuser between the reflective polarizer and the display panel (e.g., in the circular polarizer between the reflective polarizer and the retarder), for example.

Figure 20:
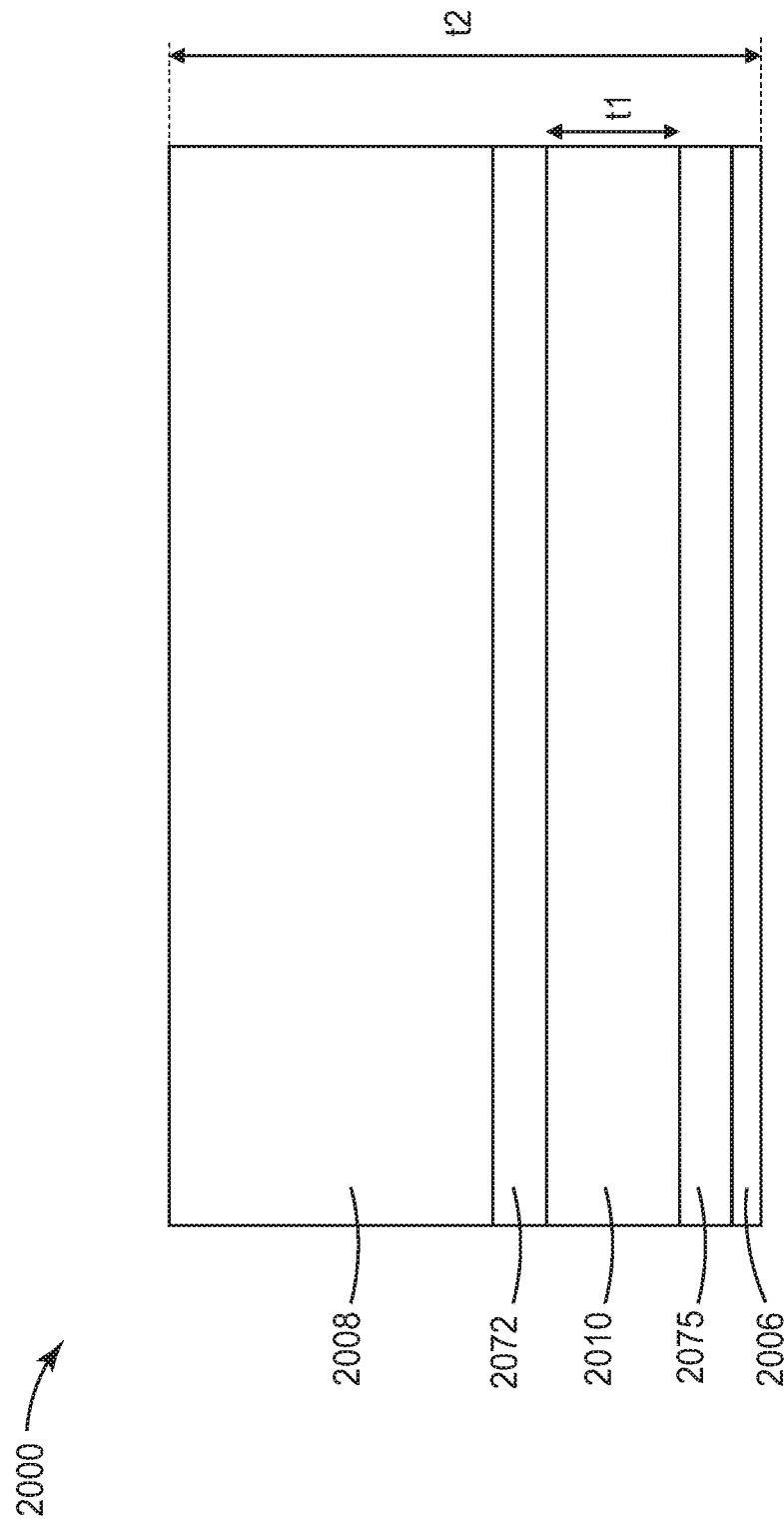

FIG. 20 is a schematic cross-sectional view of a circular polarizer 2000 including a retarder 2006, which may be a quarter-wave retarder as described further elsewhere herein, an absorbing polarizer 2008, and a reflective polarizer 2010 disposed between the retarder 2006 and the absorbing polarizer 2008, and a diffuser 2075 disposed between the reflective polarizer 2010 and the retarder 2006. The reflective polarizer 2010 may be any of the reflective polarizers of the present description and may be aligned with the absorbing polarizer 2008 and the retarder 2006 as described elsewhere herein (e.g., as described for circular polarizer 1900). An optically clear adhesive layer 2072 bonds the absorbing polarizer 2008 and the reflective polarizer 2010 together. The diffuser 2075 may be a beaded diffuser (e.g., particles in an adhesive layer), for example, and/or may be a layer with an optically diffusing microstructured surface, for example. The circular polarizer 2000 may be disposed in a display such that the diffuser 2075 is disposed between the reflective polarizer 2010 and the display panel. In other embodiments, a display may include a circular polarizer without a diffuser and the display may include a diffuser disposed between the reflective polarizer and the display panel at some other location. For example, an adhesive including diffusing particles may be used to attach a circular polarizer to the display panel.

In some embodiments, the circular polarizer 1900 and/or the circular polarizer 2100 is an integral optical stack where each layer in the optical stack is bonded to another layer in the optical stack.

In some embodiments, the reflective polarizer (e.g., reflective polarizer 1910 or reflective polarizer 2010 or any reflective polarizer described elsewhere herein) has a thickness t1 in a range of 10 micrometers to 80 micrometers. In some embodiments, the thickness t1 is less than 60 micrometers or less than 50 micrometers. In some embodiments, the circular polarizer (e.g., circular polarizer 1900 or circular polarizer 2000 or any circular polarizer described elsewhere herein) has a thickness in a range of 30 micrometers to 500 micrometers, or in a range of 50 micrometers to 400 micrometers.

In some embodiments, the absorbing polarizer has an average transmittance in a range of 40% to 60%, or in a range of 44% to 60%, for normally incident unpolarized light in a wavelength range of 450 nm to 650 nm.

In some embodiments, a circular polarizer (e.g., circular polarizer 1900 or 2000) includes a retarder; an absorbing polarizer having an absorption band extending throughout a visible range of 400 nm to 700 nm; and a reflective polarizer disposed between the retarder and the absorbing polarizer and having a pass axis substantially aligned with a pass axis of the absorbing polarizer, where the reflective polarizer includes a plurality of alternating polymeric interference layers and has a reflection band and at least one transmission band in a block polarization state. In some embodiments, at normal incidence, the at least one transmission band has a total width in the visible range of at least 150 nm. For example, the at least one transmission band may extend from 400 nm to λ1S and from λ1L to 700 nm, referring to FIG. 6, where λ1S−400 nm+700 nm−λ1L is at least 150 nm. In some embodiments, at normal incidence, the reflection band 651 has a long wavelength band edge wavelength λ1L in a range of 440 nm or 460 nm to 550 nm or to 520 nm and a short wavelength band edge wavelength λ1S less than 420 nm or less than 410 nm or less than 400 nm. In some embodiments, at normal incidence the reflection band 651 has a long wavelength band edge wavelength λ1L of about 500 nm (e.g., within 5% or 500 nm) and a short wavelength band edge wavelength λ1L less than 420 nm or less than 410 nm or less than 400 nm. In some embodiments, at normal incidence, the reflection band 651 extends at least from 440 nm to 480 nm and the at least one transmission band extends at least from 530 nm to 680 nm. In some embodiments, at normal incidence, the reflection band 651 extends at least from 520 nm to 590 nm and the at least one transmission band extends at least from 400 nm to 490 nm and at least from 620 nm to 700 nm. In some embodiments, at normal incidence, the reflection band 651 extends at least from 600 nm to 660 nm and the at least one transmission band extends at least from 400 nm to 560 nm.

In some embodiments, the circular polarizer is adapted to recycle primarily blue wavelengths and so the reflective polarizer has a reflection band in the blue (e.g., the reflection band 651 may have a long wavelength band edge wavelength λ1L in a range of 440 nm to 520 nm and a short wavelength band edge wavelength λ1S less than 420 nm). Recycling in the blue may be advantageous since the blue emitters of OLED devices are typically less efficient and/or have shorter lifetimes than other emitters, and recycling primarily only in the blue reduces the overall level of ambient light reflection compared to using a reflective polarizer to recycle in the full visible spectrum, for example.

Figure 21:
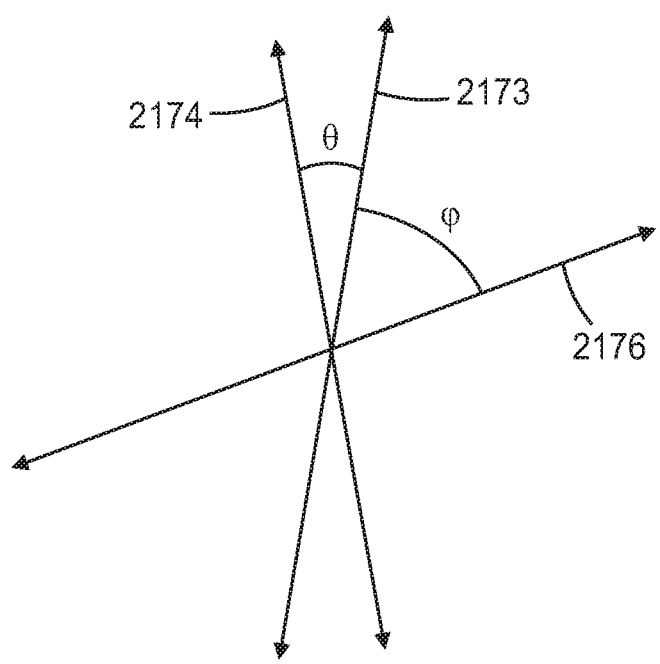
FIG. 21 is a schematic illustration of a pass axis of a reflective polarizer, a pass axis of a linear absorbing polarizer, and a fast axis of a retarder.

FIG. 21 is a schematic illustration of a pass axis 2173 of a reflective polarizer and a pass axis 2174 of a linear absorbing polarizer. An angle θ between the pass axis 2173 and the pass axis 2174 is illustrated. If the angle θ is no more than 20 degrees, the pass axis 2173 may be described as substantially aligned with the pass axis 2174. In some embodiments, the angle θ is less than 10 degrees, or less than 5 degrees. A fast axis 2176 of a retarder is also illustrated. The fast axis 2176 makes an oblique angle φ with the pass axis 2173 of the reflective polarizer. In some embodiments, the oblique angle φ is in a range of 30 to 60 degrees, or in a range of 40 to 50 degrees. In some embodiments, φ is about 45 degrees (e.g., in a range of 42 or 43 degrees to 47 or 48 degrees). In some embodiments, a retarder includes a plurality of retarder layers. For example, in some embodiments a half-wave retarder layer may be combined with a quarter-wave retarder layer to provide the retarder. A combination or retarder layers may be used to provide an achromatic retarder, for example. The fast axis of the half-wave retarder layer and the quarter-wave retarder layer may be oriented at different angles relative to the pass axis 2173. For example, the fast axis of the half-wave retarder layer may be at about 75 degrees to the pass axis 2173 and the fast axis of the quarter-wave retarder layer may be at about 45 degrees to the pass axis 2173.

The following is a list of exemplary embodiments of the present description.

Embodiment 1 is a display comprising:
a display panel comprising a plurality of pixels, each pixel comprising a plurality of subpixels;
a reflective polarizer disposed to receive a light output of the display panel, the reflective polarizer having a first reflection band,
wherein at normal incidence, the first reflection band has a long wavelength band edge wavelength between peak emission wavelengths of two subpixels in the plurality of subpixels.

Embodiment 2 is the display of Embodiment 1, wherein at an angle of incidence of 45 degrees, the first reflection band has a long wavelength band edge wavelength less than the peak emission wavelengths of each of the two subpixels.

Embodiment 3 is the display of Embodiment 1 or 2, wherein the two subpixels comprise a green subpixel and a red subpixel.

Embodiment 4 is the display of Embodiment 1 or 2, wherein the two subpixels comprise a blue subpixel and a green subpixel.

Embodiment 5 is the display of any one of Embodiments 1 to 4, wherein the plurality of subpixels comprises at least 3 subpixels.

Embodiment 6 is the display of any one of Embodiments 1 to 5, wherein the plurality of subpixels comprises at least 4 subpixels.

Embodiment 7 is the display of any one of Embodiments 1 to 6, wherein the plurality of pixels comprises a red subpixel, a green subpixel, and a blue subpixel.

Embodiment 8 is the display of Embodiment 7, wherein at normal incidence, the long wavelength band edge wavelength of the first reflection band is between peak emission wavelengths of the blue and the green subpixels.

Embodiment 9 is the display of Embodiment 7, wherein at normal incidence, the long wavelength band edge wavelength of the first reflection band is between peak emission wavelengths of the green and the red subpixels.

Embodiment 10 is the display of Embodiment 9, wherein the reflective polarizer has a second reflection band, and wherein at normal incidence, the second reflection band has a long wavelength band edge wavelength between peak emission wavelengths of the blue and green subpixels.

Embodiment 11 is the display of any one of Embodiments 7 to 10, wherein the reflective polarizer has a third reflection band, wherein at normal incidence, the third reflection band has a short wavelength band edge wavelength greater than the long wavelength band edge wavelength of the first reflection band and less than a peak emission wavelength of the red subpixel.

Embodiment 12 is the display of any one of Embodiments 1 to 11, further comprising a diffuser disposed between the reflective polarizer and the display panel.

Embodiment 13 is the display of any one of Embodiments 1 to 12, wherein the plurality of pixels comprises a red subpixel, a green subpixel, a blue subpixel, and a white subpixel.

Embodiment 14 is the display of any one of Embodiments 1 to 13, wherein each pixel further comprises a black matrix adjacent the plurality of subpixels.

Embodiment 15 is the display of any one of Embodiments 1 to 14, wherein the reflective polarizer has a thickness in a range of 10 micrometers to 80 micrometers.

Embodiment 16 is the display of any one of Embodiments 1 to 15, wherein the reflective polarizer comprises a plurality of alternating polymeric interference layers comprising alternating first and second polymeric layers, the first polymeric layers being substantially uniaxially oriented.

Embodiment 17 is the display of any one of Embodiments 1 to 16, wherein a circular polarizer comprises the reflective polarizer disposed between an absorbing polarizer and a retarder.

Embodiment 18 is a display comprising:
- a display panel comprising a plurality of pixels, each pixel comprising first, second, and third subpixels, the first subpixel having a first peak emission wavelength, the second subpixel having a second peak emission wavelength less than the first peak emission wavelength, the third subpixel having a third peak emission wavelength greater than the first peak emission wavelength;
- a circular polarizer disposed on the display panel, the circular polarizer comprising a retarder facing the display panel, an absorbing polarizer facing away from the display panel, and a reflective polarizer disposed between the retarder and the absorbing polarizer, the reflective polarizer having substantially non-overlapping first, second, and third reflection bands, wherein at normal incidence, the first reflection band comprises the first peak emission wavelength, the second reflection band comprises the second peak emission wavelength, and the third reflection band comprises the third peak emission wavelength.

Embodiment 19 is the display of Embodiment 18, wherein the reflective polarizer comprises mutually disjoint first, second, and third pluralities of alternating interference layers, the first plurality of alternating interference layers providing the first reflection band, the second plurality of alternating interference layers providing the second reflection band, the third plurality of alternating interference layers providing the third reflection band.

Embodiment 20 is the display of Embodiment 19, wherein the first plurality of alternating interference layers is disposed closer to the display panel than the first and third pluralities of alternating interference layers.

Embodiment 21 is the display of any one of Embodiments 18 to 20, wherein the each of the first, second, and third reflection bands is a primary reflection band.

Embodiment 22 is the display of Embodiment 18, wherein the reflective polarizer comprises disjoint first and second pluralities of alternating interference layers, the first plurality of alternating interference layers providing the first reflection band, the second plurality of alternating interference layers providing the second and third reflection bands, the first and third reflection bands being primary reflection bands, the second reflection band being a second order harmonic of the third reflection band.

Embodiment 23 is the display of Embodiment 22, wherein the first plurality of alternating interference layers is disposed closer to the display panel than the second plurality of alternating interference layers.

Embodiment 24 is the display of any one of Embodiments 18 to 23, wherein each pixel further comprises a fourth subpixel.

Embodiment 25 is the display of Embodiment 24, wherein the first subpixel is a green subpixel, the second subpixel is a blue subpixel, the third subpixel is a red subpixel, and the fourth subpixel is a white subpixel.

Embodiment 26 is the display of any one of Embodiments 11 or Embodiments 18 to 25, wherein at normal incidence, the third reflection band has a long wavelength band edge wavelength in a range of 700 nm to 2500 nm.

Embodiment 27 is the display of any one of Embodiments 11 or Embodiments 18 to 25, wherein at normal incidence, the third reflection band has a long wavelength band edge wavelength in a range of 750 nm to 900 nm.

Embodiment 28 is the display of any one of Embodiments 1 to 27, wherein the display panel comprises a color filter.

Embodiment 29 is the display of Embodiment 28, wherein a distance between the reflective polarizer and the plurality of pixels is no more than 1.2 times an average center to center distance between a white subpixel in a pixel and a green subpixel in the pixel.

Embodiment 30 is the display of Embodiment 28, wherein a distance between the reflective polarizer and the plurality of pixels is in a range of 0.8 to 1.2 times an average center to center distance between a white subpixel in a pixel and a green subpixel in the pixel.

Embodiment 31 is the display of Embodiment 28, wherein a distance between the reflective polarizer and the plurality of pixels is no more than 0.6 times an average center to center distance between a white subpixel in a pixel and a green subpixel in the pixel.

Embodiment 32 is the display of any one of Embodiments 1 to 27, wherein each pixel comprises a red subpixel comprising a red emissive material, a green subpixel comprising a green emissive material, and a blue subpixel comprising a blue emissive material.

Embodiment 33 is the display of Embodiment 32, wherein a distance between the reflective polarizer and the plurality of pixels is no more than 1.2 times an average center to center distance between adjacent subpixels.

Embodiment 34 is the display of Embodiment 32, wherein a distance between the reflective polarizer and the plurality of pixels is in a range of 0.8 to 1.2 times an average center to center distance between adjacent subpixels.

Embodiment 35 is the display of Embodiment 32, wherein a distance between the reflective polarizer and the plurality of pixels is no more than 0.6 times an average center to center distance between adjacent subpixels.

Embodiment 36 is the display of any one of Embodiments 1 to 35, wherein the display panel comprises an organic light emitting diode display panel.

Embodiment 37 is a circular polarizer comprising:
- a retarder;
- an absorbing polarizer; and
- a reflective polarizer disposed between the retarder and the absorbing polarizer and having a pass axis substantially aligned with a pass axis of the absorbing polarizer, the reflective polarizer comprising a plurality of alternating polymeric interference layers, the reflective polarizer having substantially non-overlapping first, second, and third reflection bands,
- wherein at normal incidence:
  - the first reflection band has a short wavelength band edge wavelength and a long wavelength band edge wavelength;

the second reflection band has a long wavelength band edge wavelength in a range of 440 nm to 500 nm, the short wavelength band edge wavelength of the first reflection band being at least 10 nm greater than the long wavelength band edge wavelength of the second reflection band; and the third reflection band has a short wavelength band edge wavelength in a range of 580 nm to 640 nm, the short wavelength band edge wavelength of the third reflection band being at least 10 nm greater than the long wavelength band edge wavelength of the first reflection band.

Embodiment 38 is the circular polarizer of Embodiment 37, wherein at normal incidence, the first reflection band has a short wavelength band edge wavelength in a range of 480 nm to 510 nm and has a long wavelength band edge wavelength in a range of 550 to 570 nm.

Embodiment 39 is the circular polarizer of Embodiment 37 or 38, wherein at normal incidence, the first reflection band has a bandwidth of no more than 80 nm.

Embodiment 40 is the circular polarizer of any one of Embodiments 37 to 39, wherein the absorbing polarizer has an average transmittance in a range of 40% to 60% for normally incident unpolarized light in a wavelength range of 450 nm to 650 nm.

Embodiment 41 is the circular polarizer of any one of Embodiments 37 to 39, wherein the absorbing polarizer has an average transmittance in a range of 44% to 60% for normally incident unpolarized light in a wavelength range of 450 nm to 650 nm.

Embodiment 42 is the circular polarizer of any one of Embodiments 37 to 41, wherein the reflective polarizer has a thickness in a range of 10 micrometers to 80 micrometers.

Embodiment 43 is the circular polarizer of any one of Embodiments 37 to 42 having a thickness in a range of 30 micrometers to 500 micrometers.

Embodiment 44 is the circular polarizer of any one of Embodiments 37 to 43, wherein the plurality of alternating polymeric interference layers comprises alternating first and second polymeric layers, the first polymeric layers being substantially uniaxially oriented.

Embodiment 45 is the circular polarizer of any one of Embodiments 37 to 44, wherein the plurality of alternating polymeric interference layers comprises outermost first and second interference layers, each layer in the reflective polarizer disposed between the outermost first and second interference layers having a thickness less than 1 micrometer.

Embodiment 46 is the circular polarizer of Embodiment 45, wherein the plurality of alternating polymeric interference layers comprises mutually disjoint first, second, and third pluralities of alternating interference layers, the first plurality of alternating interference layers providing the first reflection band, the second plurality of alternating interference layers providing the second reflection band, the third plurality of alternating interference layers providing the third reflection band.

Embodiment 47 is the circular polarizer of Embodiment 46, wherein the first plurality of alternating interference layers comprises the outermost first interference layer, the outermost first interference layer facing the retarder.

Embodiment 48 is a display comprising:
a display panel comprising a plurality of pixels, each pixel comprising at least first, second, and third subpixels, the first subpixel having a first peak emission wavelength, the second subpixel having a second peak emission wavelength less than the first peak emission wavelength, the third subpixel having a third peak emission wavelength greater than the first peak emission wavelength; the circular polarizer of any one of Embodiments 37 to 47 disposed on the display panel with the retarder facing the display panel, wherein at normal incidence, the first reflection band comprises the first peak emission wavelength, the second reflection band comprises the second peak emission wavelength, and the third reflection band comprises the third peak emission wavelength.

Embodiment 49 is a reflective polarizer comprising a plurality of alternating polymeric interference layers, the plurality of alternating polymeric interference layers having substantially non-overlapping first, second, and third reflection bands, each of the first, second, and third reflection bands being a first order harmonic reflection band, the plurality of alternating polymeric interference layers comprising outermost first and second interference layers, each layer in the reflective polarizer disposed between the outermost first and second interference layers having a thickness less than 1 micrometer,
wherein at normal incidence:
the first reflection band has a short wavelength band edge wavelength and a long wavelength band edge wavelength;
the second reflection band has a long wavelength band edge wavelength in a range of 440 nm to 500 nm, the short wavelength band edge wavelength of the first reflection band being at least 10 nm greater than the long wavelength band edge wavelength of the second reflection band; and
the third reflection band has a short wavelength band edge wavelength in a range of 580 nm to 640 nm, the short wavelength band edge wavelength of the third reflection band being at least 10 nm greater than the long wavelength band edge wavelength of the first reflection band.

Embodiment 50 is the reflective polarizer of Embodiment 49, wherein the plurality of alternating polymeric interference layers comprises mutually disjoint first, second, and third pluralities of alternating interference layers, the first plurality of alternating interference layers providing the first reflection band, the second plurality of alternating interference layers providing the second reflection band, the third plurality of alternating interference layers providing the third reflection band.

Embodiment 51 is the reflective polarizer of Embodiment 50, wherein the first plurality of alternating interference layers comprises the outermost first interference layer.

Embodiment 52 is the reflective polarizer of any one of Embodiments 49 to 51, wherein each layer in the reflective polarizer disposed between the outermost first and second interference layers has a thickness less than 500 nm.

Embodiment 53 is the reflective polarizer of any one of Embodiments 49 to 52, wherein at normal incidence, the first reflection band has a short wavelength band edge wavelength in a range of 480 nm to 510 nm and has a long wavelength band edge wavelength in a range of 550 to 570 nm.

Embodiment 54 is the reflective polarizer of any one of Embodiments 49 to 53, wherein at normal incidence, the first reflection band has a bandwidth of no more than 80 nm.

Embodiment 55 is the reflective polarizer of any one of Embodiments 49 to 54 having a thickness in a range of 10 micrometers to 80 micrometers.

Embodiment 56 is the reflective polarizer of any one of Embodiments 49 to 55, wherein the plurality of alternating polymeric interference layers comprises alternating first and second polymeric layers, the first polymeric layers being substantially uniaxially oriented.

Embodiment 57 is the display of any previous Embodiment directed to a display, wherein the reflective polarizer is a reflective polarizer according to any one of Embodiments 49 to 56.

Embodiment 58 is a circular polarizer comprising:
a retarder;
an absorbing polarizer; and
the reflective polarizer of any one of Embodiments 49 to 56 disposed between the retarder and the absorbing polarizer.

Embodiment 59 is the circular polarizer of Embodiment 58 being further characterized according to any one of Embodiments 37 to 47.

Embodiment 60 is the display of any previous Embodiment directed to a display comprising a circular polarizer, wherein the circular polarizer is a circular polarizer according to any one of Embodiments 37 to 47 or 58 to 59.

Embodiment 61 is a display comprising:
a display panel comprising a plurality of pixels, each pixel comprising at least first, second, and third subpixels, the first subpixel having a first peak emission wavelength, the second subpixel having a second peak emission wavelength less than the first peak emission wavelength, the third subpixel having a third peak emission wavelength greater than the first peak emission wavelength; the circular polarizer of Embodiment 58 or 59 disposed on the display panel with the retarder facing the display panel, wherein at normal incidence, the first reflection band comprises the first peak emission wavelength, the second reflection band comprises the second peak emission wavelength, and the third reflection band comprises the third peak emission wavelength.

Embodiment 62 is a display comprising:
a display panel comprising a plurality of pixels, each pixel comprising a plurality of subpixels;
a reflective polarizer disposed to receive a light output of the display panel, the reflective polarizer having a first reflection band,
wherein at normal incidence, the first reflection band reflects at least 60% of a first light having a block polarization state and a wavelength distribution of an emission spectrum of a first subpixel in the plurality of subpixels, and at an angle of incidence of 45 degrees, the first reflection band transmits at least 60% of the first light.

Embodiment 63 is the display of Embodiment 62, wherein at normal incidence, the first reflection band has a long wavelength band edge wavelength greater than a peak emission wavelength of the first subpixel.

Embodiment 64 is the display of Embodiment 62 or 63, wherein the reflective polarizer has a second reflection band substantially non-overlapping with the first reflection band, and wherein at normal incidence, the second reflection band reflects at least 60% of a second light having the block polarization state and a wavelength distribution of an emission spectrum of a second subpixel in the plurality of subpixels, and at an angle of incidence of 45 degrees, the second reflection band transmits at least 60% of the second light.

Embodiment 65 is the display of Embodiment 64, wherein the reflective polarizer has a third reflection band substantially non-overlapping with the first reflection band and substantially non-overlapping with the second reflection band, and wherein at normal incidence, the third reflection band reflects at least 60% of a third light having the block polarization state and a wavelength distribution of an emission spectrum of a third subpixel in the plurality of subpixels, and at an angle of incidence of 45 degrees, the third reflection band transmits at least 60% of the third light.

Embodiment 66 is the display of Embodiment 65, wherein the first subpixel is a green subpixel, the second subpixel is a blue subpixel, the third subpixel is a red subpixel.

Embodiment 67 is the display of Embodiment 66, wherein the plurality of subpixels further comprises a fourth subpixel.

Embodiment 68 is the display of Embodiment 67, wherein the fourth subpixel is a white subpixel.

Embodiment 69 is the display of any one of Embodiments 62 to 68 being further characterized according to any one of Embodiments 1 to 36.

Embodiment 70 is the display of any one of Embodiments 62 to 68, wherein a circular polarizer comprises the reflective polarizer disposed between a retarder and an absorbing polarizer.

Embodiment 71 is a circular polarizer comprising:
a retarder;
an absorbing polarizer having an absorption band extending throughout a visible range of 400 nm to 700 nm; and
a reflective polarizer disposed between the retarder and the absorbing polarizer and having a pass axis substantially aligned with a pass axis of the absorbing polarizer, the reflective polarizer comprising a plurality of alternating polymeric interference layers, the reflective polarizer having a reflection band and at least one transmission band in a block polarization state, wherein at normal incidence, the at least one transmission band having a total width in the visible range of at least 150 nm.

Embodiment 72 is the circular polarizer of Embodiment 71, wherein at normal incidence, the reflection band has a long wavelength band edge wavelength in a range of 440 nm to 550 nm and a short wavelength band edge wavelength less than 420 nm.

Embodiment 73 is the circular polarizer of Embodiment 71, wherein at normal incidence, the reflection band has a long wavelength band edge wavelength in a range of 460 nm to 520 nm and a short wavelength band edge wavelength less than 410 nm.

Embodiment 74 is the circular polarizer of Embodiment 71, wherein at normal incidence, the reflection band has a long wavelength band edge wavelength of about 500 nm and a short wavelength band edge wavelength less than 410 nm.

Embodiment 75 is the circular polarizer of Embodiment 71, wherein at normal incidence, the reflection band extends at least from 440 nm to 480 nm and the at least one transmission band extends at least from 530 nm to 680 nm.

Embodiment 76 is the circular polarizer of Embodiment 71, wherein at normal incidence, the reflection band extends at least from 520 nm to 590 nm and the at least one transmission band extends at least from 400 nm to 490 nm and at least from 620 nm to 700 nm.

Embodiment 77 is the circular polarizer of Embodiment 71, wherein at normal incidence, the reflection band extends at least from 600 nm to 660 nm and the at least one transmission band extends at least from 400 nm to 560 nm.

Embodiment 78 is the display of Embodiment 70, wherein the circular polarizer is a circular polarizer according to any one of Embodiments 37 to 47 or 71 to 67.

Embodiment 79 is the display of any one of Embodiments 62 to 71, wherein the reflective polarizer is a reflective polarizer according to any one of Embodiments 49 to 56.

EXAMPLES

Example 1: Reflective Polarizer with 3 Reflection Bands, f-Ratio 0.2

A reflective polarizer having three non-overlapping reflection bands was made as follows. A single multilayer optical packet was co-extruded. The packet included 275 alternating layers of 90/10 coPEN and low index isotropic layers. 90/10 coPEN is a polymer composed of 90% polyethylene naphthalate (PEN) and 10% polyethylene terephthalate (PET). The isotropic layers were made with a blend of polycarbonate and copolyesters (PC:coPET) as described in WO2015035030 such that the index was about 1.57 and the layers remained substantially isotropic upon uniaxial orientation. The PC:coPET molar ratio was approximately 42.5 mol % PC and 57.5 mol % coPET. The isotropic layers had a Tg of 105 degrees centigrade. This isotropic material was chosen such that after stretching its refractive indices in the two non-stretch directions remained substantially matched with those of the birefringent material in the non-stretching direction while in the stretching direction there was a substantial mismatch in refractive indices between birefringent and non-birefringent layers. The 90/10 PEN and PC:coPET polymers were fed from separate extruders ratios of total flow of 15% and 84% for 90/10 PEN and PC:coPET respectively to a multilayer coextrusion feedblock with a targeted f ratio of 0.20. The materials were assembled into a packet of 275 alternating optical layers, plus a thicker protective boundary layer on each side of PC:coPET, for a total of 277 layers. The multilayer melt was then cast through a film die onto a chill roll, in the conventional manner for polyester films, upon which it was quenched. The cast web was then stretched in a parabolic tenter similar to that described in the Invited Paper 45.1, authored by Denker et al., entitled "Advanced Polarizer Film for Improved Performance of Liquid Crystal Displays," presented at Society for Information Displays (SID) International Conference in San Francisco, Calif., Jun. 4-9, 2006.

Figure 28:
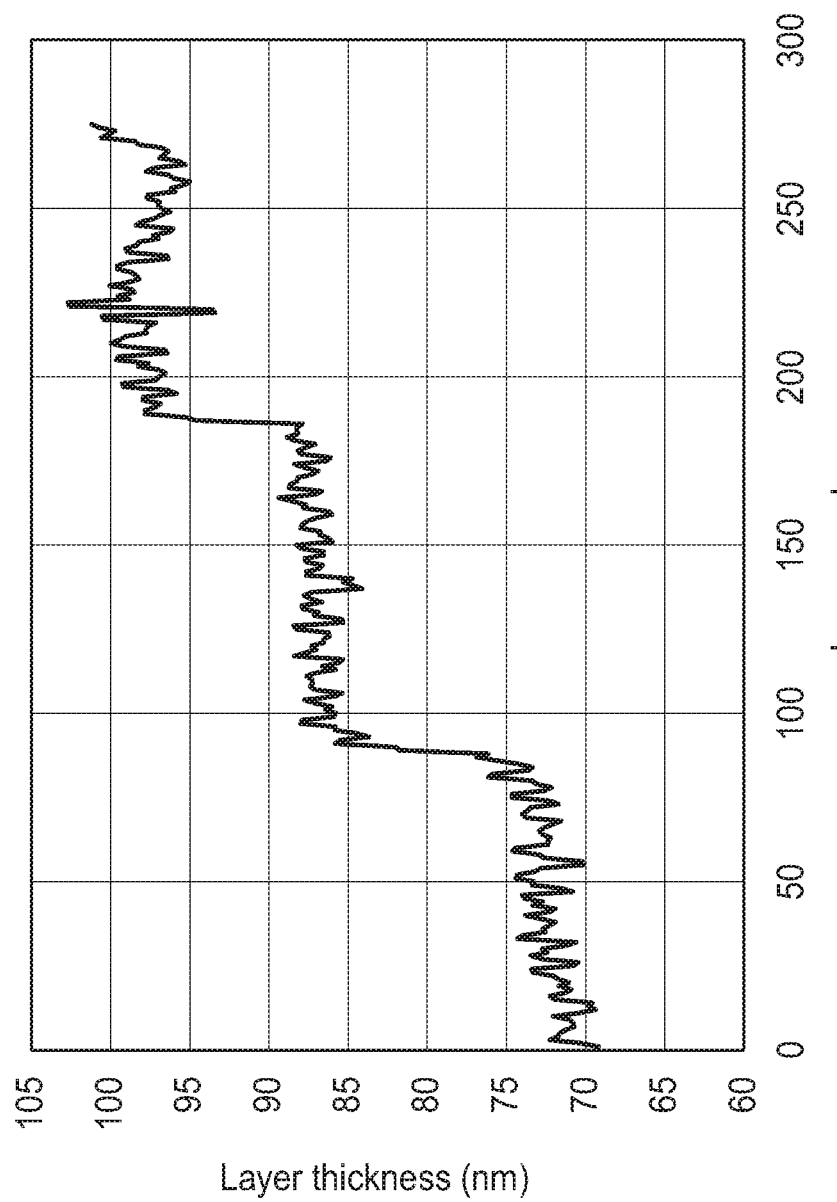
FIGS. 28-30 are layer thickness profiles of alternating interference layers for exemplary reflective polarizer films.

The film had the layer thickness profile of the alternating interference layers illustrated in FIG. 28. The film utilized an f-ratio of about 0.2 and had a total thickness of about 25 micrometers including the thicknesses of 3 micrometer protective boundary layers on opposite sides of the alternating interference layers.

Example 2: Reflective Polarizer with 2 Reflection Bands, f-Ratio 0.24

A reflective polarizer having two non-overlapping reflection bands was made as follows. A single multilayer optical packet was co-extruded. The packet included 275 alternating layers of 90/10 coPEN and low index isotropic layers. 90/10 coPEN is a polymer composed of 90% polyethylene naphthalate (PEN) and 10% polyethylene terephthalate (PET). The isotropic layers were made with a blend of polycarbonate and copolyesters (PC:coPET) as described in WO2015035030 such that the index was about 1.57 and the layers remained substantially isotropic upon uniaxial orientation. The PC:coPET molar ratio was approximately 42.5 mol % PC and 57.5 mol % coPET. The isotropic layers had a Tg of 105 degrees centigrade. This isotropic material was chosen such that after stretching its refractive indices in the two non-stretch directions remained substantially matched with those of the birefringent material in the non-stretching direction while in the stretching direction there was a substantial mismatch in refractive indices between birefringent and non-birefringent layers. The 90/10 PEN and PC:coPET polymers were fed from separate extruders ratios of total flow of 18% and 82% for 90/10 PEN and PC:coPET respectively to a multilayer coextrusion feedblock with a targeted f ratio of 0.24. The materials were assembled into a packet of 275 alternating optical layers, plus a thicker protective boundary layer on each side of PC:coPET, for a total of 277 layers. The multilayer melt was then cast through a film die onto a chill roll, in the conventional manner for polyester films, upon which it was quenched. The cast web was then stretched in a parabolic tenter similar to that described in the Invited Paper 45.1, authored by Denker et al., entitled "Advanced Polarizer Film for Improved Performance of Liquid Crystal Displays," presented at Society for Information Displays (SID) International Conference in San Francisco, Calif., Jun. 4-9, 2006.

Figure 29:
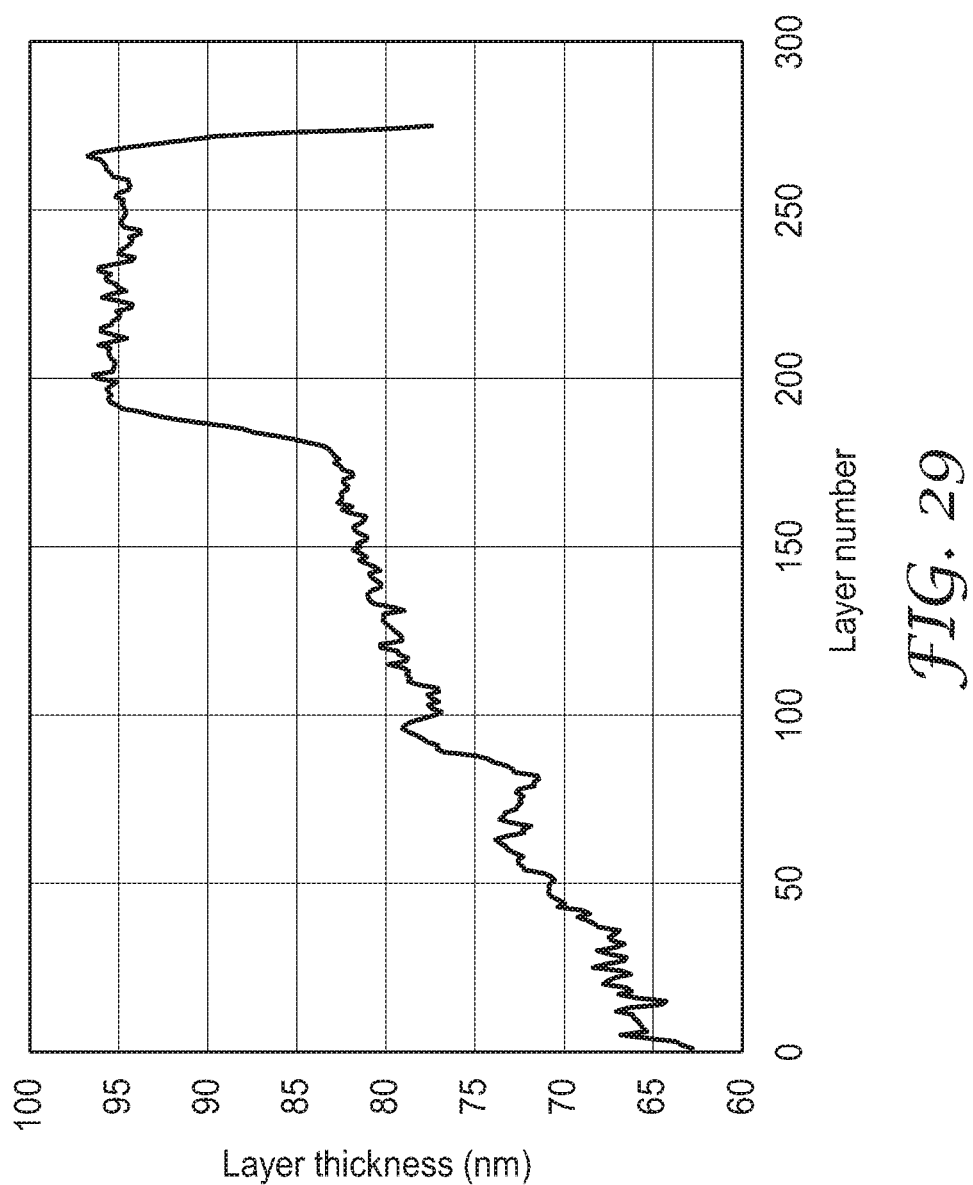

The film had the layer thickness profile of the alternating interference layers illustrated in FIG. 29. The film utilized an f-ratio of about 0.24 and had a total thickness of about 24 micrometers including the thicknesses of 3 micrometers protective boundary layers on opposite sides of the alternating interference layers.

Example 3: Reflective Polarizer with 1 Reflection Band, f-Ratio 0.5

A reflective polarizer having one reflection band was made as follows. A single multilayer optical packet was co-extruded. The packet included 275 alternating layers of 90/10 coPEN and low index isotropic layers. 90/10 coPEN is a polymer composed of 90% polyethylene naphthalate (PEN) and 10% polyethylene terephthalate (PET). The isotropic layers were made with a blend of polycarbonate and copolyesters (PC:coPET) as described in WO2015035030 such that the index was about 1.57 and the layers remained substantially isotropic upon uniaxial orientation. The PC:coPET molar ratio was approximately 42.5 mol % PC and 57.5 mol % coPET. The isotropic layers had a Tg of 105 degrees centigrade. This isotropic material was chosen such that after stretching its refractive indices in the two non-stretch directions remained substantially matched with those of the birefringent material in the non-stretching direction while in the stretching direction there was a substantial mismatch in refractive indices between birefringent and non-birefringent layers. The 90/10 PEN and PC:coPET polymers were fed from separate extruders ratios of total flow of 42% and 58% for 90/10 PEN and PC:coPET respectively to a multilayer coextrusion feedblock with a targeted f ratio of 0.50. The materials were assembled into a packet of 275 alternating optical layers, plus a thicker protective boundary layer on each side of PC:coPET, for a total of 277 layers. The multilayer melt was then cast through a film die onto a chill roll, in the conventional manner for polyester films, upon which it was quenched. The cast web was then stretched in a parabolic tenter similar to that described in the Invited Paper 45.1, authored by Denker et al., entitled "Advanced Polarizer Film for Improved Performance of Liquid Crystal Displays," presented at Society for Information Displays (SID) International Conference in San Francisco, Calif., Jun. 4-9, 2006.

Figure 30:
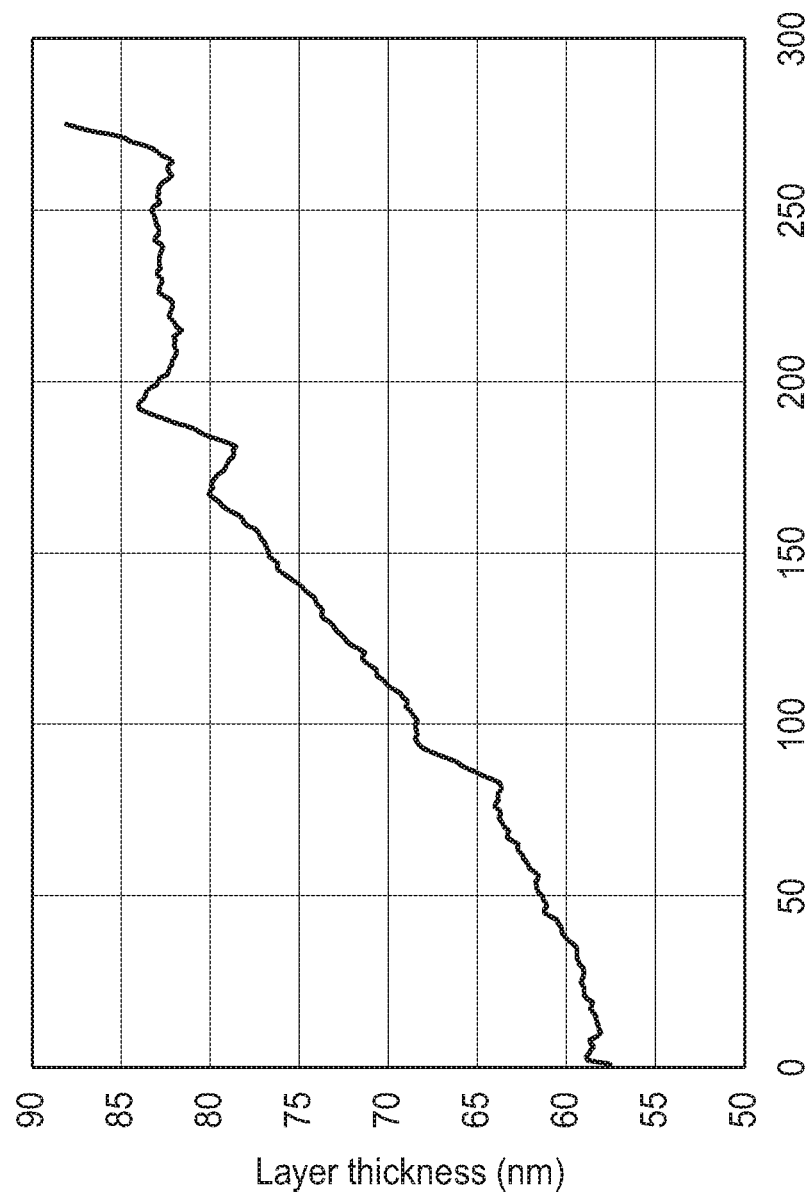

The film had the layer thickness profile of the alternating interference layers illustrated in FIG. 30. The film utilized an f-ratio of about 0.50 and had a total thickness of about 21 micrometers including the thicknesses of 3 micrometer protective boundary layers on opposite sides of the alternating interference layers.

Comparative Example 1 (CE-1)—APF-V3

The commercial multilayer optical film available as APF-V3 (3M Company, St. Paul, Mn) was used for comparisons to examples 1-3.
Circular polarizer preparation and incorporation into television for testing:

Circular polarizers were prepared for each of Examples 1-3 and CE-1 multilayer optical films. In each case, an absorbing polarizer (AP) 5618 H-type (from Sanritz Corporation, Toyama, JP) was laminated to the example film with the block axes of the example multilayer optical film and that of the absorbing polarizer substantially aligned. On the side opposite to the example multilayer optical film, a quarter wave plate (QWP) with trade name APQW92-004-PC-140NMHE (from American Polarizers, Inc., Reading, PA) was laminated with 8171 optically clear adhesive (available from 3M Company, St. Paul, MN). The QWP optical axis was approximately 45 degrees relative to the optic axis of the two polarizers.

For it situ testing of each example, the circular polarizer resulting from this process was laminated to an LG OLED 55B7A television, where the original circular polarizer had been removed from the display. Emissive luminance and color were measured via a PR-705 Spectrophotometer from Photo Research Inc. Reflectivity was measured via Lambda 900 Spectrometer from Perkin-Elmer Inc. A Keyence VHX-600 Digital Microscope with the Z20-200× lens was used to image the pixels at various inclination angles and to determine grey scale values which provides a measure of the luminance profile.

Figure 31:
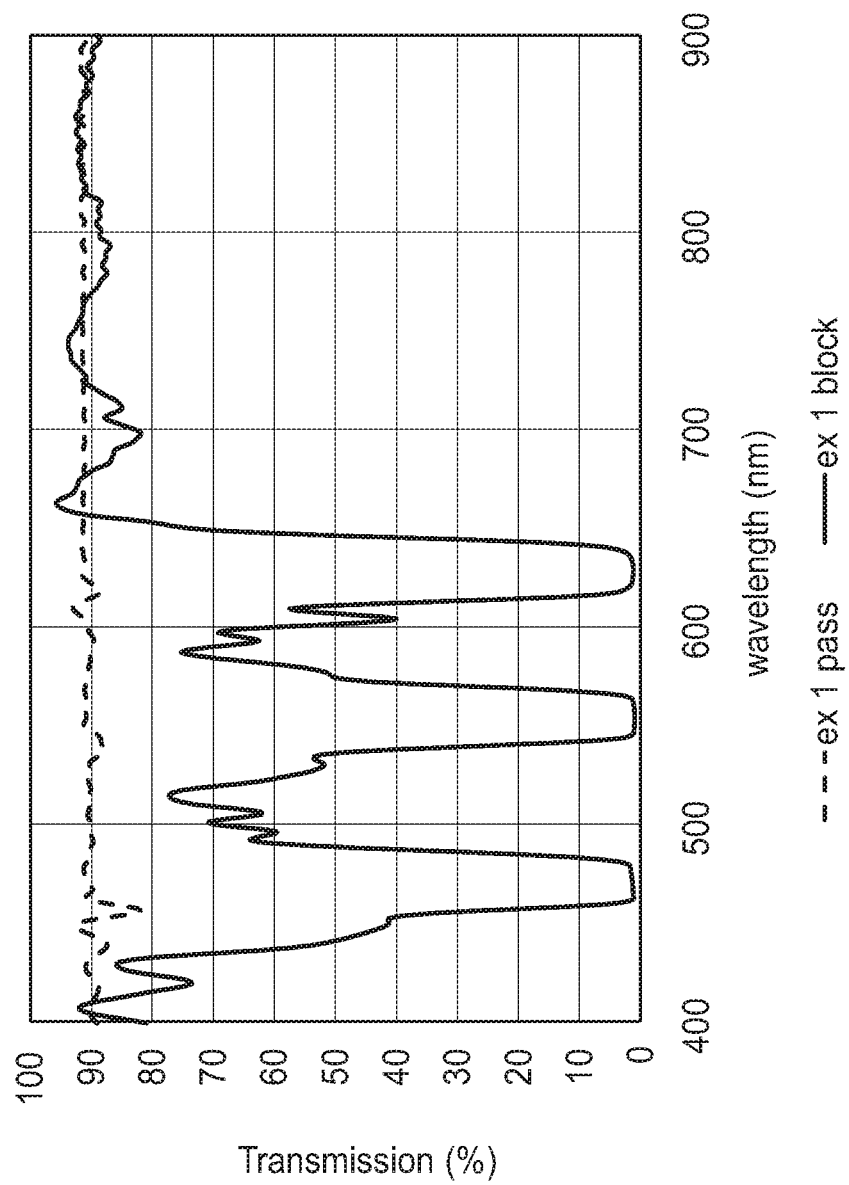
FIG. 31 is the measured spectrum for block and pass states for a reflective polarizer.
Figure 32:
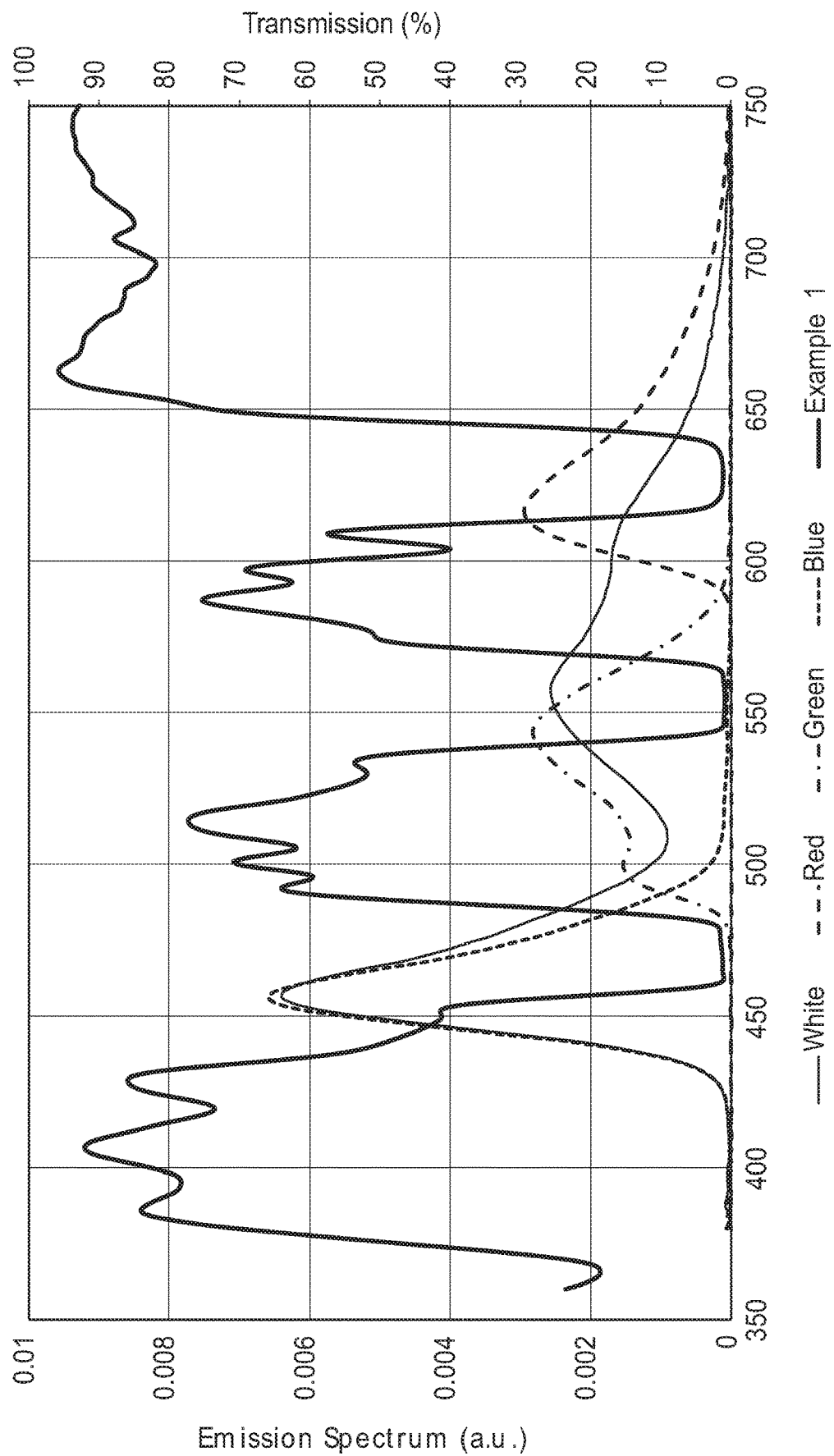
FIG. 32 is the measured spectrum for the block state of a reflective polarizer together with OLED emission peak.
Figure 33:
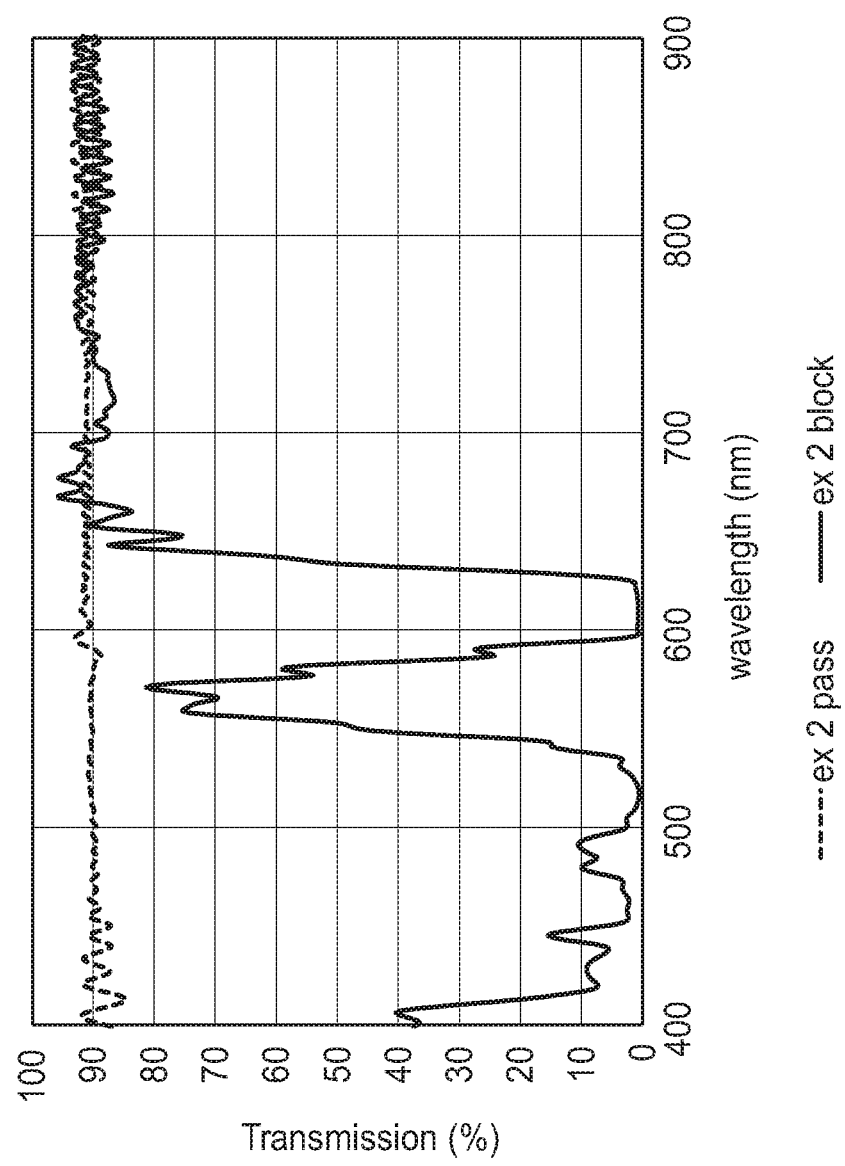
FIG. 33 is the measured spectrum for block and pass states for an exemplary reflective polarizer.
Figure 34:
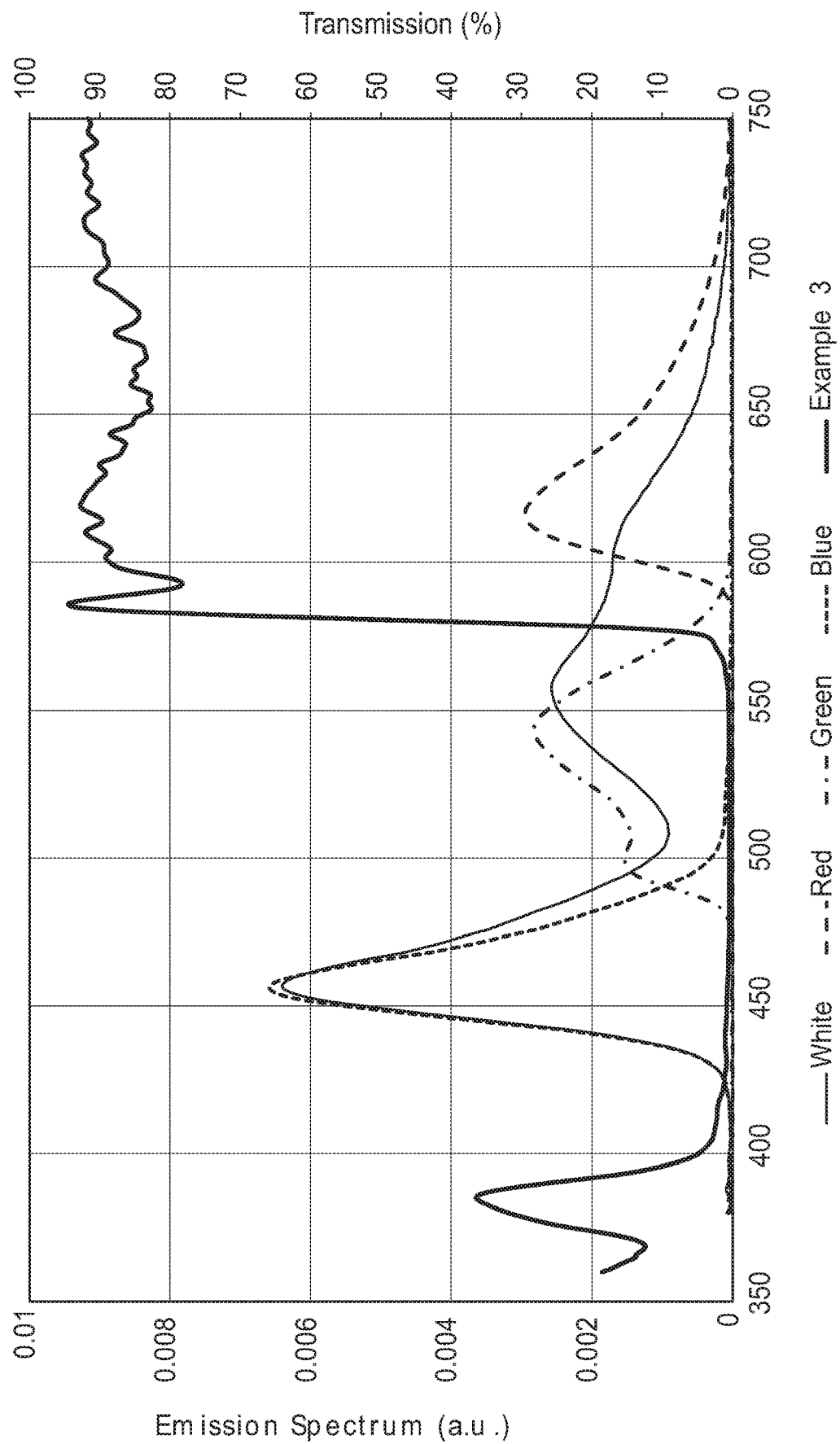
FIG. 34 is the measured spectrum for block and pass states for an exemplary reflective polarizer film together with OLED emission peaks
Figure 35A:
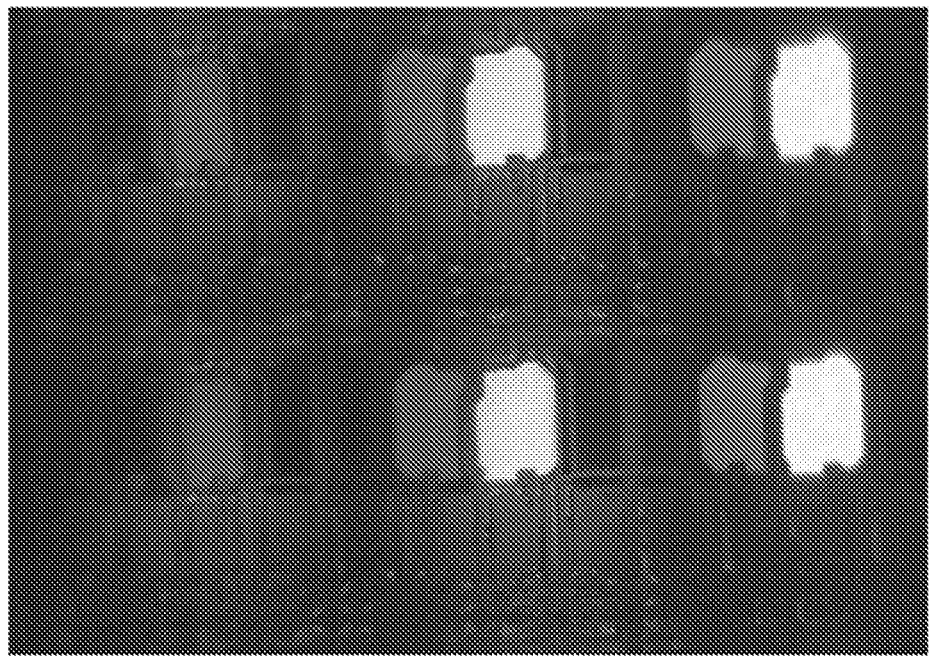
FIGS. 35A-35E are illustrative images of pixels and corresponding ghost images for a comparative display.
Figure 35B:
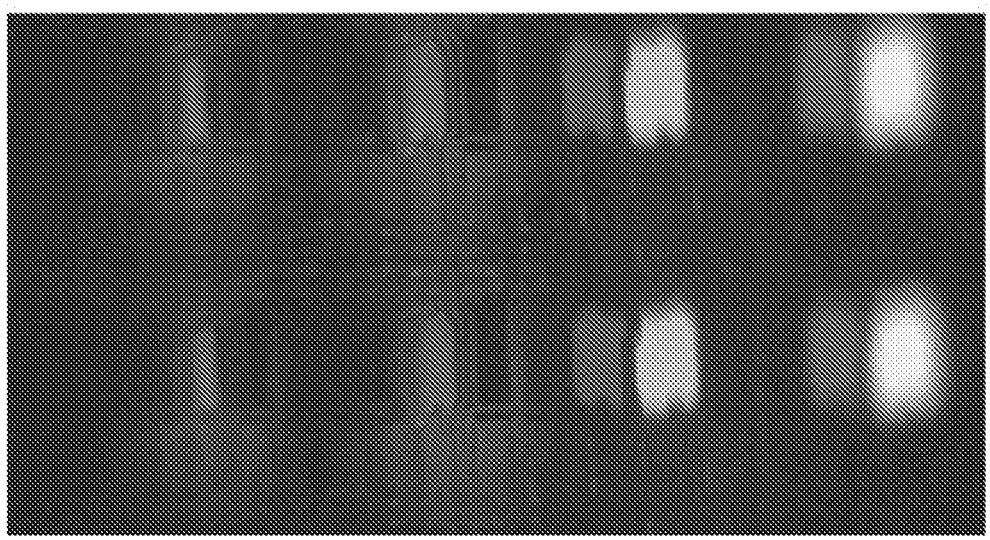
Figure 35C:
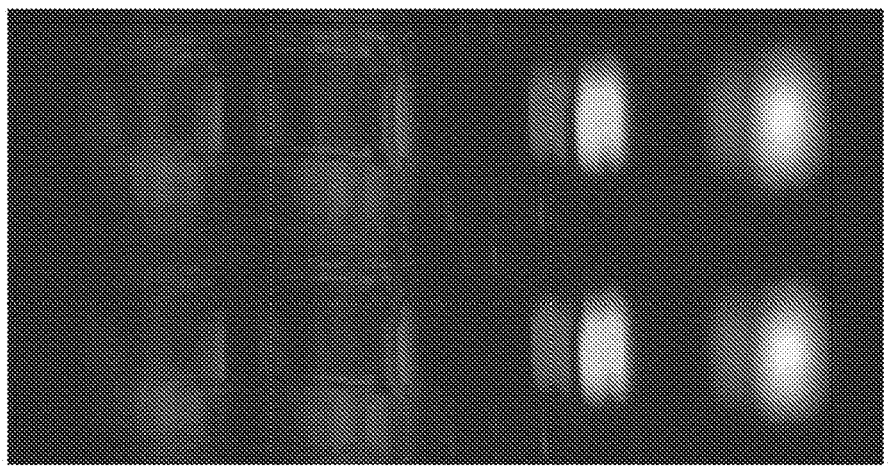
Figure 35D:
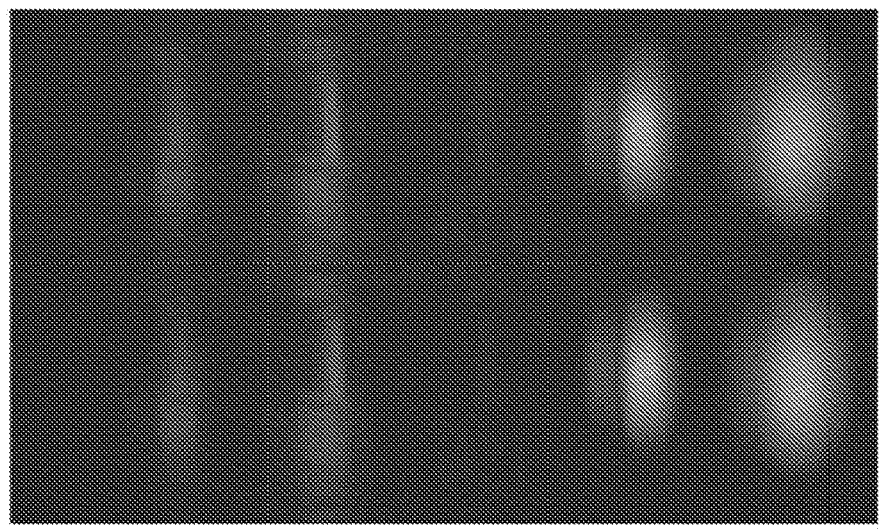
Figure 35E:
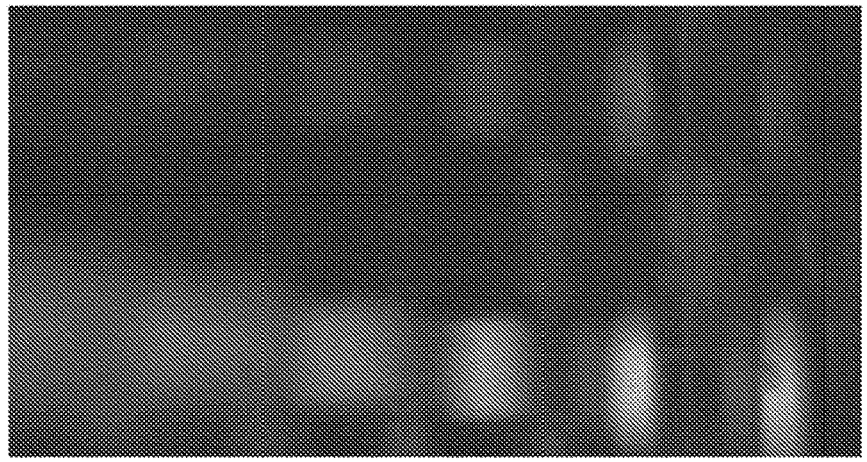
Figure 36A:
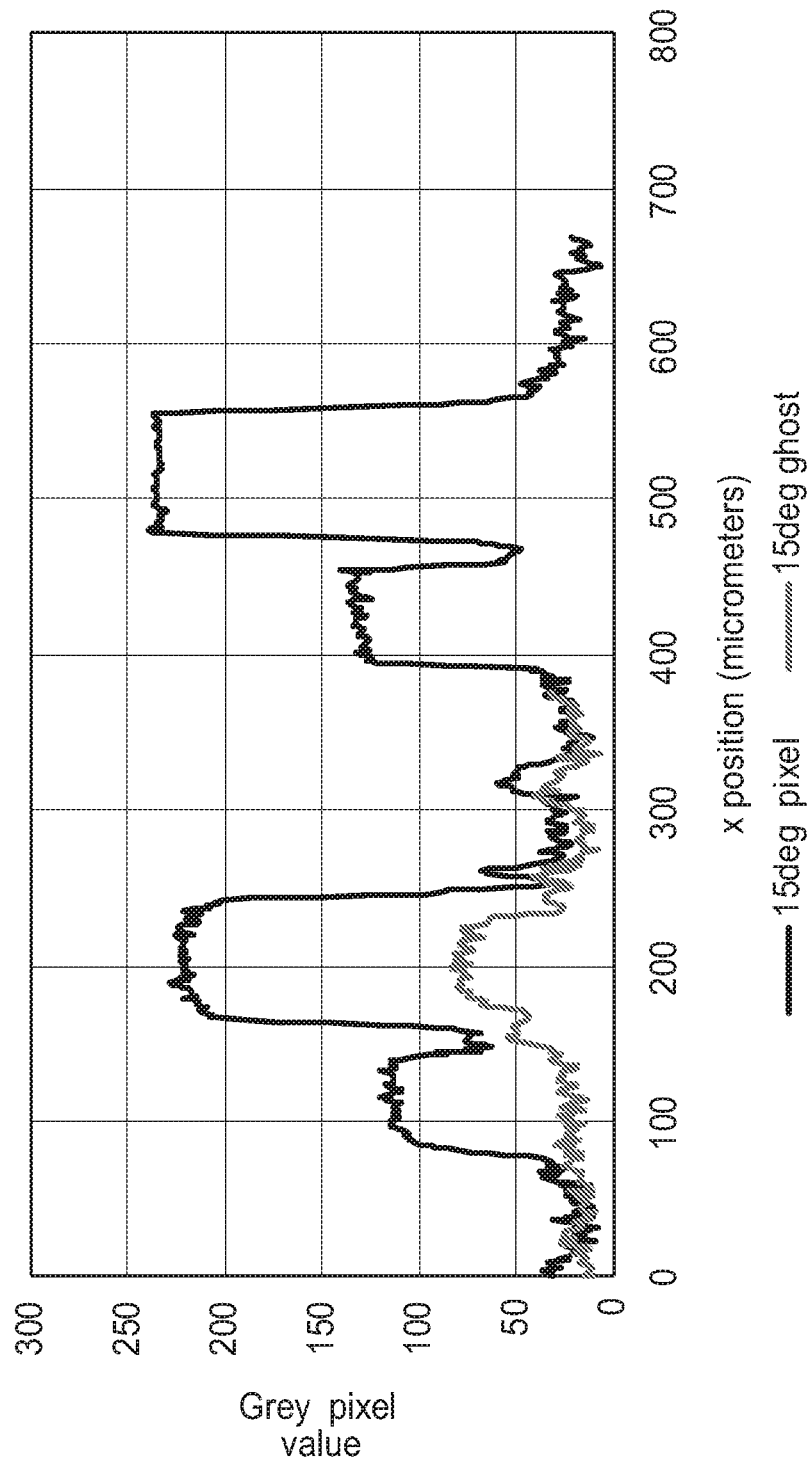
FIGS. 36A-36E are extracted luminance profiles from images of FIGS. 35A-35E, respectively.
Figure 36B:
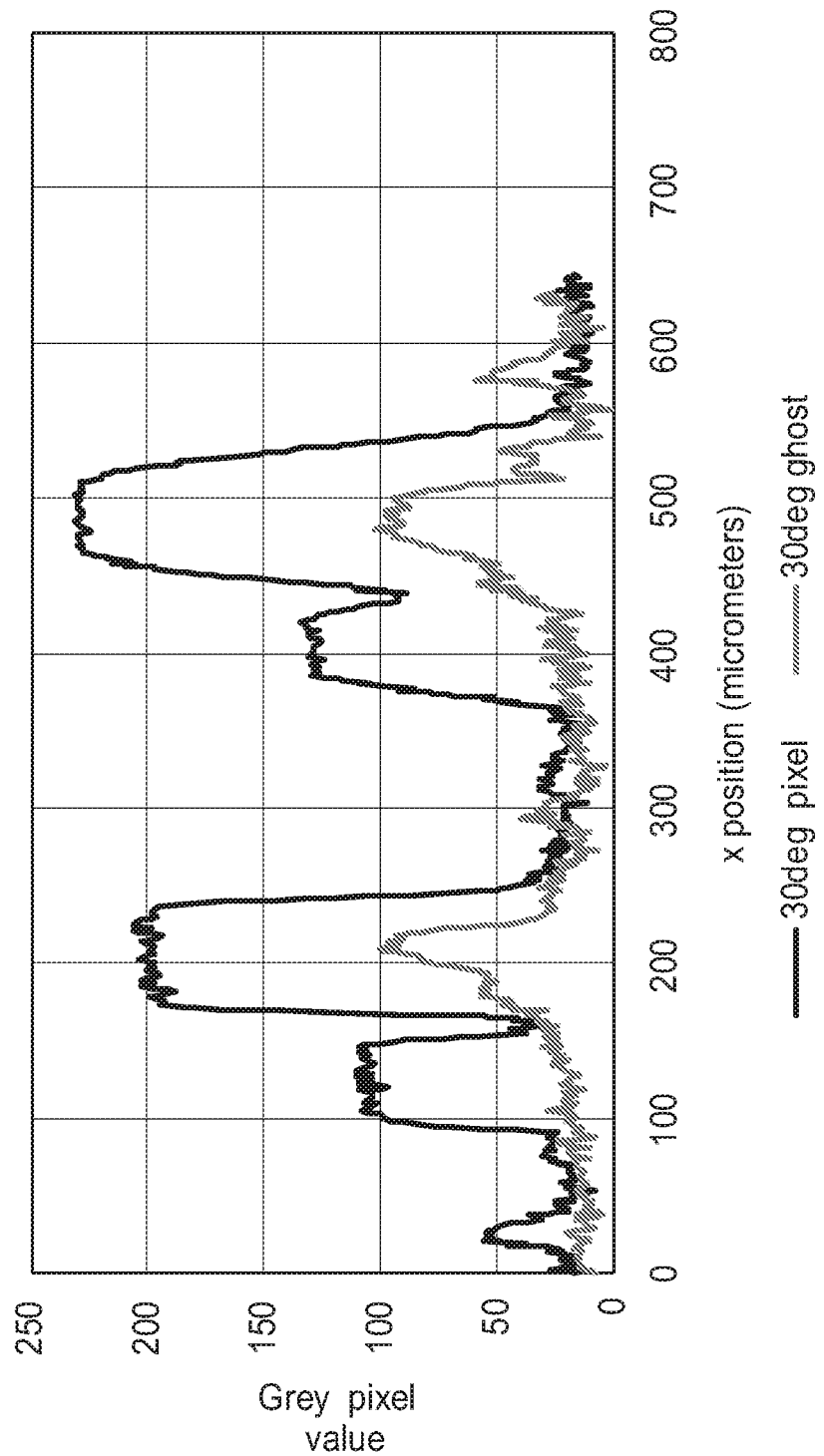
Figure 36C:
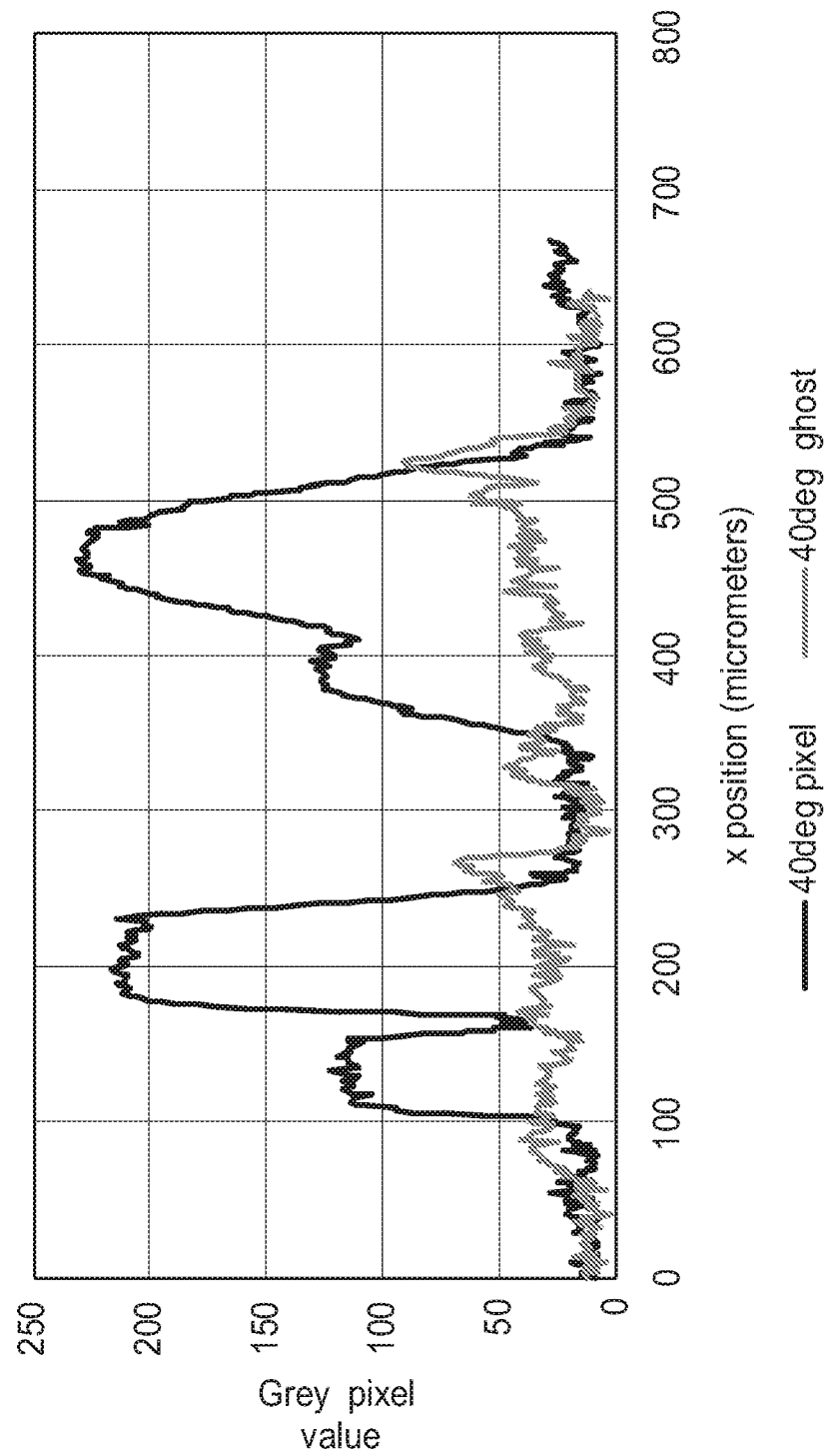
Figure 36D:
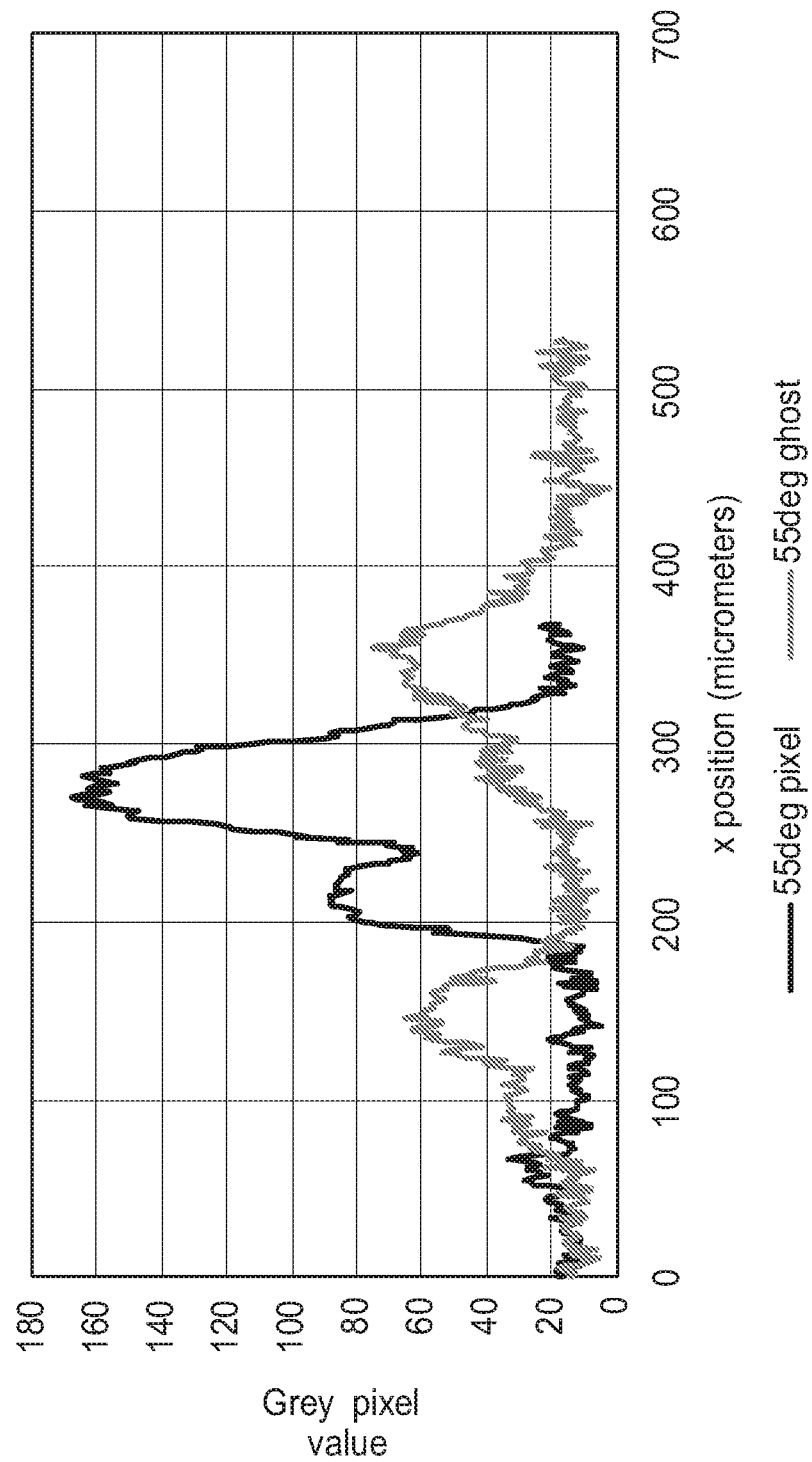
Figure 36E:
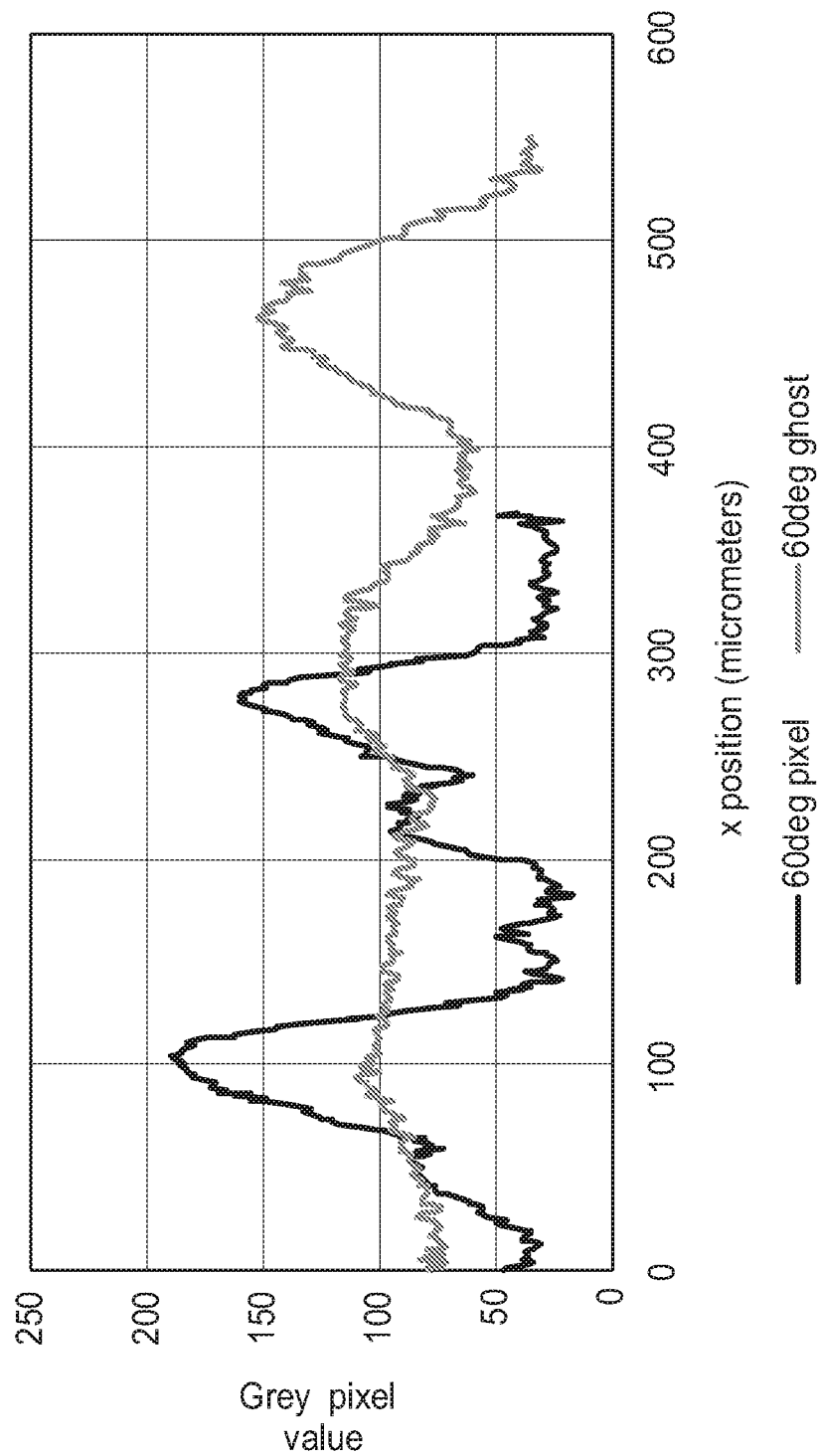
Figure 37A:
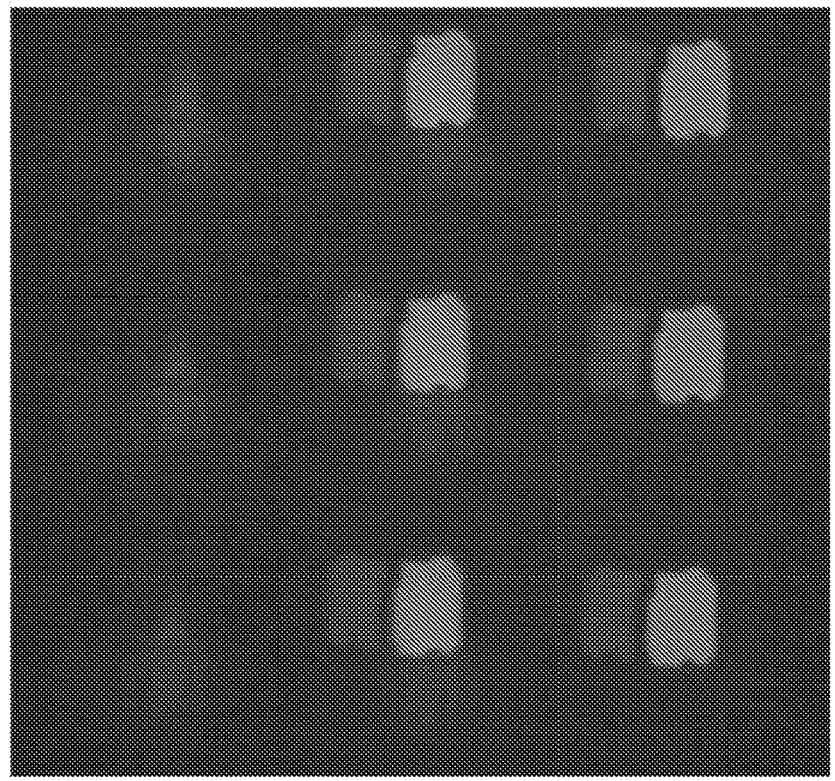
FIGS. 37A-E are illustrative images of pixels and corresponding ghost images for a display including an exemplary reflective polarizer.
Figure 37B:
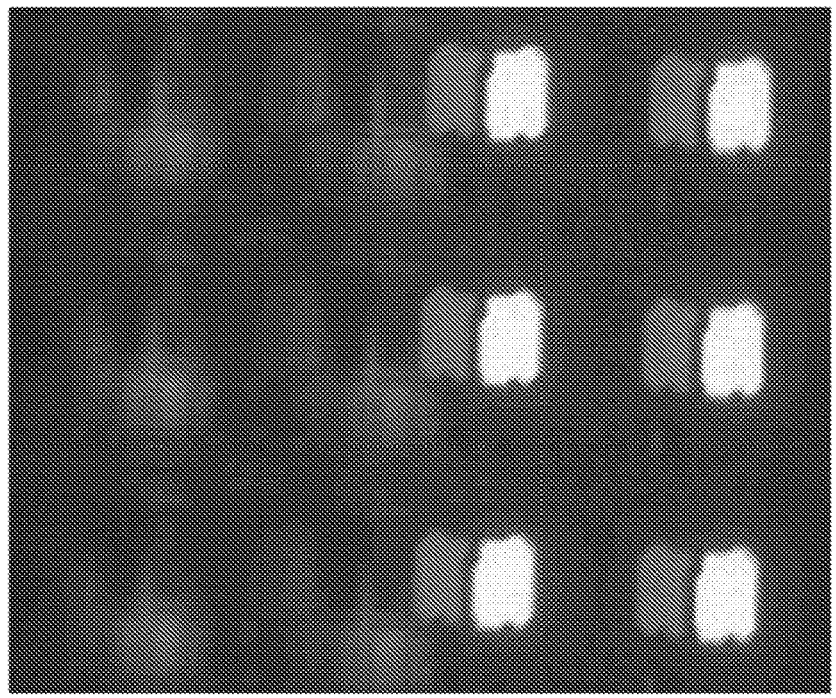
Figure 37C:
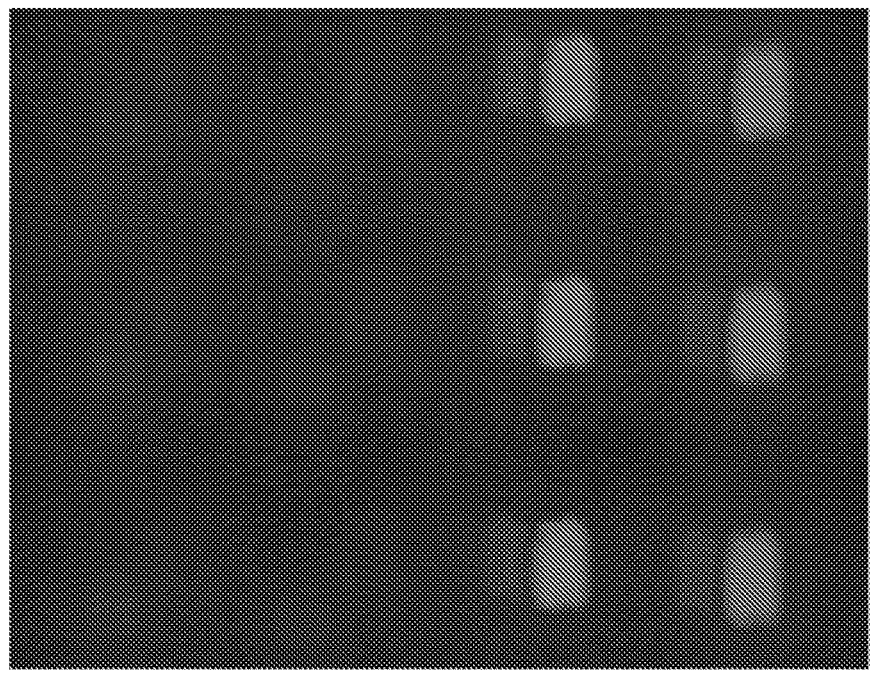
Figure 37D:
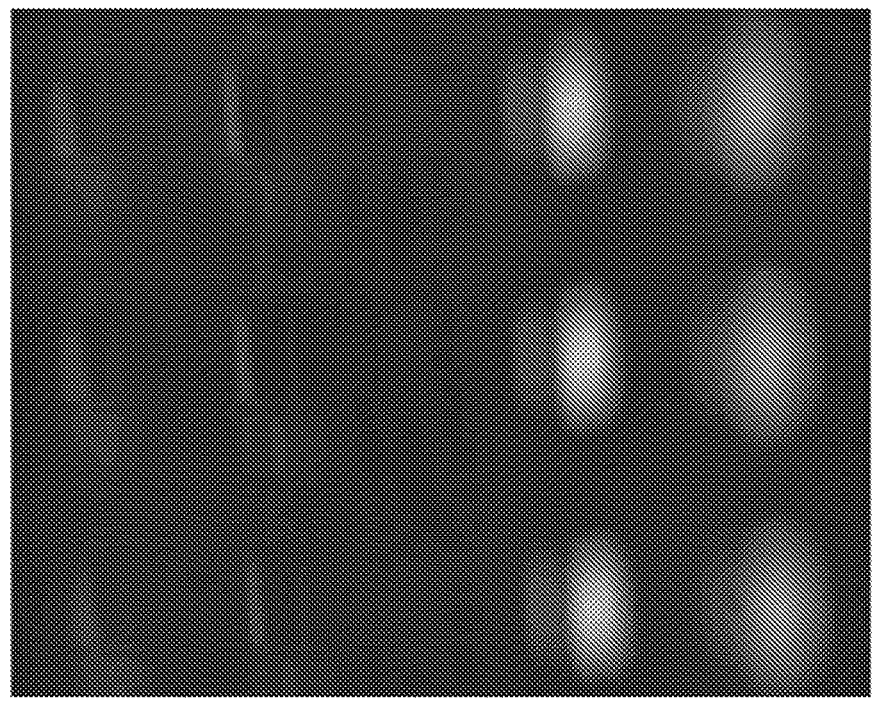
Figure 37E:
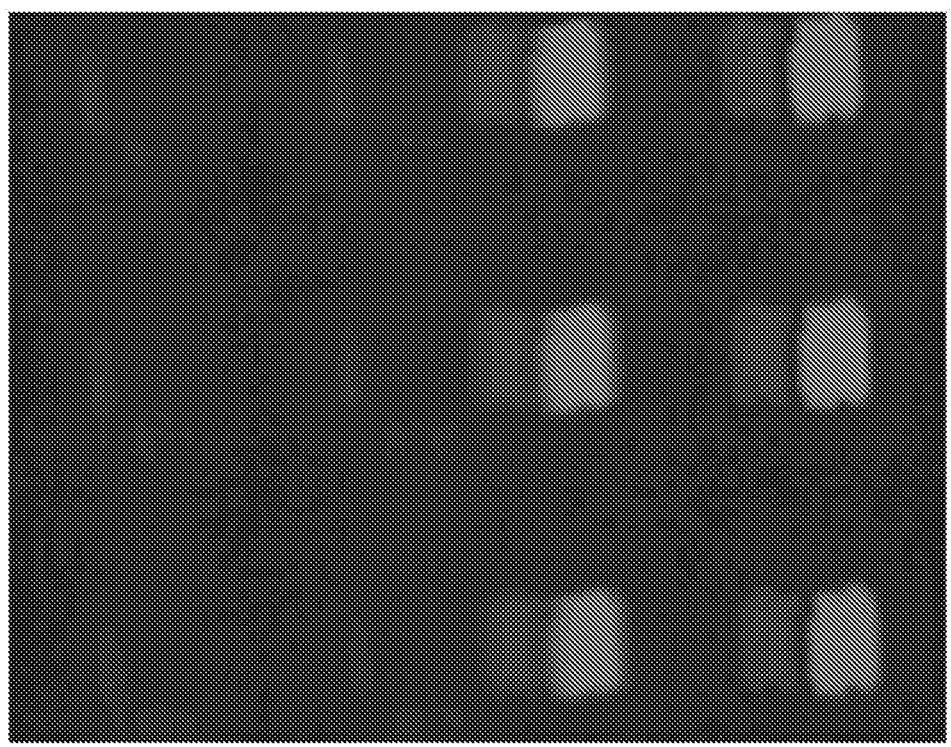
Figure 38A:
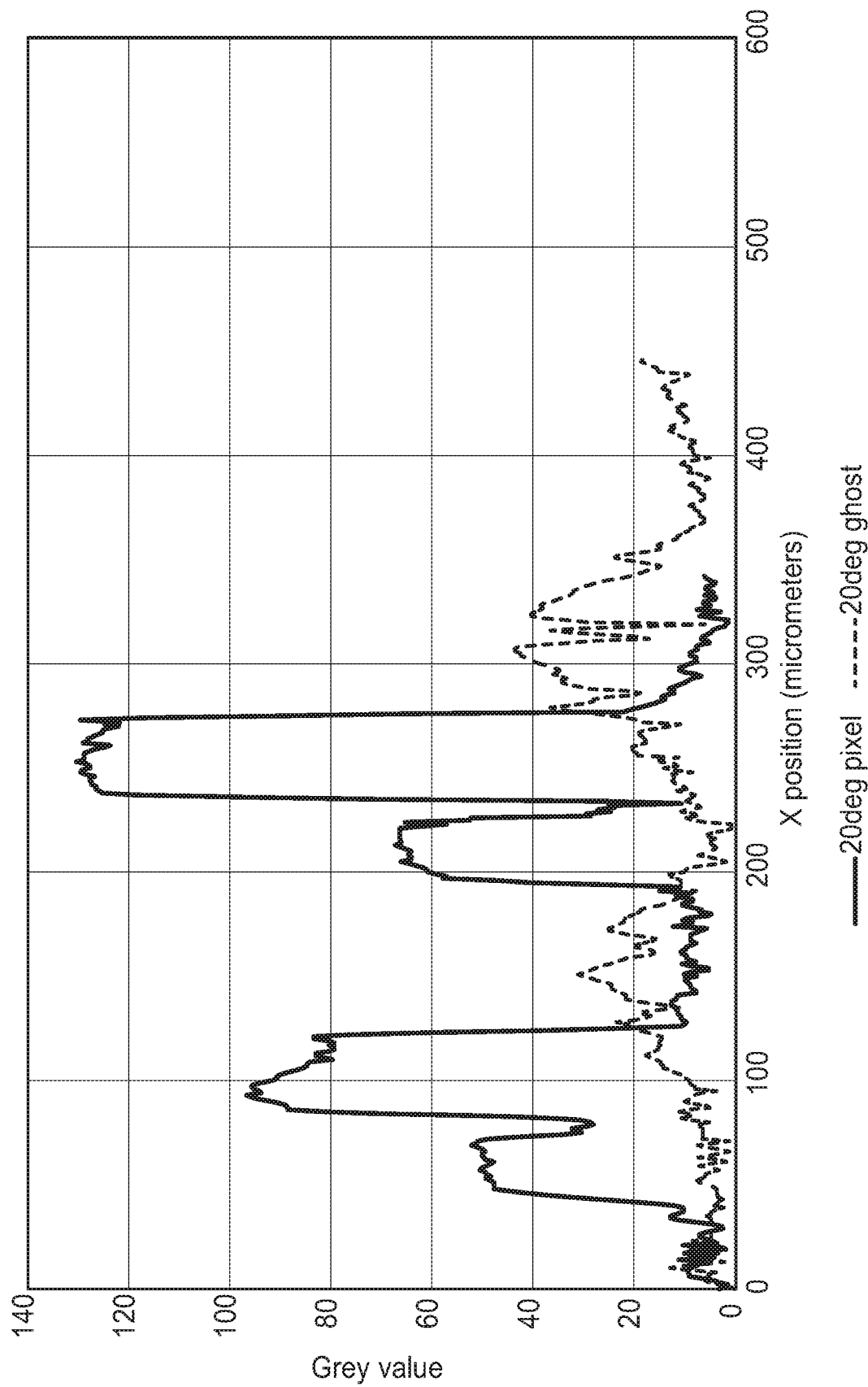
FIGS. 38A-38E are extracted luminance profiles from images of FIGS. 37A-37E, respectively.
Figure 38B:
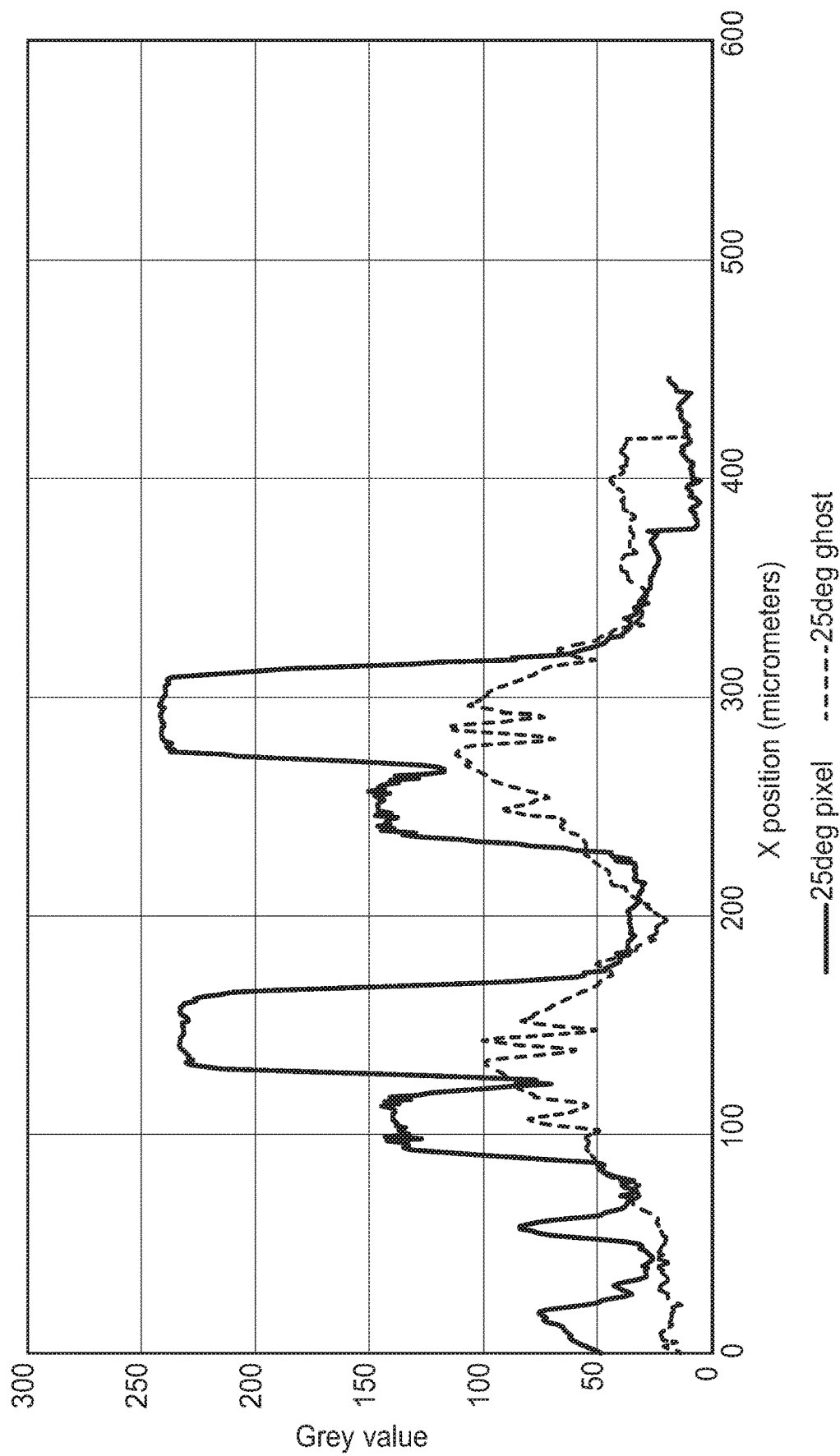
Figure 38C:
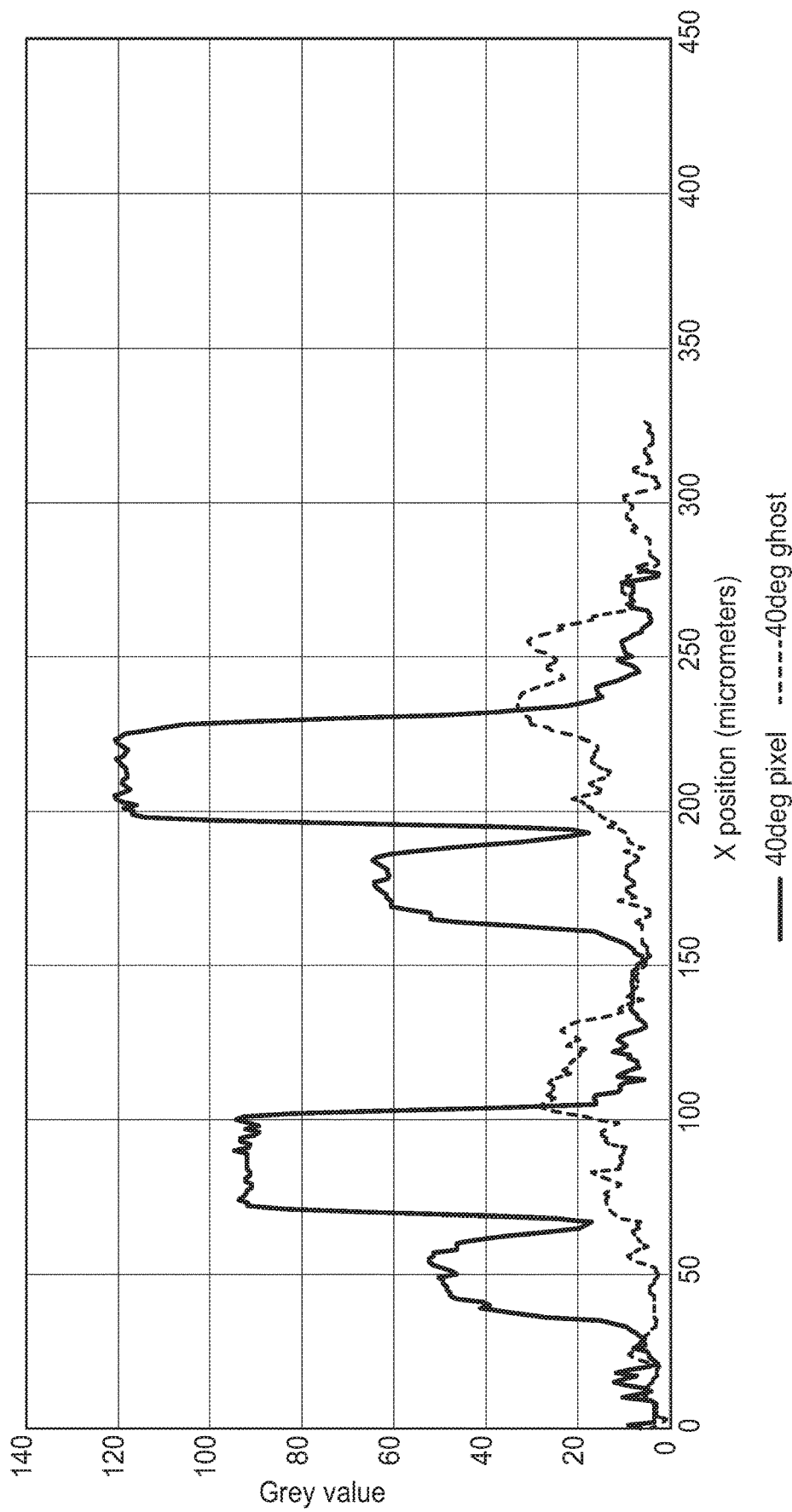
Figure 38D:
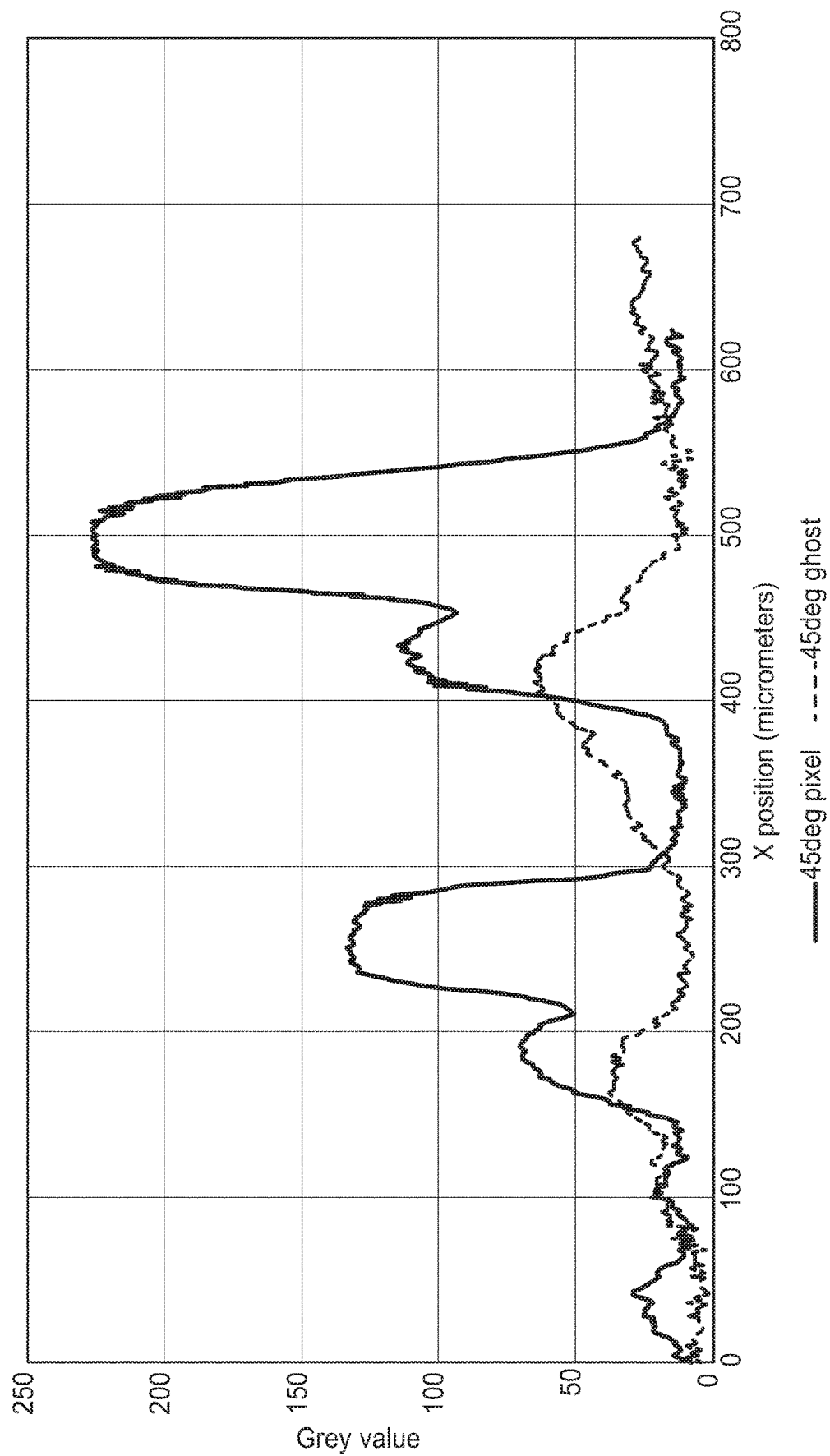
Figure 38E:
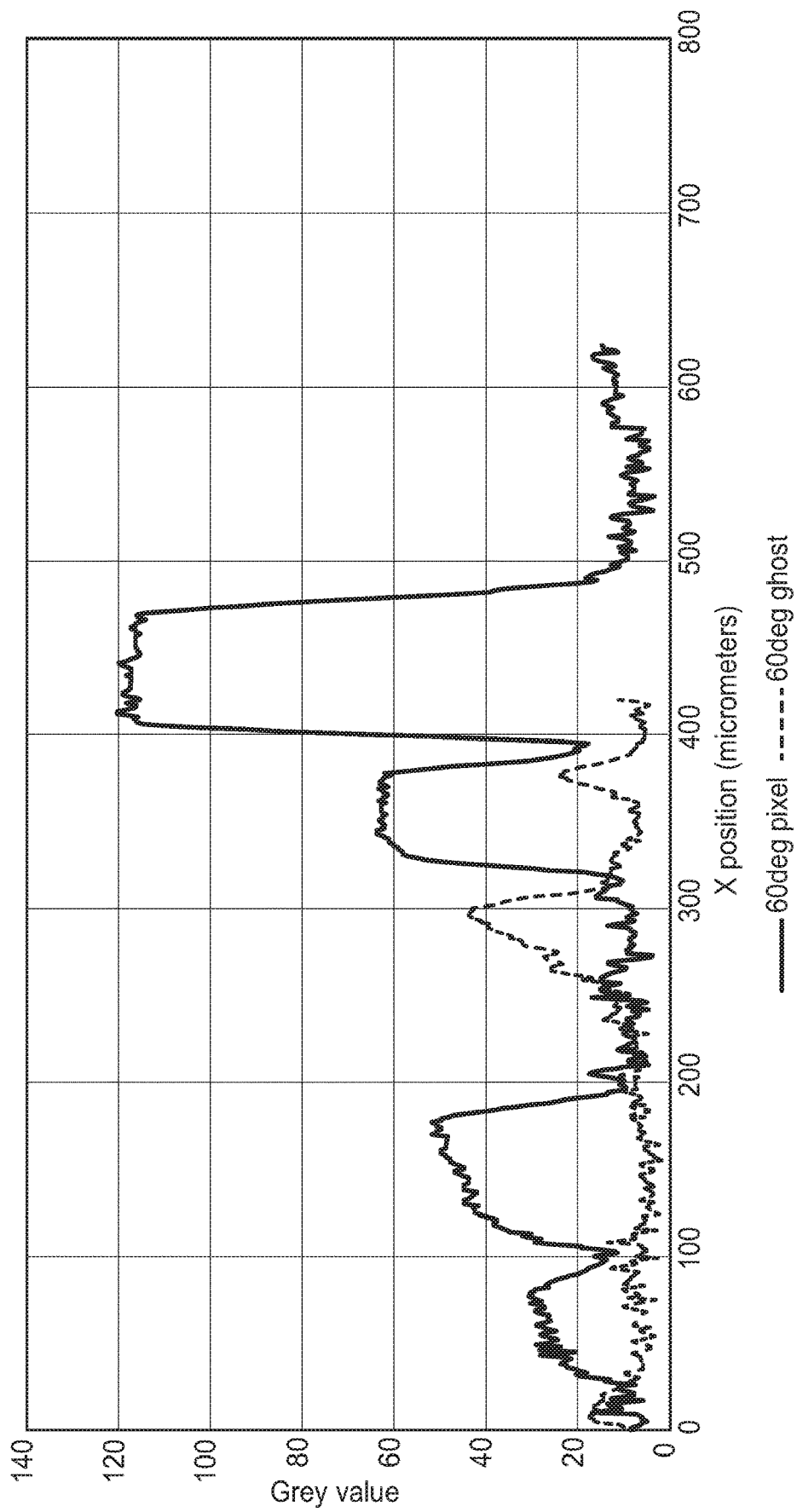

Test Results:

Reflectivity spectra were measured for each example. FIG. 31 shows the measured spectra for block and pass states for the Example 1 film. FIG. 32 shows the measured spectrum for the block state for the Example 1 film together with OLED emission peaks. FIG. 33 shows the measured spectrum for block and pass states for the Example 2 film. FIG. 34 shows the measured spectrum for the block state for the Example 3 film together with OLED emission peaks.

Figure 39A:
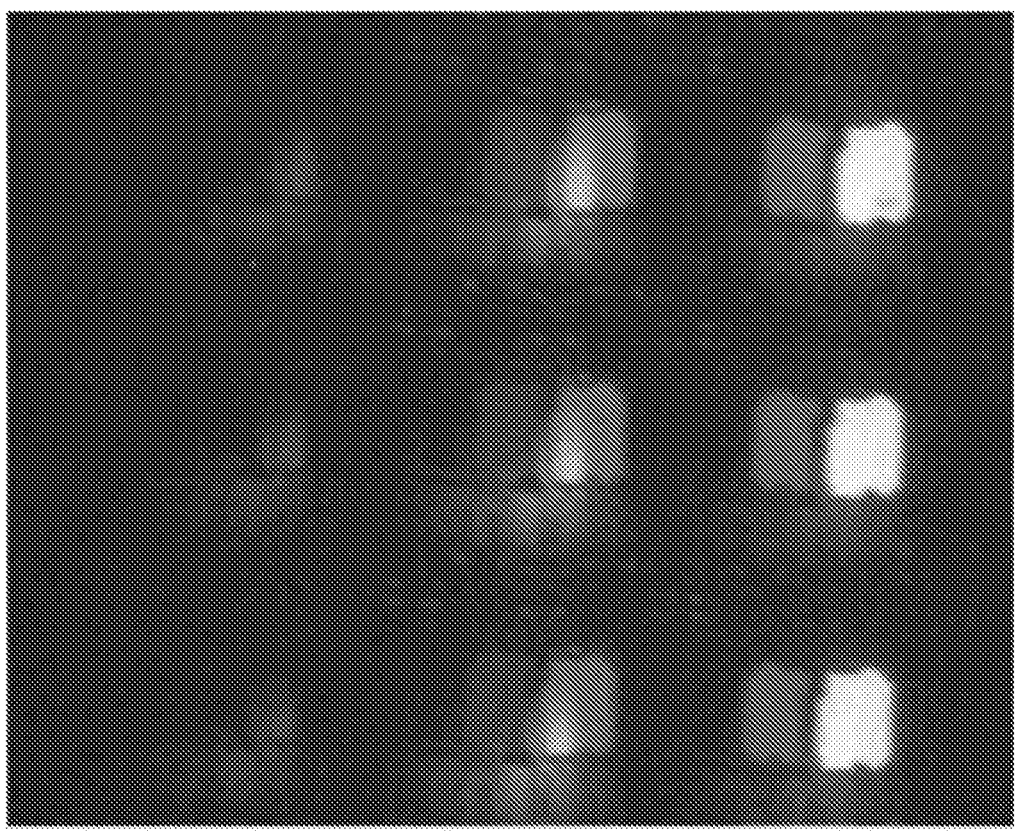
FIG. 39A is an illustrative image of pixels and corresponding ghost pixels for a display including an exemplary reflective polarizer and for a view angle of 20 degrees.
Figure 39B:
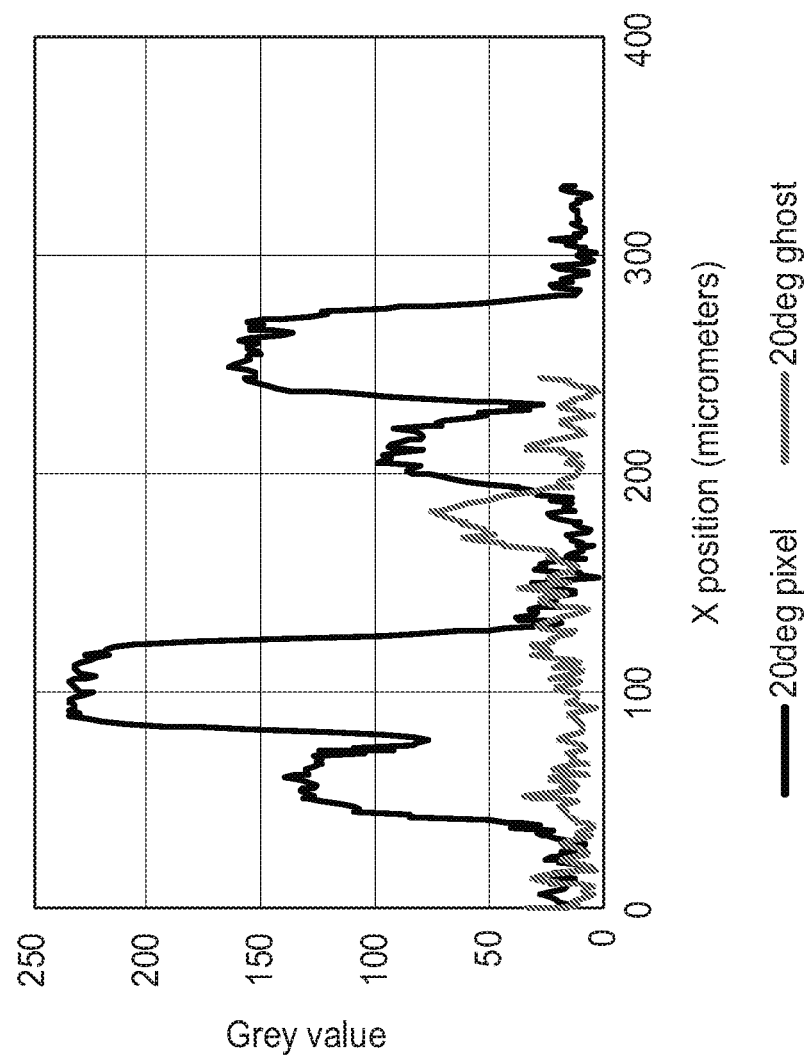
FIG. 39B is the extracted luminance profile from the image of FIG. 39A.
Figure 40A:
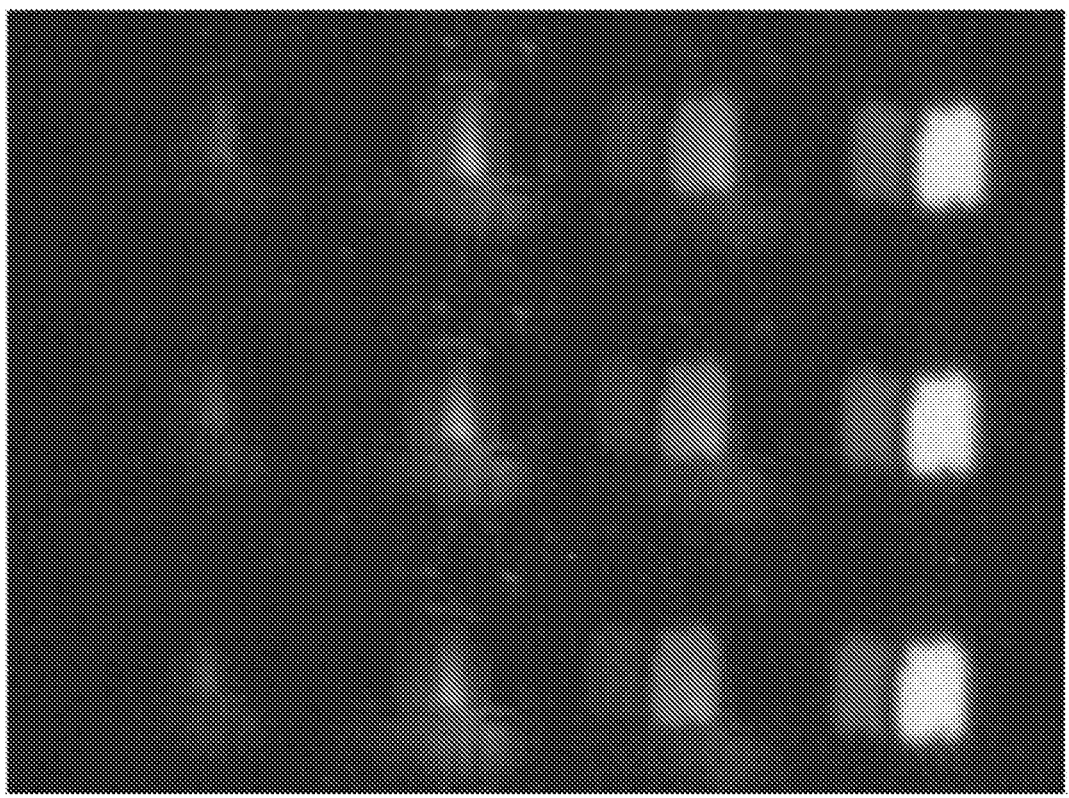
FIG. 40A is an illustrative image of pixels and corresponding ghost pixels for a display including an exemplary reflective polarizer and for a view angle of 40 degrees.
Figure 40B:
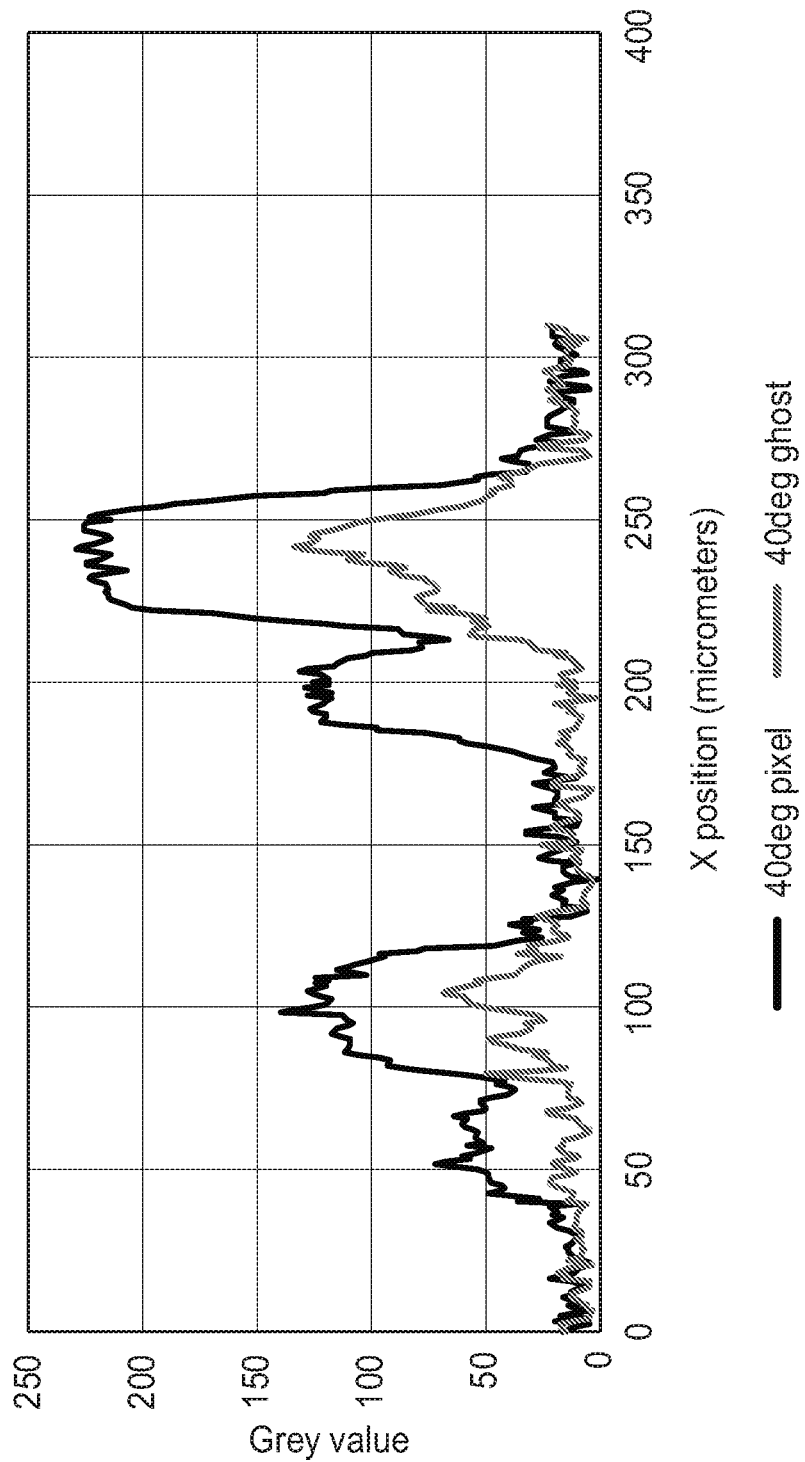
FIG. 40B is the extracted luminance profile from the image of FIG. 40A.
Figure 41A:
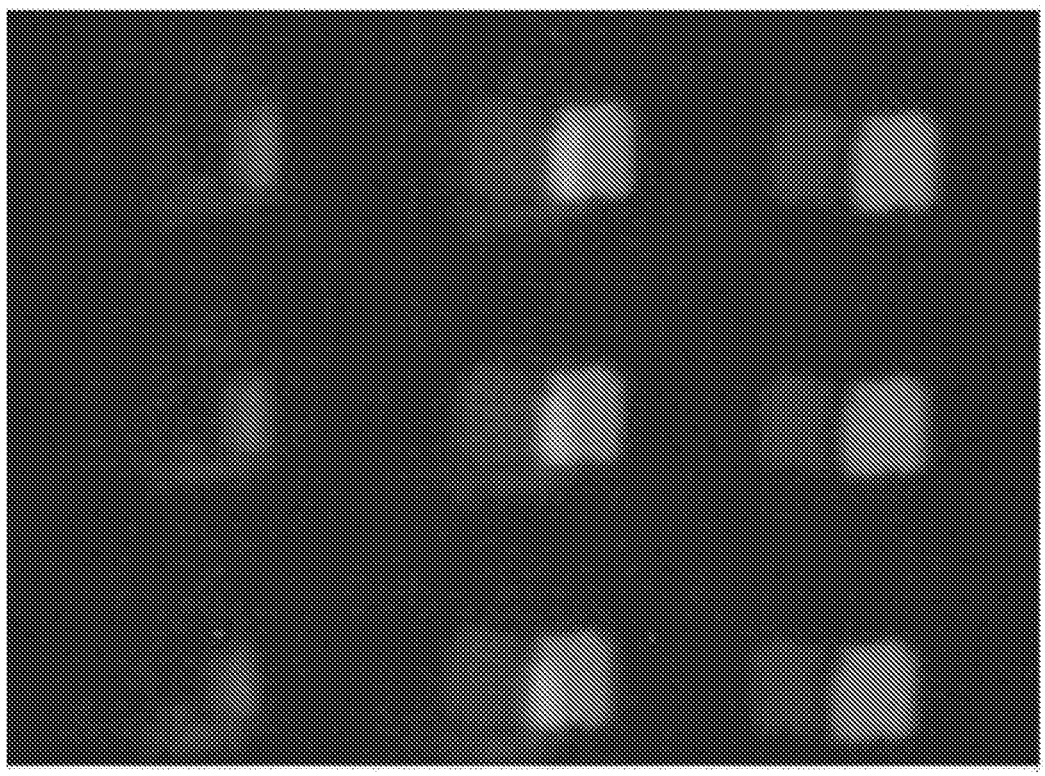
FIG. 41A is an illustrative image of pixels and corresponding ghost pixels for a display including another exemplary reflective polarizer and for a view angle of 20 degrees.
Figure 41B:
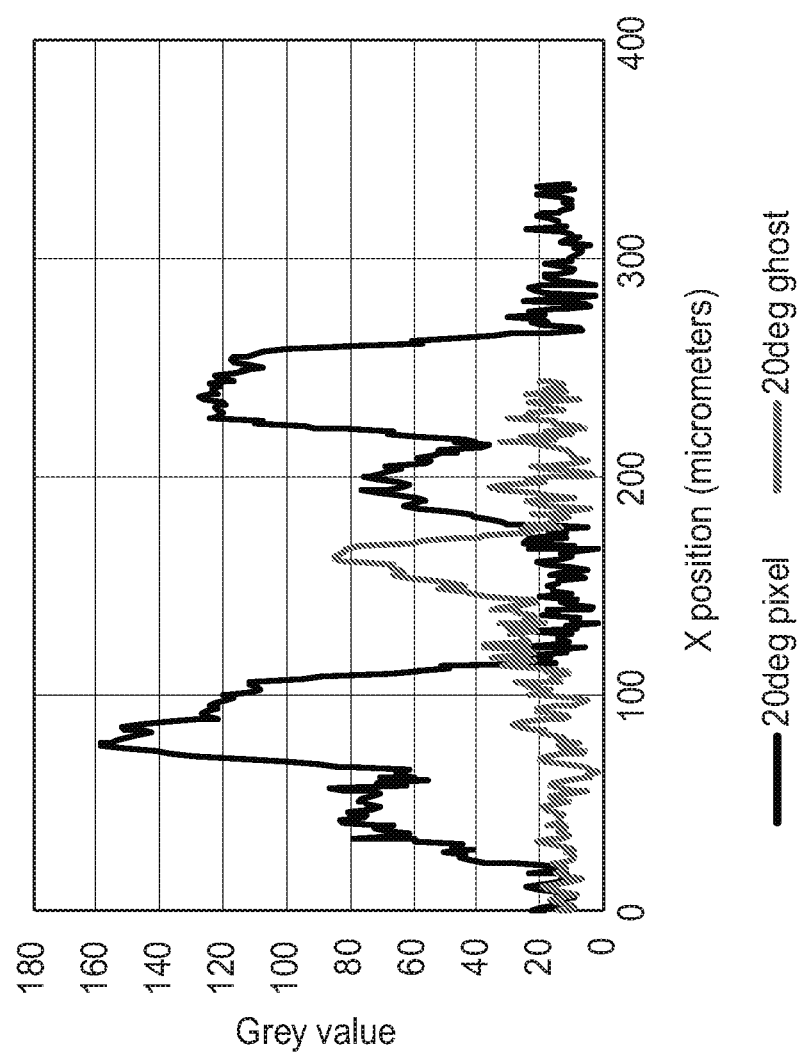
FIG. 41B is the extracted luminance profile from the image of FIG. 41A.
Figure 42A:
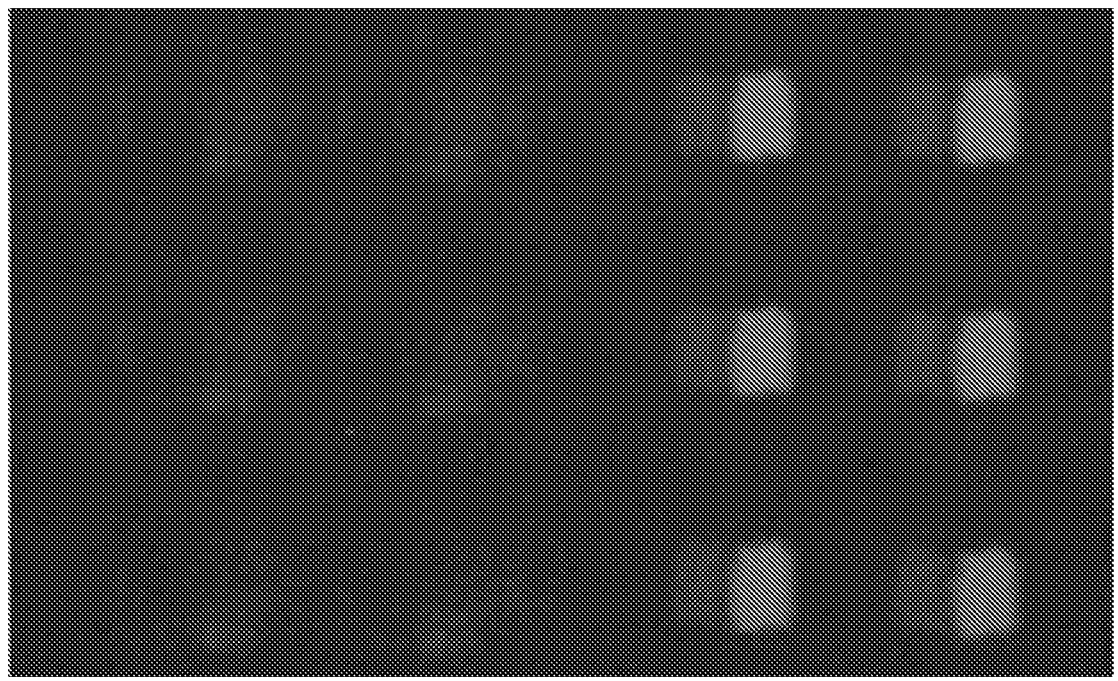
FIG. 42A is an illustrative image of pixels and corresponding ghost pixels for a display including another exemplary reflective polarizer and for a view angle of 40 degrees.
Figure 42B:
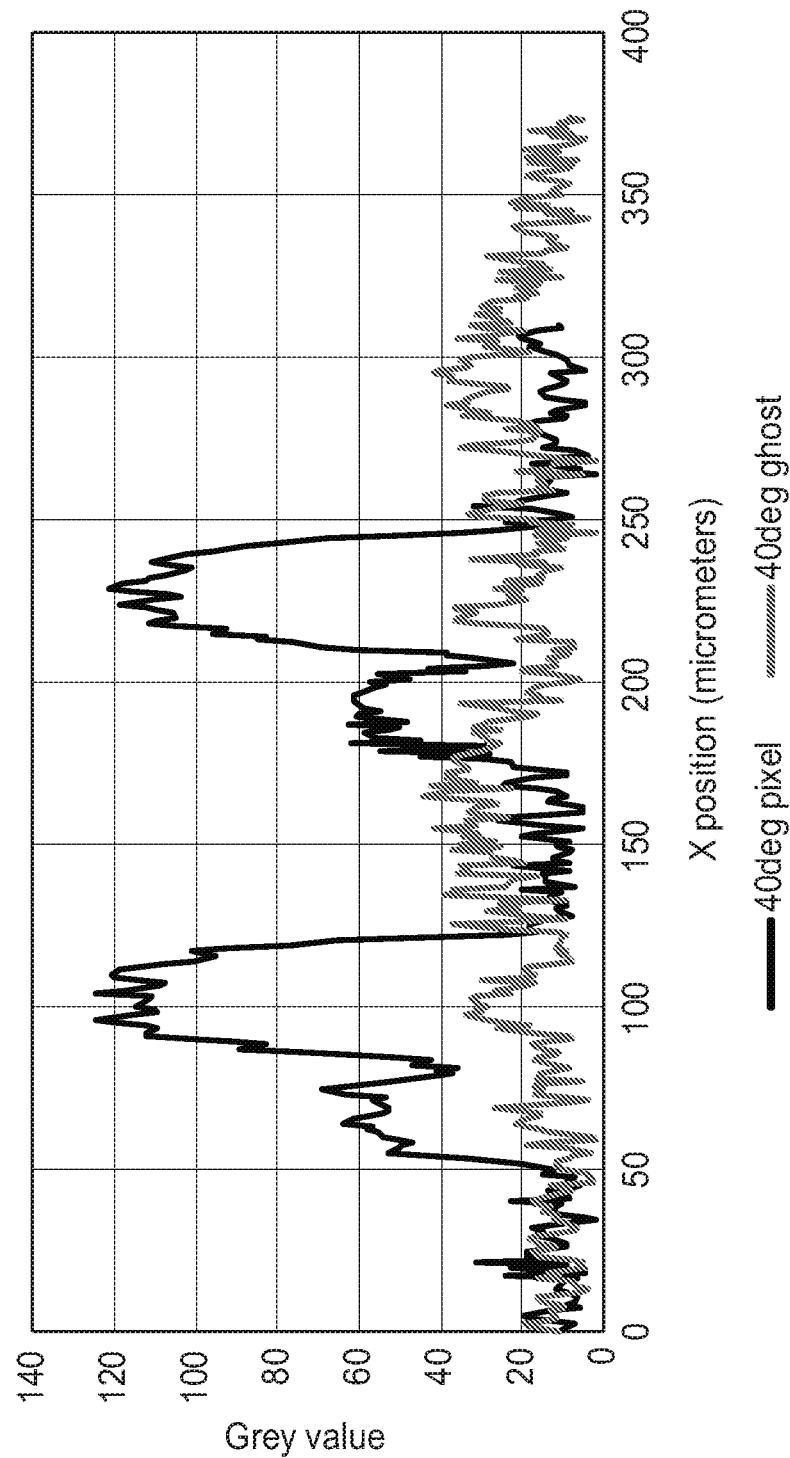
FIG. 42B is the extracted luminance profile from the image of FIG. 41A.

For Comparative Example (CE-1) and each of Examples 1-3, the circular polarizers were prepared as describe above and then incorporated into a commercial OLED television in place of existing circular polarizer. The cross sections of the images were taken horizontally across the 2 emitting pixels and then the ghost images from those two pixels as metric for the strength of undesirable ghosting. Figures for the gathered images help to illustrate the test images; profiles from these test images were extracted for tabled values for comparisons. FIGS. 35A-35E are images showing illustrative pixel and ghost images for the Comparative Example 1 film (CE-1) used in a circular polarizer and tested on the OLED television for view angles of 15 degrees, 30 degrees, 40 degrees, 55 degrees, and 60 degrees, respectively. FIGS. 36A-36E show the extracted luminance profiles as determined by the grey values measured for the images of FIGS. 35A-35E, respectively, for Comparative Example 1 (CE-1). The x position refers to an x-coordinate across the widths of the pixels (e.g., corresponding to the x'-coordinate of FIG. 2). FIGS. 37A-37E are images showing illustrative pixel and ghost images for the Example 1 film use in a circular polarizer and tested on the OLED television for view angles of 20 degrees, 25 degrees, 40 degrees, 45 degrees, and 60 degrees, respectively. FIGS. 38A-38E show the extracted luminance profiles from images of FIGS. 37A-37E, respectively, for Example 1. FIGS. 39A-39B show pixel and ghost images and corresponding extracted profiles, respectively, for the Example 2 film used in a circular polarizer and tested on the OLED television for a 20 degree view angle. FIGS. 39A-39B show pixel and ghost images and corresponding extracted profiles, respectively, for the Example 2 film used in a circular polarizer and tested on the OLED television for a 40 degree view angle. FIGS. 41A-41B show pixel and ghost images and corresponding extracted profiles, respectively, for the Example 3 film used in a circular polarizer and tested on the OLED television for a 20 degree view angle. FIGS. 42A-42B show pixel and ghost images and corresponding extracted profiles, respectively, for the Example 3 film used in a circular polarizer and tested on the OLED television for a 20 degree view angle.

Figure 43:
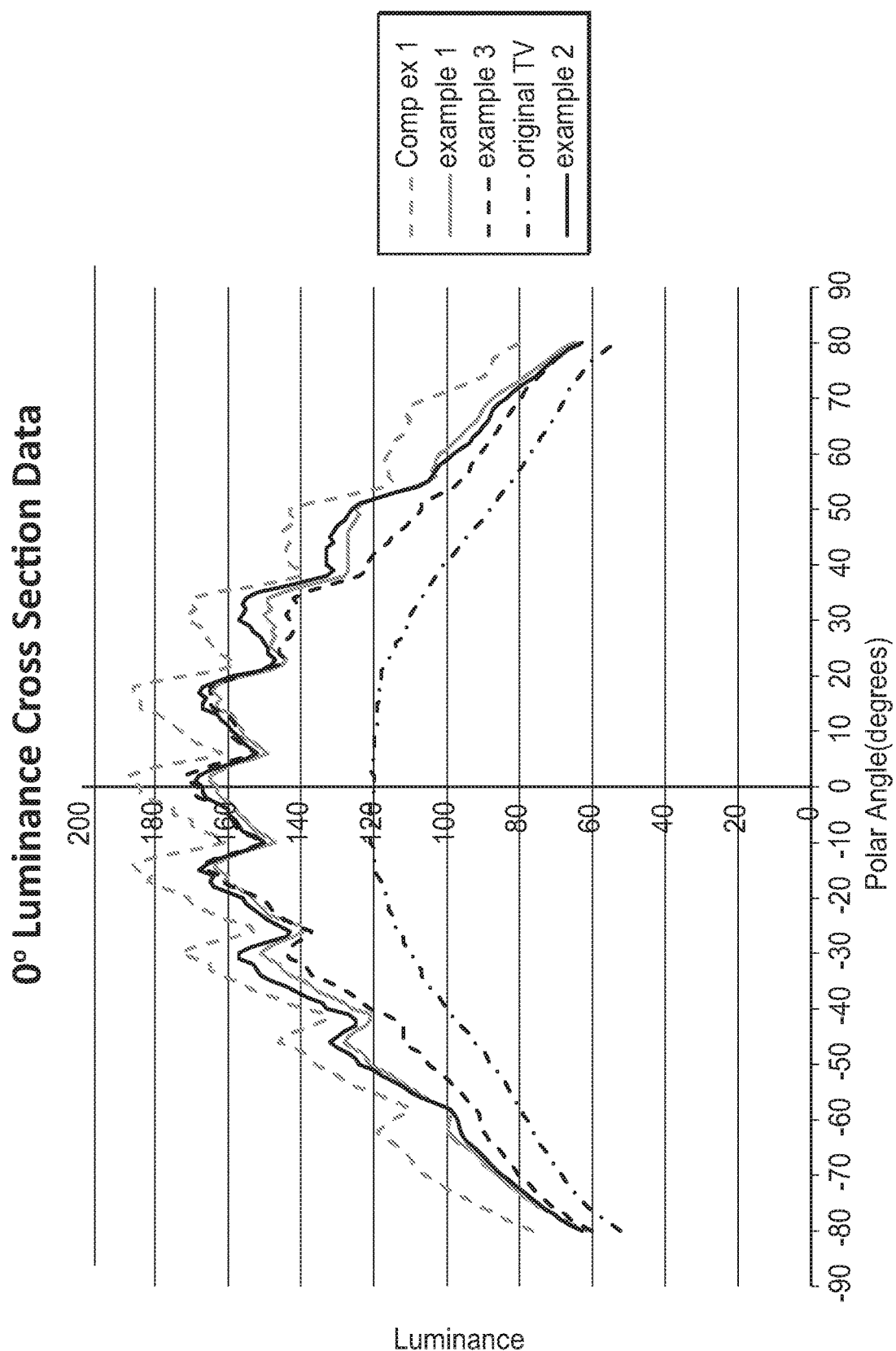
FIG. 43 is a plot of normalized luminance gain vs. polar angle.
Figure 44:
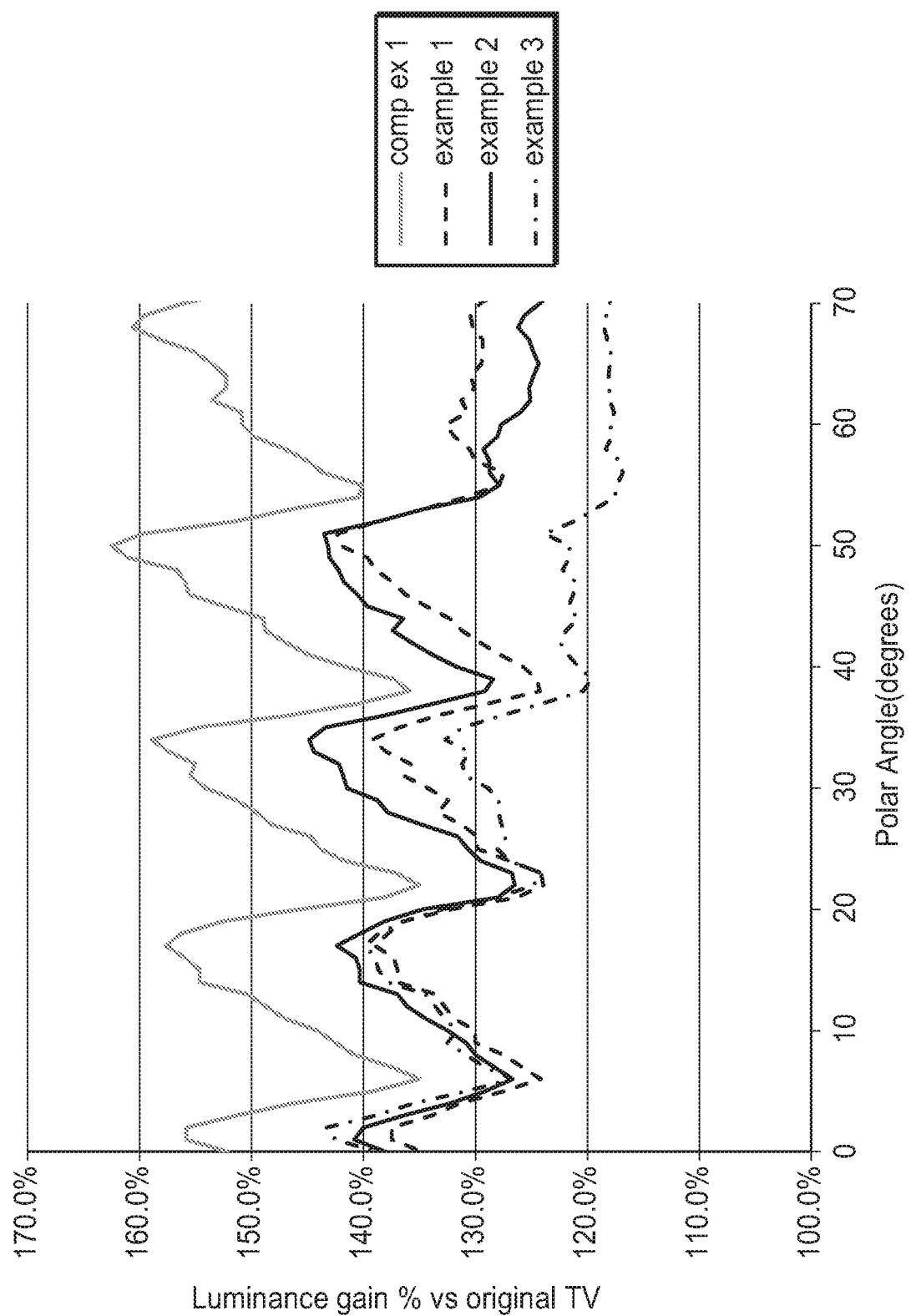
FIG. 44 is a plot of normalized luminance gain vs. polar angle.

FIG. 43 shows the (0 degree) extracted cross section for each example's luminance vs viewing angle. The luminance for each example is normalized by dividing measured luminance with that for the unmodified (original) television (TV) luminance. With this normalization, a gain at each angle is calculated relative to the original television output. FIG. 44 shows this calculated gain as a function of viewing angle.

In FIG. 44, variations as a function of viewing angle are exhibited as series of peaks and valleys. These variations of the gain (peak to valley) are a measure of the ghost image intensity. This difference in luminance gain—from the peak to valley—is defined as the "Eldim ghost metric" and is reported in Table 1 with the measured luminance. The ghost/pixel ratio determined by the Keyence microscope is reported in Table 2.

TABLE 1

Luminance and Eldim ghost metric

| Example | PR705 measured Luminance/Color | | | | Eldim Ghost metric | | |
|---|---|---|---|---|---|---|---|
| | White Lum. [CD/m$^2$] | White X [CIE] | White Y [CIE] | Normal. White Lum. | 18° ghost | 34° ghost | 51° ghost |
| Television (as received) | 125.6 | 0.2775 | 0.2758 | | | | |
| CE-1 | 177.4 | 0.2820 | 0.2788 | 141% | 22.6% | 23.0% | 22.4% |
| Example 1 | 159.0 | 0.2733 | 0.2691 | 127% | 15.1% | 15.0% | 14.9% |
| Example 2 | 157.7 | 0.2717 | 0.2615 | 128% | 15.9% | 16.4% | 15.6% |
| Example 3 | 163.6 | 0.2585 | 0.2725 | 129% | 15.7% | 13.1% | 7.0% |

TABLE 2

Keyence ghost/pixel ratios

| Example | ghost/pixel ratio | | | |
|---|---|---|---|---|
| | 60° | 55° | 40° | 15° |
| CE-1 | 80% | 49% | 40% | 35% |
| Example 1 | 36% | 29% | 29% | 34% |
| Example 2 | | | 58% | 32% |
| Example 3 | | | 36% | 54% |

Example 4: Optical Modeling of Reflective Polarizer in Display

Figure 22:
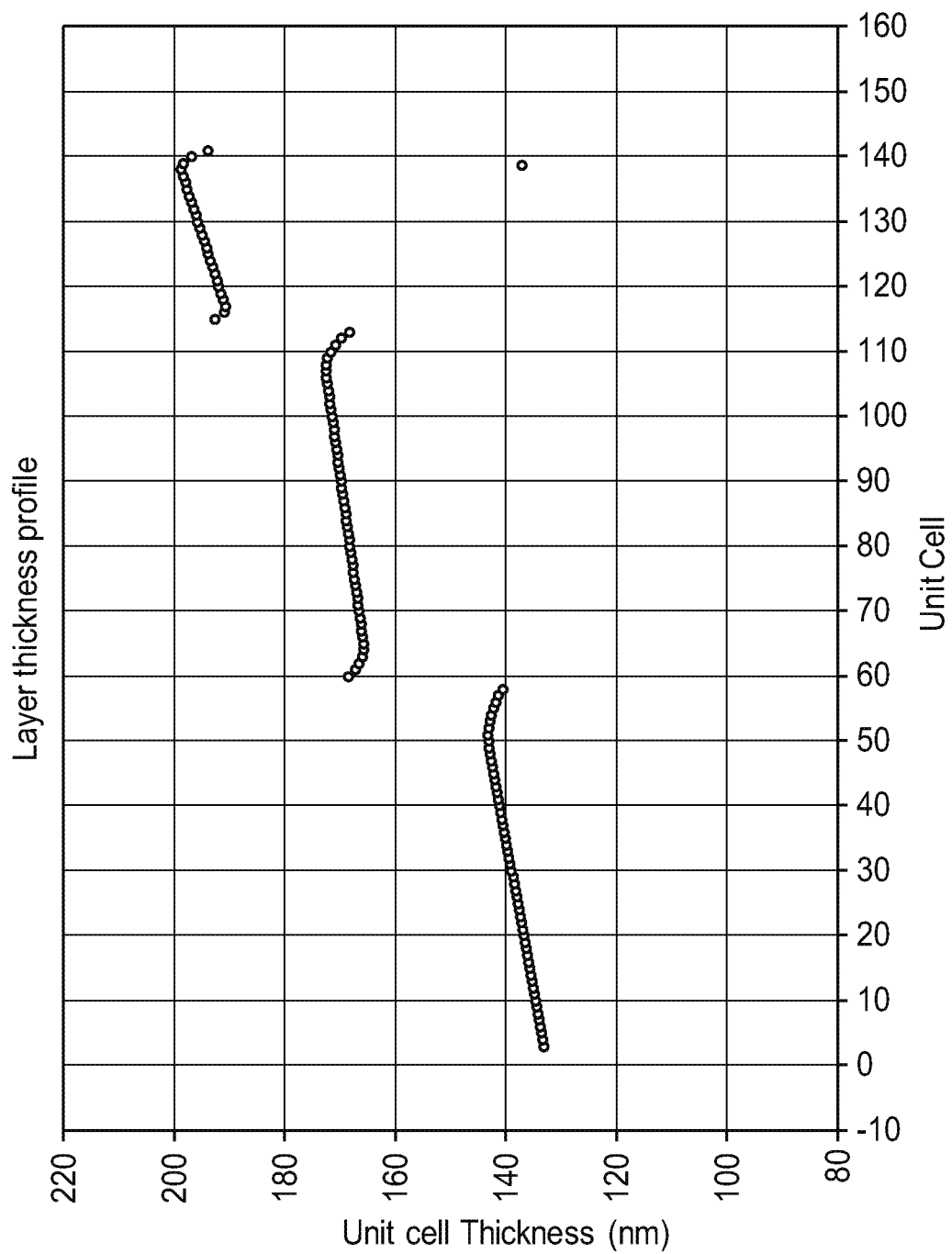
FIG. 22 is a plot of unit cell thickness versus unit cell number in a reflective polarizer.

A reflective polarizer similar to that Example 1 and having the thickness profile illustrated in FIG. 22 was modeled using the 4×4 matrix method using the Berreman algorithm to determine the spectra of constructive and destructive interference generated from layer interfaces in the reflective polarizer. The refractive indices of the isotropic layer in each direction were taken to be 1.5792 at a wavelength of 550 nm and 1.5705 at a wavelength of 633 nm. The refractive index of the birefringent layers in the block direction was taken to be 1.8372 at 550 nm and 1.8120 and 633 nm. The refractive index of the birefringent layers in the pass direction was taken to be 1.5755 at 550 nm and 1.5652 and 633 nm. The refractive index of the birefringent layers in the thickness direction was taken to be 1.5690 at 550 nm and 1.5587 and 633 nm.

Figure 23:
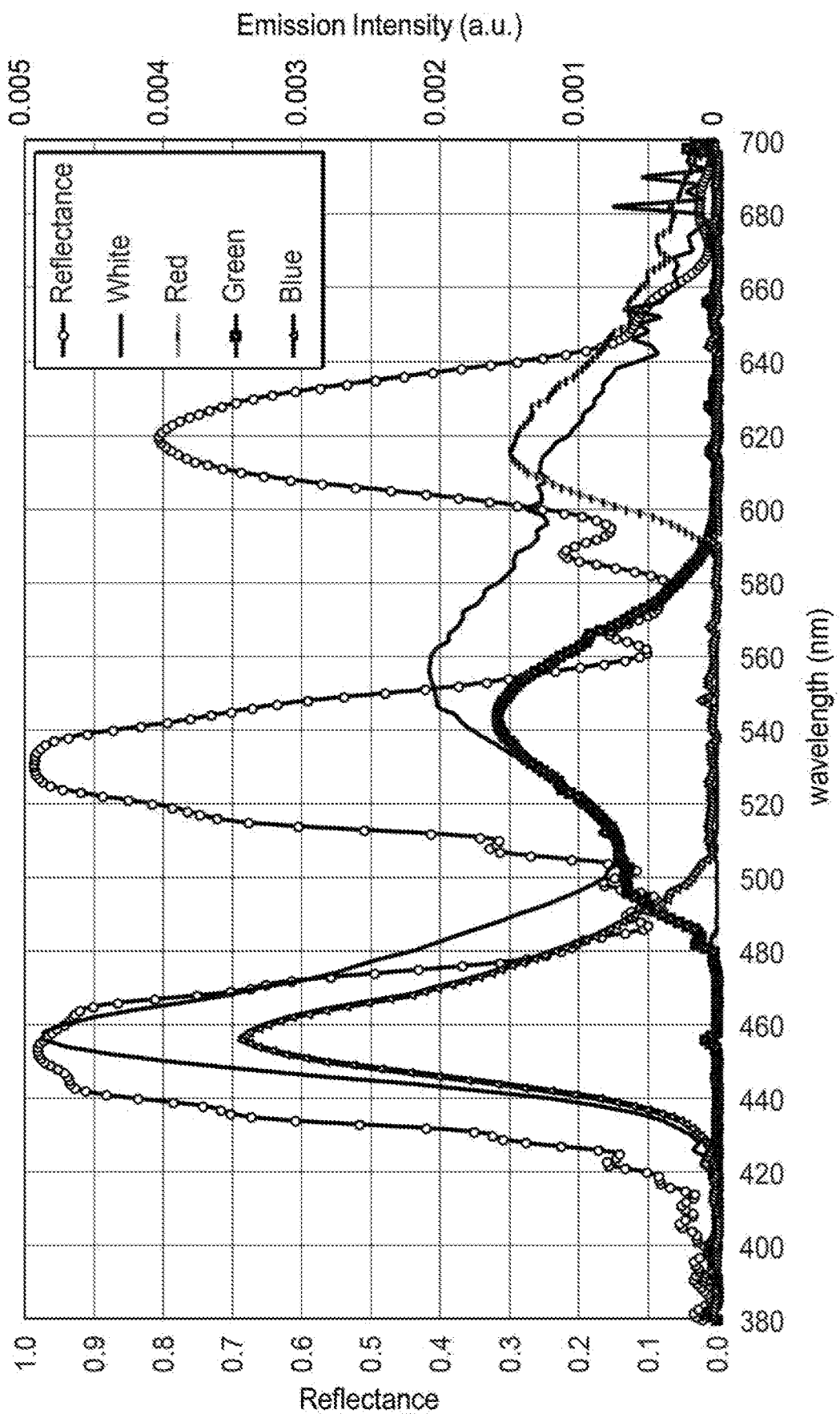
FIG. 23 is a plot of the reflection spectrum of a reflective polarizer and the emission spectrum of subpixels of a display panel.
Figure 24A:
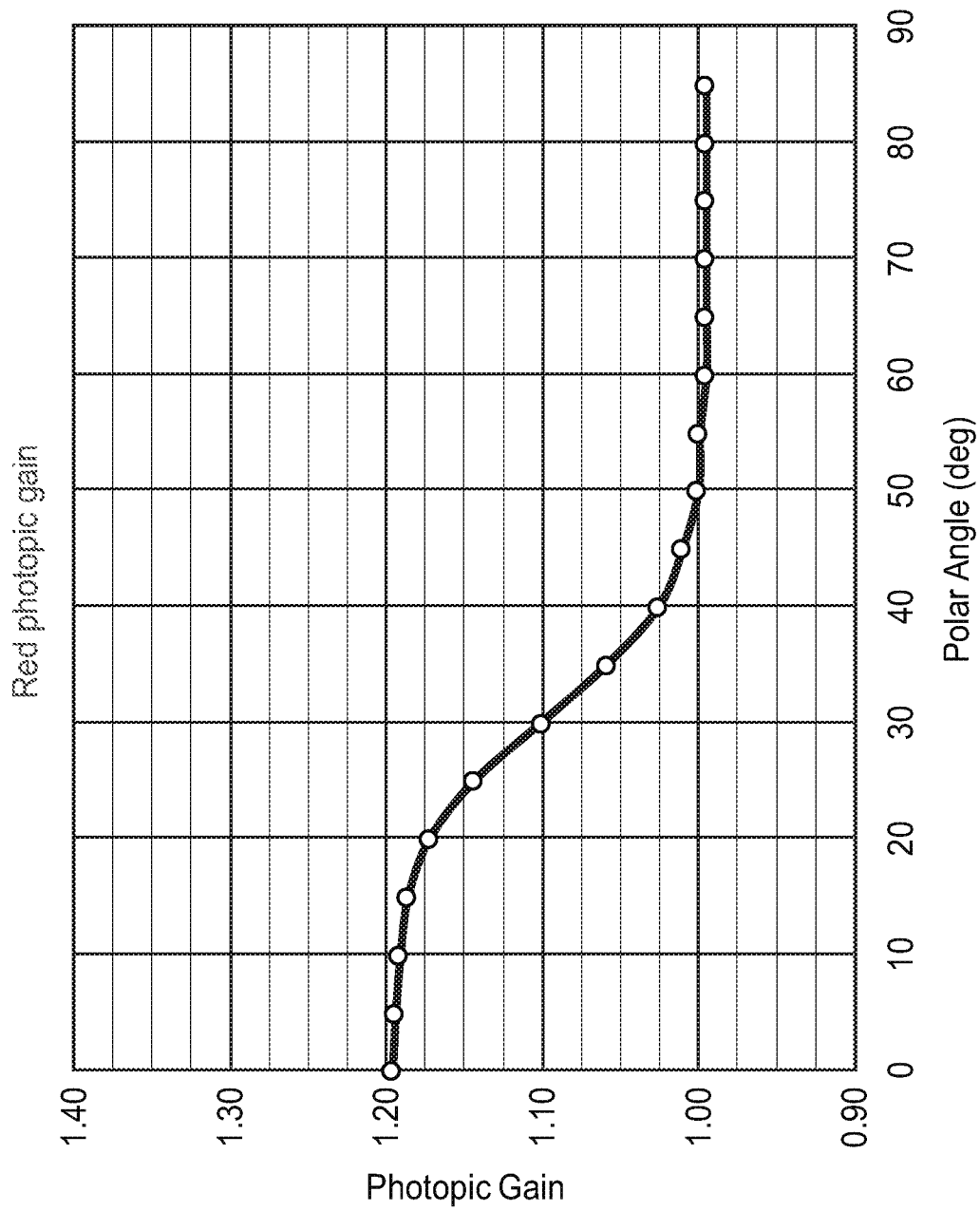
FIGS. 24A-24D are plots of photopic gain for red, green, blue, and white subpixels, respectively, versus view angle in air.
Figure 24B:
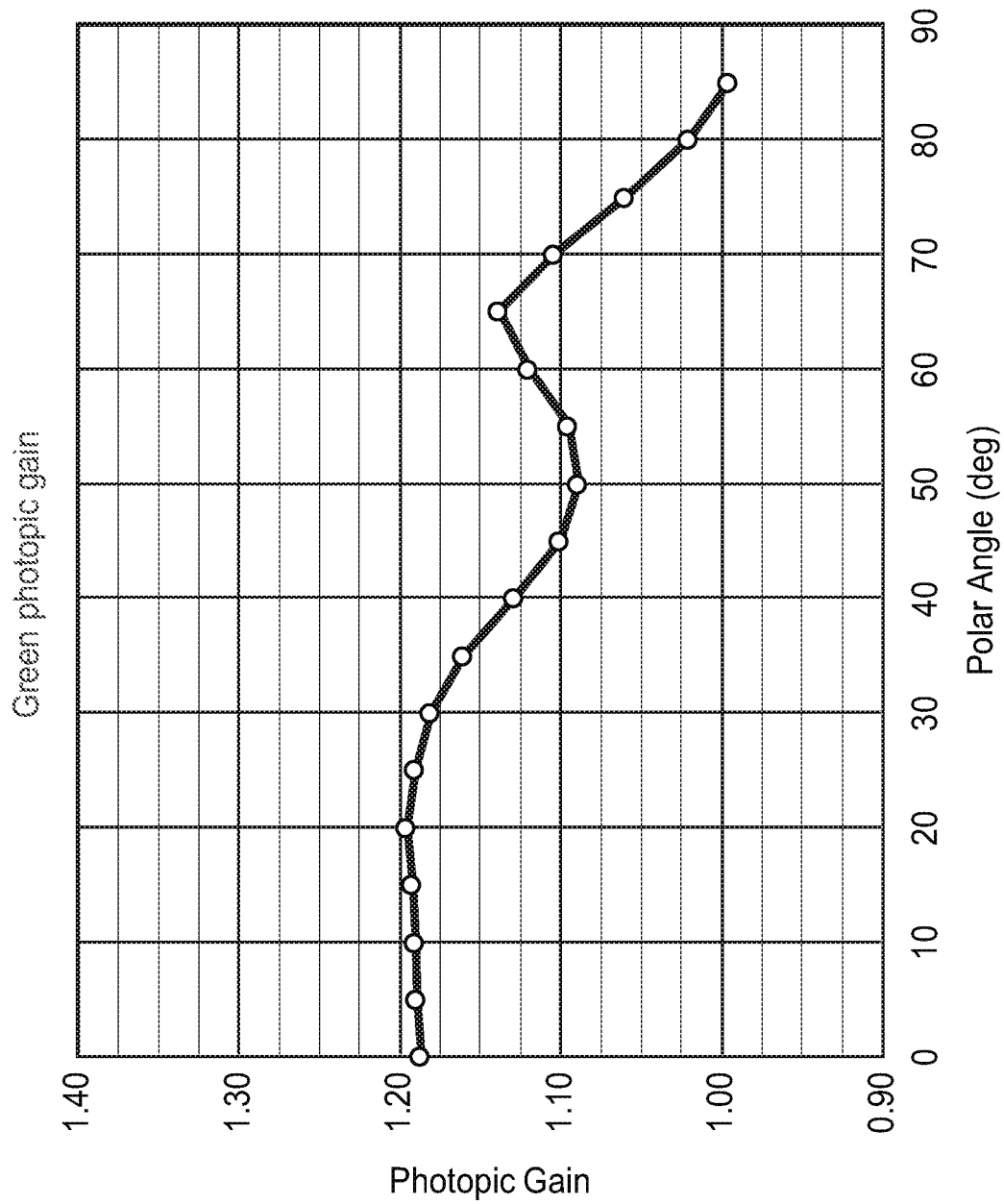
Figure 24C:
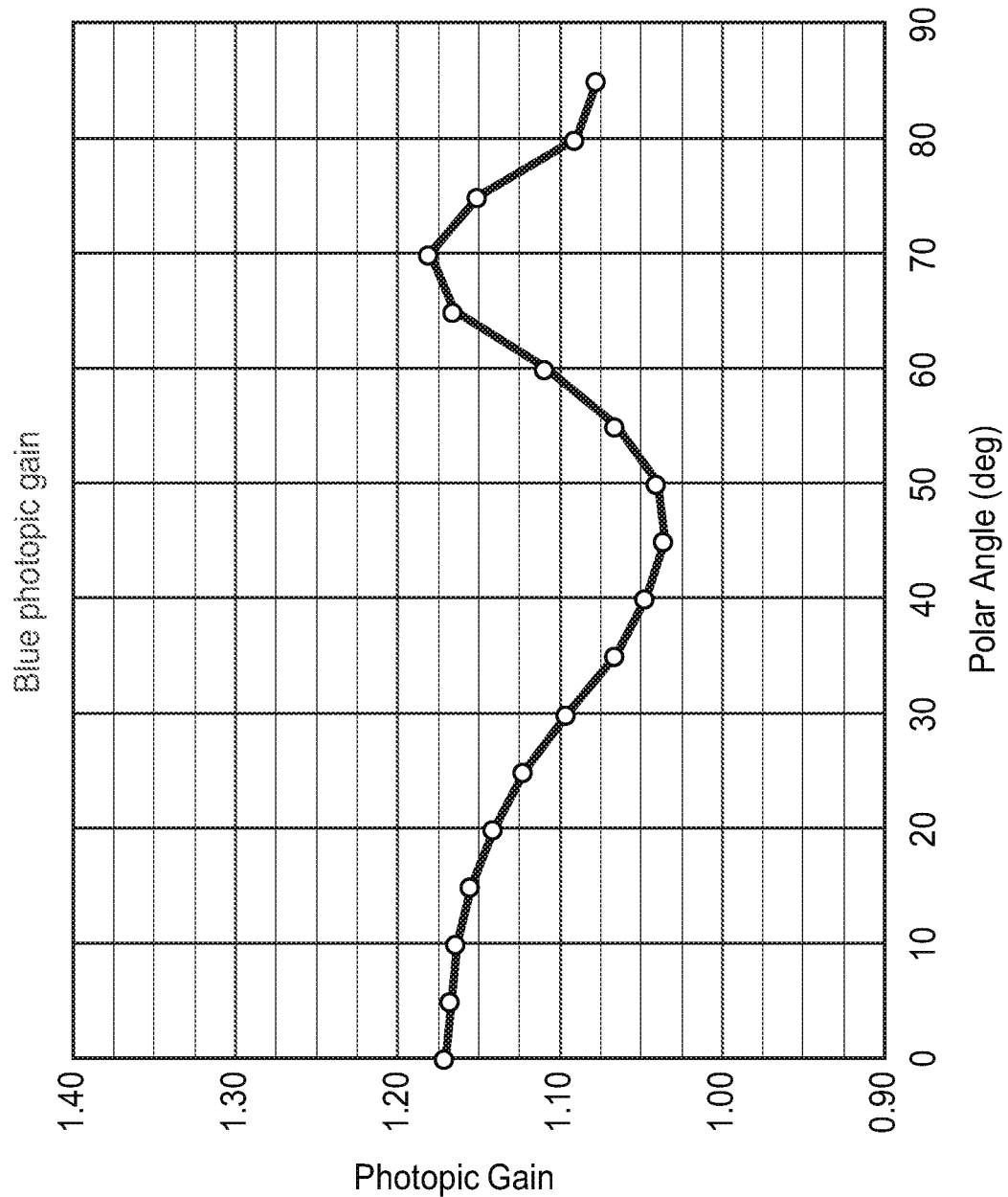
Figure 24D:
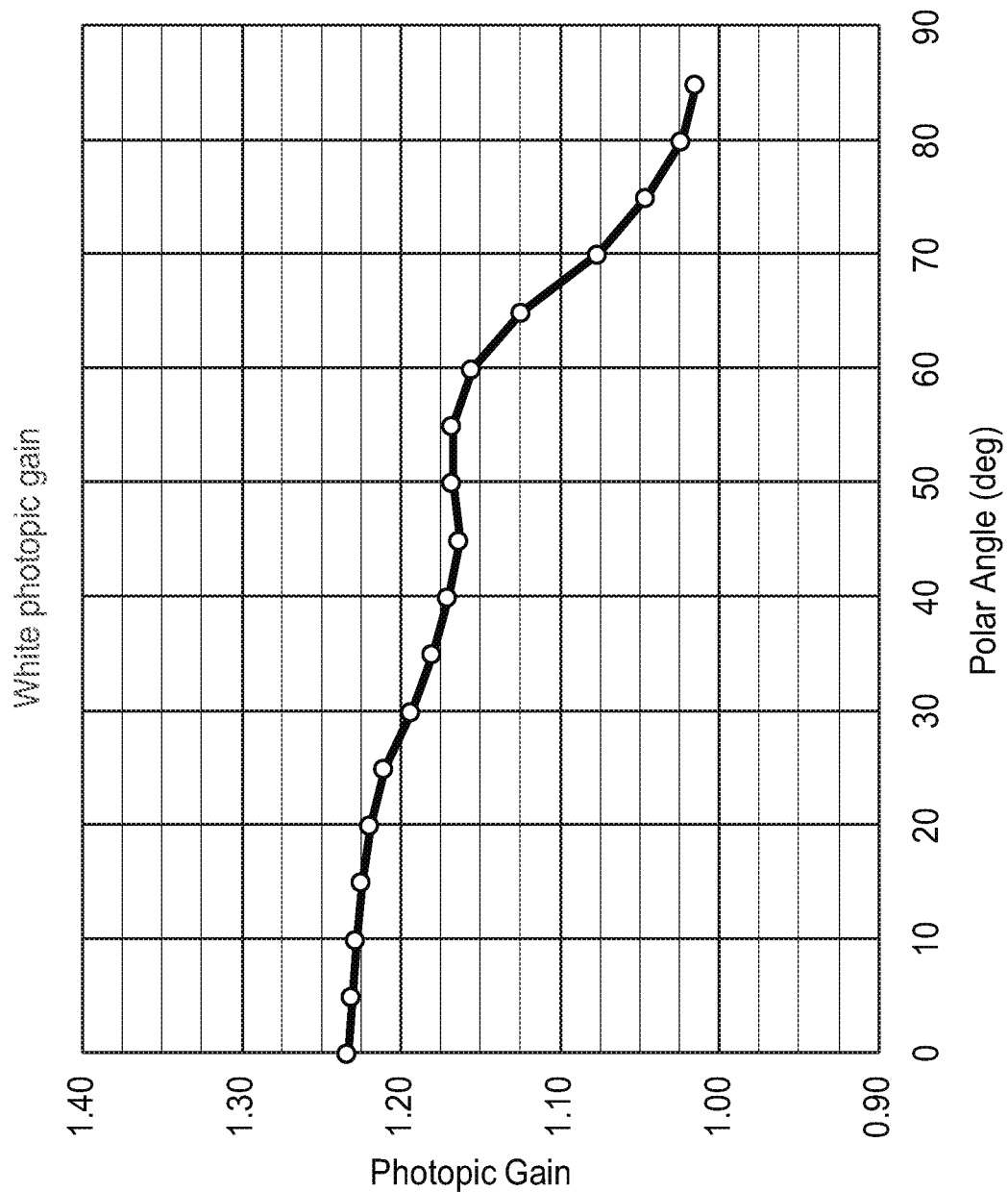

The calculated reflectance at normal incidence in the block state versus wavelength is shown in FIG. 23 superimposed on the emission spectrum of blue, green, red and white subpixels of an LG Model 65E6 OLED TV. Three distinct and substantially non-overlapping reflection bands can be seen in the reflectance spectrum.

A circular polarizer including the reflective polarizer at a distance D of 500 micrometers (distance between outmost interference layer and color filter) from the display panel was modeled. The circular polarizer included the reflective polarizer between an absorbing polarizer and a quarter-wave retarder with the pass axes of the reflective polarizer and the absorbing polarizer aligned and with the fast axis of the retarder at 45 degrees to the aligned pass axes. The photopic gain as a function of polar view angle in air was determined separately for each subpixel. The results are shown in FIGS. 24A-24D for red, green, blue, and white subpixels, respectively. The peak in FIG. 24B at a view angle of about 65 degrees is due to the red reflection band shifting to green wavelengths for high angle of incidence. Similarly, the peak in FIG. 24C at a view angle of about 70 degrees is due to the green reflection band shifting to blue wavelengths for high angle of incidence.

Figure 25:
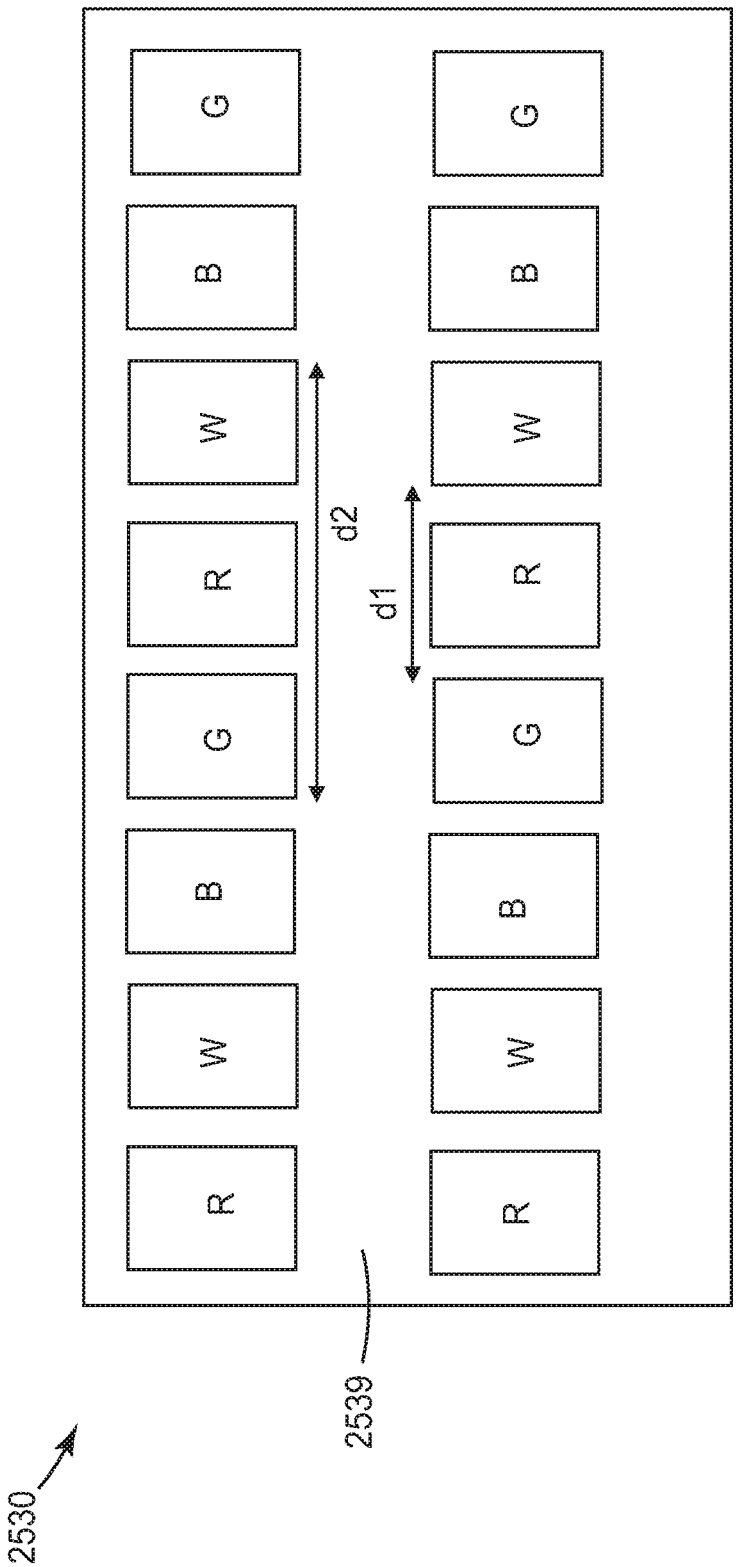
FIG. 25 is a schematic top view of a portion of a display panel.

FIG. 25 is a schematic top view of a portion of the modeled display panel 2530 illustrating a distance of d1 between nearest edges of a green subpixel and a white subpixel, and a distance of d2 between furthest edges of a green subpixel and a white subpixel. Red (R), white (W), blue (B), and green (G) subpixels are indicated. In the modeled example, d1 was 120 micrometers and d2 was 270 micrometers. A green subpixel having a walk-off distance d (see FIG. 1) in the range of 120 micrometers to 270 micrometers can potentially partially reflect from a white subpixel. A range of walk-off distances from 390 micrometers to 540 micrometers in the modeled example allows a green subpixel to potentially partially reflect from a green subpixel of an adjacent pixel. A black matrix material 2539 was assumed to surround the subpixels. The black matric material was modeled as reducing the total reflectivity of the display panel from about 40% to about 20%.

Figure 26:
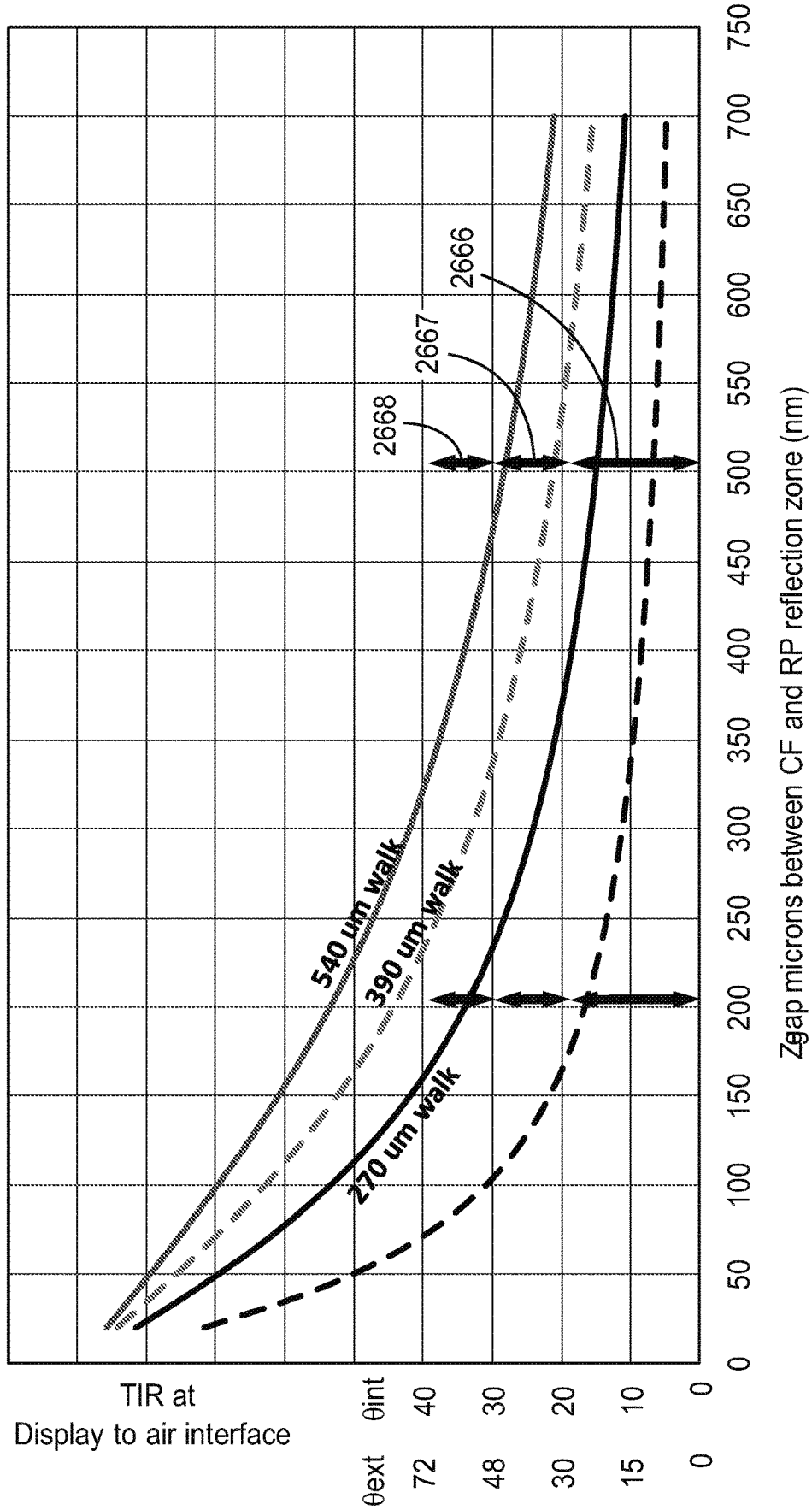
FIG. 26 is a plot of internal angle of incidence and external view angle in air as a function of separation distance between a reflection zone in the reflective polarizer and a color filter.

FIG. 26 is a plot of internal angle of incidence θint and external view angle in air θext as a function of separation, referred to as Z-gap, between the reflection zone in the reflective polarizer (RP) reflecting green light and the color filter (CF). Sufficiently large θint results in total internal reflection (TIR) at the display to air interface. In embodiments where the green reflection zone is adjacent an outermost surface of the reflective polarizer, the Z-gap is approximately equal to the distance D between the reflective polarizer and the plurality of pixels.

Ranges of angles where the reflective polarizer had strong or weak reflection are schematically illustrated in FIG. 26. The reflective polarizer had a strong reflection in green wavelengths for internal angle of incidence in the range 2666 (less than about 20 degrees); weak reflection for internal angle of incidence in the range 2667 (between about 20 degrees and about 30 degrees) where the green reflection band has shifted to lower wavelengths; strong reflection for internal angle of incidence in the range 2668 (between about 30 and about 40 degrees) where the red reflection band has shifted into green wavelengths; and weak reflection for higher angle of incidence. At a Z-gap of about 200 micrometers (about the center to center distance between green and white subpixels), or at a Z-gap of less than about 70 micrometers, the reflection due to the walk-off distance of 120 to 270 micrometers was weak and the reflection due to longer walk-off distance between 390 and 540 micrometers was also weak.

Ambient specular photopic reflection was calculated to be 1.80%. For comparison, when the reflective polarizer was replaced with an Advanced Polarizing Film (APF) available from 3M Company (St. Paul, MN) in the model, the ambient specular photopic reflection was calculated to be 2.90%. Thus, utilizing the reflective polarizer of the present description instead of an APF reflective polarizer resulted in a reduced ambient specular photopic reflection. Using the reflective polarizer of Example 1 with a Z-gap of about 200 micrometers also produces less ghosting compared to using APF in the circular polarizer. When the reflective polarizer was removed from the circular polarizer, the ambient specular photopic reflection was calculated to be 0.90%, but this also resulted in a reduced brightness and color gamut. The color gamut was 93.1% NTSC without a reflective polarizer, 96.6% NTSC with the reflective polarizer of Example 1 in the circular polarizer, and 98.0% NTSC with APF in the reflective polarizer. The calculated brightness gain and radiance gain for each type of subpixel resulting from using the reflective polarizer of Example 1 in the circular polarizer and from using APF in the circular polarizer are reported in the Table 3 below. The radiance gain was determined for wavelengths near the peak emission wavelengths of the subpixels. The brightness and radiance gain was, by definition, 100% for each subpixel when no reflective polarizer was included in the modeled circular polarizer.

TABLE 3

| | Example 4 | | APF | |
|---|---|---|---|---|
| | Brightness Gain | Radiance Gain | Brightness Gain | Radiance Gain |
| White | 123% | 142% | 142% | 142% |
| Red | 120% | 138% | 130% | 141% |
| Green | 119% | 140% | 126% | 141% |
| Blue | 117% | 142% | 121% | 140% |

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A display comprising:
a display panel comprising a plurality of pixels, each pixel comprising a plurality of subpixels;
a reflective polarizer disposed to receive a light output of the display panel, the reflective polarizer having a first reflection band,
wherein at normal incidence, the first reflection band has a long wavelength band edge wavelength between peak emission wavelengths of two subpixels in the plurality of subpixels, wherein at an angle of incidence of 45 degrees, the first reflection band has a long wavelength band edge wavelength less than the peak emission wavelengths of each of the two subpixels.

2. The display of claim 1, wherein the plurality of pixels comprises a red subpixel, a green subpixel, and a blue subpixel, and wherein at normal incidence, the long wavelength band edge wavelength of the first reflection band is between peak emission wavelengths of the blue and the green subpixels.

3. The display of claim 1, wherein the plurality of pixels comprises a red subpixel, a green subpixel, and a blue subpixel, and wherein at normal incidence, the long wavelength band edge wavelength of the first reflection band is between peak emission wavelengths of the green and the red subpixels.

4. The display of claim 3, wherein the reflective polarizer has a second reflection band, and wherein at normal incidence, the second reflection band has a long wavelength band edge wavelength between peak emission wavelengths of the blue and green subpixels.

5. The display of claim 4, wherein the reflective polarizer has a third reflection band, wherein at normal incidence, the third reflection band has a short wavelength band edge wavelength greater than the long wavelength band edge wavelength of the first reflection band and less than a peak emission wavelength of the red subpixel.

6. The display of claim 1, wherein a circular polarizer comprises the reflective polarizer disposed between an absorbing polarizer and a retarder.

7. The display of claim 1, wherein the plurality of subpixels comprises a white subpixel and a green subpixel, a distance between the reflective polarizer and the plurality of pixels being at least 10 micrometers and no more than 1.2 times an average center to center distance between the white and green subpixels of a pixel.

8. A display comprising:
a display panel comprising a plurality of pixels, each pixel comprising first, second, and third subpixels, the first subpixel having a first peak emission wavelength, the second subpixel having a second peak emission wavelength less than the first peak emission wavelength, the third subpixel having a third peak emission wavelength greater than the first peak emission wavelength;
a circular polarizer disposed on the display panel, the circular polarizer comprising a retarder facing the display panel, an absorbing polarizer facing away from the display panel, and a reflective polarizer disposed between the retarder and the absorbing polarizer, the reflective polarizer having substantially non-overlapping first, second, and third reflection bands, wherein at normal incidence, but not an angle of incidence of 45 degrees, the first reflection band comprises the first peak emission wavelength, the second reflection band comprises the second peak emission wavelength, and the third reflection band comprises the third peak emission wavelength.

9. The display of claim 8, wherein the reflective polarizer comprises mutually disjoint first, second, and third pluralities of alternating interference layers, the first plurality of alternating interference layers providing the first reflection band, the second plurality of alternating interference layers providing the second reflection band, the third plurality of alternating interference layers providing the third reflection band.

10. The display of claim 9, wherein the first plurality of alternating interference layers is disposed closer to the display panel than the second plurality of alternating interference layers.

11. The display of claim 8,
wherein at normal incidence:
the first reflection band has a short wavelength band edge wavelength and a long wavelength band edge wavelength;
the second reflection band has a long wavelength band edge wavelength in a range of 440 nm to 500 nm, the short wavelength band edge wavelength of the first reflection band being at least 10 nm greater than the long wavelength band edge wavelength of the second reflection band; and
the third reflection band has a short wavelength band edge wavelength in a range of 580 nm to 640 nm, the short wavelength band edge wavelength of the third reflection band being at least 10 nm greater than the long wavelength band edge wavelength of the first reflection band.

12. The display of claim 11, wherein at normal incidence, the first reflection band has a short wavelength band edge wavelength in a range of 480 nm to 510 nm and has a long wavelength band edge wavelength in a range of 550 to 570 nm.

13. The display of claim 11, wherein at normal incidence, the first reflection band has a bandwidth of no more than 80 nm.

14. A display comprising:
a display panel comprising a plurality of pixels, each pixel comprising a plurality of subpixels;
a reflective polarizer disposed to receive a light output of the display panel, the reflective polarizer having a first reflection band,
wherein at normal incidence, the first reflection band has a long wavelength band edge wavelength between peak emission wavelengths of two subpixels in the plurality of subpixels, and
wherein the plurality of subpixels comprises a white subpixel and a green subpixel, a distance between the reflective polarizer and the plurality of pixels being at least 10 micrometers and no more than 1.2 times an average center to center distance between the white and green subpixels of a pixel.

* * * * *